(12) United States Patent
Timans

(10) Patent No.: US 7,642,205 B2
(45) Date of Patent: Jan. 5, 2010

(54) RAPID THERMAL PROCESSING USING ENERGY TRANSFER LAYERS

(75) Inventor: Paul J. Timans, Mountain View, CA (US)

(73) Assignee: Mattson Technology, Inc., Fremont, CA (US)

( * ) Notice: Subject to any disclaimer, the term of this patent is extended or adjusted under 35 U.S.C. 154(b) by 609 days.

(21) Appl. No.: 11/102,496

(22) Filed: Apr. 8, 2005

(65) Prior Publication Data
US 2006/0228897 A1 Oct. 12, 2006

(51) Int. Cl.
*H01L 21/00* (2006.01)
(52) U.S. Cl. ............... 438/795; 438/778; 438/781; 257/E21.324
(58) Field of Classification Search ......... 438/795–799, 438/515, 517–522, 530, 532, 535, 537, 540–550, 438/558, 566–567, 715, 759, 778, 780, 781
See application file for complete search history.

(56) References Cited

U.S. PATENT DOCUMENTS

| | | | | |
|---|---|---|---|---|
| 3,398,033 | A * | 8/1968 | Haga et. al. | 438/734 |
| 3,850,698 | A | 11/1974 | Mallozzi et al. | |
| 4,309,225 | A | 1/1982 | Fan et al. | |
| 4,615,766 | A * | 10/1986 | Jackson et al. | 438/522 |
| 4,621,413 | A * | 11/1986 | Lowe et al. | 438/301 |
| 5,523,262 | A * | 6/1996 | Fair et al. | 438/799 |
| 5,538,230 | A * | 7/1996 | Sibley | 269/296 |
| 5,712,181 | A * | 1/1998 | Byun et al. | 438/592 |
| 5,822,675 | A * | 10/1998 | Paquet et al. | 428/561 |
| 6,064,081 | A * | 5/2000 | Robinson et al. | 257/183 |
| 6,090,677 | A * | 7/2000 | Burke et al. | 438/308 |
| 6,100,150 | A * | 8/2000 | Shih et al. | 438/308 |
| 6,232,658 | B1 * | 5/2001 | Catabay et al. | 257/701 |
| 6,274,488 | B1 | 8/2001 | Talwar et al. | |
| 6,300,208 | B1 * | 10/2001 | Talwar et al. | 438/308 |

(Continued)

FOREIGN PATENT DOCUMENTS

JP 2004211053 * 7/2004

OTHER PUBLICATIONS

McConnell, Angela D., S. Uma, K. Goodson, "Thermal Conductivity of Doped Polysilicon Layers", Sep. 2001, Journal of Microelectromechanical Systems, vol. 10, No. 3.*

(Continued)

*Primary Examiner*—Matthew C Landau
*Assistant Examiner*—Joseph C Nicely
(74) *Attorney, Agent, or Firm*—Pritzkau Patent Group LLC

(57) ABSTRACT

A method that is performed for heat treating a semiconductor wafer in a process chamber, as an intermediate part of an overall multi-step technique for processing the wafer, includes applying an energy transfer layer to at least a portion of the wafer, and exposing the wafer to an energy source in the process chamber in a way which subjects the wafer to a thermal profile such that the energy transfer layer influences at least one part of the thermal profile. The thermal profile has at least a first elevated temperature event. The method further includes, in time relation to the thermal profile, removing the energy transfer layer in the process chamber at least sufficiently for subjecting the wafer to a subsequent step. An associated intermediate condition of the wafer is described.

8 Claims, 26 Drawing Sheets

U.S. PATENT DOCUMENTS

| | | | |
|---|---|---|---|
| 6,359,263 B2 | 3/2002 | Tay et al. | |
| 6,365,476 B1* | 4/2002 | Talwar et al. | 438/308 |
| 6,380,044 B1* | 4/2002 | Talwar et al. | 438/308 |
| 6,403,923 B1 | 6/2002 | Tay et al. | |
| 6,420,264 B1* | 7/2002 | Talwar et al. | 438/682 |
| 6,426,277 B1* | 7/2002 | Bae et al. | 438/522 |
| 6,444,542 B2* | 9/2002 | Moise et al. | 438/448 |
| 6,617,244 B2* | 9/2003 | Nishizawa | 438/637 |
| 6,635,541 B1* | 10/2003 | Talwar et al. | 438/308 |
| 6,645,838 B1* | 11/2003 | Talwar et al. | 438/530 |
| 6,777,317 B2 | 8/2004 | Seibel et al. | |
| 6,897,162 B2* | 5/2005 | Yoo | 438/770 |
| 6,900,143 B1* | 5/2005 | Pan et al. | 438/752 |
| 6,962,858 B2* | 11/2005 | Neyret et al. | 438/471 |
| 7,015,422 B2* | 3/2006 | Timans | 219/390 |
| 7,145,104 B2* | 12/2006 | Talwar et al. | 219/390 |
| 7,271,445 B2* | 9/2007 | Forbes | 257/347 |
| 7,381,657 B2* | 6/2008 | Zhang et al. | 438/769 |
| 7,453,051 B2* | 11/2008 | Timans | 219/390 |
| 2001/0003336 A1* | 6/2001 | Abbott et al. | 219/543 |
| 2001/0040156 A1 | 11/2001 | Tay et al. | |
| 2002/0053720 A1* | 5/2002 | Boursat et al. | 257/640 |
| 2002/0066534 A1* | 6/2002 | Mercaldi et al. | 156/345.27 |
| 2003/0045074 A1* | 3/2003 | Seibel et al. | 438/486 |
| 2003/0183504 A1 | 10/2003 | Ajayan et al. | |
| 2004/0009649 A1* | 1/2004 | Kub et al. | 438/459 |
| 2005/0050971 A1* | 3/2005 | Horning | 74/5 R |
| 2005/0189340 A1* | 9/2005 | Talwar et al. | 219/390 |
| 2005/0212137 A1* | 9/2005 | Yamamoto et al. | 257/758 |
| 2006/0040476 A1* | 2/2006 | Sadana et al. | 438/479 |
| 2006/0049059 A1* | 3/2006 | Chao et al. | 205/323 |
| 2006/0065935 A1* | 3/2006 | Vandentop et al. | 257/369 |
| 2006/0070637 A1* | 4/2006 | Basceri et al. | 134/22.1 |
| 2006/0128160 A1* | 6/2006 | Yoo | 438/725 |
| 2006/0138525 A1* | 6/2006 | Yoon | 257/315 |
| 2006/0199353 A1* | 9/2006 | Kub et al. | 438/455 |
| 2006/0199358 A1* | 9/2006 | Mineji | 438/530 |
| 2006/0208337 A1* | 9/2006 | Curello et al. | 257/506 |
| 2006/0284221 A1* | 12/2006 | Zhang | 257/288 |
| 2007/0098995 A1* | 5/2007 | Masuko et al. | 428/413 |
| 2007/0105350 A1* | 5/2007 | Bedell et al. | 438/478 |
| 2007/0284579 A1* | 12/2007 | Cao | 257/65 |
| 2008/0017223 A1* | 1/2008 | Sachdev et al. | 134/26 |
| 2008/0079024 A1* | 4/2008 | Westhoff et al. | 257/200 |
| 2008/0158557 A1* | 7/2008 | Craven et al. | 356/300 |
| 2008/0185649 A1* | 8/2008 | Anderson et al. | 257/347 |
| 2008/0230154 A1* | 9/2008 | Autryve et al. | 148/525 |
| 2009/0008748 A1* | 1/2009 | Mancini et al. | 257/622 |
| 2009/0075403 A1* | 3/2009 | Powell et al. | 438/7 |

OTHER PUBLICATIONS

"Oxidation Theory", Dec. 28, 2002, http://www.mse.vt.edu/faculty/hendricks/courses/mse2224/manual/oxidation_theory.htm.*

Bjeletich et al "Electrical characterization of photo-oxidized Si1-x-yGexCy films", May 2004, Microelectronic Engineering, vol. 72, Issue1-4, pp. 218-222.*

Yagi et al "3C-SiC growth by alternate supply of SiH2Cl2 and C2H2", 1997, Journal of Crystal Growth, vol. 174, pp. 653-657.*

"SPI Plamsa-Prep II Plasma Etcher, Cleaner and Asher", Dec. 31, 2004, http://www.2spi.com/catalog/instruments/etchers1.shtml.*

Shimada et al "Preparation and high temperature oxidation of SiC compositionally graded graphite coated with HfO2", May 2002, Carbon, vol. 40, Issue 13, pp. 2469-2475.*

Liao et al "Thermoelectric characterization of Si thin films in silicon-on-insulator wafers", Sep. 1999, Journal of Applied Physics, vol. 86, pp. 3204-3208.*

"Silicon Carbide, SiC", Jan. 2005, http://www.accuratus.com/silicar.html.*

Min et al., "Atomic Layer Deposition of TiN Thin Films by Sequential Introduction of Ti Precursor and NH3," Mat. Res. Soc. Symp. Proc., vol. 514, pp. 337-342 (1998).*

Xie et al., "Oxidation reaction during laser cladding of SAE1045 carbon steel with SiC/Cu alloy powder", Journal of Materials Science 36 (2001), pp. 1501-1505.*

R. Sharangpani et al., "Rapid Thermal Processing Using Steam", Electrochemical Society Proceedings, vol. 2000-9 (Electrochemical Society, Pennington, 2000) p. 203.

Y. Z. Hu et al., "In Situ Rapid Thermal Oxidation and Reduction of Copper Thin Films and their Applications in Ultralarge Scale Integration", J. Electrochem. Soc. 148, (2001) G669.

T. Sameshima et al., "Rapid Thermal Annealing Using the Combustion of $H_2$ with $N_2O$", Appl. Phys. Lett. 69, (1996) 1205.

L. A. Clevenger et al., "Explosive silicidation in nickel/amorphous-silicon multilayer thin films", J. Appl. Phys. 67, (1990) 2894.

* cited by examiner

RAPID THERMAL PROCESSING USING ENERGY TRANSFER LAYERS

BACKGROUND OF THE INVENTION

The present invention relates generally to semiconductor processing systems and, more particularly, to a rapid thermal processing (RTP) system and method.

During the manufacture of semiconductor devices, certain processes require the temporary heating of the surface of semiconductor wafers in order to, for example, promote annealing processes or other reactions that may be desired. Conventionally, this heating process, which is here referred to as rapid thermal processing (RTP), is performed by heating the wafer with some form of external energy source such as, for example, a bank of tungsten-halogen lamps or a hot-wall furnace.

Recently, there has been renewed interest in very short heating cycles for processes such as annealing of ion-implantation damage for formation of ultra-shallow junctions. For example, a high temperature process may involve quickly heating a wafer to a peak temperature of approximately 1050° C. then immediately allowing the wafer to cool. Such a process is usually called a spike-anneal. In a spike-anneal process, it is desirable to heat the wafer to a high peak temperature in order to achieve good damage annealing and dopant activation, but the time spent at the high temperature should be as short as possible to avoid excessive dopant diffusion.

The technology trend in the last few years has been to increase the peak temperature of the spike-anneal while simultaneously decreasing the duration of time spent at the peak temperature. This modification is usually accomplished by increasing the heating ramp rate and the cooling rate, as well as by minimizing the switch-off time of the radiant heat source. These approaches help to minimize the peak-width of the spike-anneal, i.e., the time spent by the wafer above a given threshold temperature at which significant diffusion can rapidly occur. The peak-width is often characterized by considering the time spent above a threshold temperature, which is generally defined as 50° C. below the peak temperature of the spike-anneal heating cycle.

Additional methods to further reduce spike-anneal peak-widths are still being developed. For instance, one approach uses pulses of energy to heat the surface of the wafer. This approach takes advantage of the fact that the devices being processed lie within a relatively thin layer near the surface of the wafer and, therefore, there is no fundamental need to heat the entire wafer to the processing temperatures. Surface heating allows very rapid heating of the relatively small thermal mass of the surface region, as well as quick cooling because the heat in the surface region is dissipated into the bulk of the wafer by thermal conduction. Thermal conduction can be a much faster cooling mechanism in comparison to heat loss through radiation or convection from the wafer surface. Pulses of energy are typically applied from pulsed arc-lamps, such as xenon flashlamps, or by scanning an energy beam across the wafer surface. The energy beam may be, for example, a laser, an electron beam or any other type of energy source that may deliver a high power density at the wafer surface. These surface heating approaches are typically used to generate millisecond-duration heat pulses, and the process temperatures employed are higher than the ~1050° C. temperatures used in conventional RTP. In some cases, annealing at temperatures as high as 1350° C. for approximately one millisecond has been shown to be useful. In the context of the present disclosure, a pulse is understood to refer to a short burst of energy such as, for example, a heat pulse with a duration on the order of milliseconds produced by a pulsed arc lamp. Another example is the use of a pulse of energy from a laser, which may be swept across a wafer surface in order to process a larger area. The laser used in such a context may be a pulsed or a continuous wave (cw) laser. In other words, a pulse is considered to be an energy burst of short duration, wherein the energy burst may be provided from one of a variety of sources.

Although the use of high power energy sources enables such a "millisecond annealing" approach, there are serious practical difficulties that remain to be resolved in this approach. For example, many of the practical pulsed energy sources rely on coupling of radiant energy to the wafer. Consequently, the radiant energy interacts strongly with the optical properties of the wafer. Since wafers are usually patterned with layers and devices that alter the optical properties across the surface of the wafer, the result is uneven power coupling to the wafer surface and potential temperature non-uniformity across the surface of the wafer. As the millisecond-annealing approach requires very high power densities to be applied to the wafer surface, even minor changes in optical coupling can result in large temperature gradients. These temperature gradients lead to non-uniform process results as well as large thermal stresses that can damage the devices on the wafer.

In particular, when a wafer is processed by exposure to energy from a radiant heat source or a beam of energy, non-uniformity may arise if different regions of the wafer absorb different amounts of energy from the incident beam of energy. Such pattern effects may arise, for instance, if the optical or physical properties of the surface vary across the wafer.

Turning now to the drawings, wherein like components are indicated by like reference numbers throughout the various figures where possible, attention is immediately directed to FIG. 1, which illustrates a partial cross sectional view of a typical semiconductor device, generally indicated by a reference numeral 10. It is noted that the figures are not drawn to scale for purposes of clarity. Device 10 includes a wafer 12 with a top surface 14 and a bottom surface 15. Device layers 16 and 18 are deposited on top surface 14. A trench 20 is also etched into top surface 14 of wafer 12 in order to facilitate separation between die, test areas (not shown) and edge exclusion areas (not shown), which are patterned in a different manner from the die. Other features such as edge exclusion regions and test areas may also be present on the wafer surface. Bottom surface 15 of wafer 12 is usually untreated. In general, a semiconductor device, such as device 10, may include thousands of such structures including a variety of patterned layers and trench-like features. Due to the presence of variations, such as represented by device layers 16 and 18 and trench 20, on top surface 14, aforedescribed temperature gradients across the wafer during heat application are common in semiconductor wafers because structures associated with different parts of the wafer vary in physical composition. As a result, optical properties may vary both within any one electronic circuit on the wafer and between different regions of the wafer. Severe variation in energy absorption may arise if different regions on the wafer have different reflectivity or scattering characteristics.

Unfortunately, in semiconductor devices, the thin film structures (such as device layers 16 and 18 of FIG. 1) present on the wafer often exhibit large differences in reflectivity, especially due to optical interference effects that occur in such thin film structures. The thin film stacks often include materials such as silicon dioxide ($SiO_2$), silicon nitride ($Si_3N_4$), dielectrics, metals, metal suicides, metal nitrides or carbides, polycrystalline silicon (Si), amorphous Si, single-crystal Si, silicon germanium (SiGe) alloys or germanium (Ge).

Furthermore, semiconductor devices are structured into various line-shapes with three-dimensional topography. Variations in the line shapes and spacing between the lines also lead to variations in the power reflection and absorption. For example, optical energy may be diffracted by patterned features, and arrays of lines may act as grating structures that produce pronounced diffraction and scattering effects, all of which may further contribute to variations in energy absorption. The variations in energy absorption may consequently result in differences in the temperature rise produced or the degree to which a thermal process proceeds.

Another problem with the use of high power energy sources lies in the difficulty of providing adequate process control in terms of the repeatability and uniformity of the heating cycle. Since the process is typically accomplished in an extremely short time duration, it is difficult to apply, for example, conventional feedback control to regulate the heating process. It is also very difficult to apply accurate temperature measurement in the short timescale of the processing, especially when such power energy sources are applied to the wafer. When scanning energy sources are used, the problem is further complicated by the fact that the process occurs in a small region that is difficult to observe and control by conventional measurement and control techniques. Since the qualities of the energy sources may change or drift over time, there is no simple way to ensure that repeatable and uniform processing occurs at all points on all of the semiconductor wafers being processed.

Yet another problem arises from the challenging requirements of the high power energy sources themselves. Simple heat-flow calculations have shown that, for a one millisecond process time, it is typically necessary to deliver approximately 15 J/cm² to the wafer surface. For example, for a 300 millimeter diameter wafer, the minimum total energy delivered to the wafer is approximately 11 kJ. If the energy is delivered to the wafer from, for instance, a bank of flashlamps, then energy is lost through absorption in the process chamber walls and other components, and, additionally, there is significant loss in the conversion of electrical energy to radiant emission from the lamps. As a result, the heating system typically needs to provide energy pulses of at least 50 kJ, which leads to rather large equipment. The alternative approach of scanning a focused energy beam across the wafer surface requires very expensive equipment. For example, if a high power laser is used, then expensive optics and wafer mounting fixtures are required. Moreover, the scanning approach limits the throughput in terms of the number of wafers that may be processed per hour.

Some types of energy sources used in thermal processing include electromagnetic energy sources, such as lamps, hot objects, lasers and microwave or millimeter wave sources, hot streams of gas, flames, particle beams (including streams of electrons or ions), plasmas, energetic atoms and radicals. Typical lamps may include tungsten halogen lamps or arc lamps. An arc lamp may include a flashlamp containing an inert gas such as xenon, argon, krypton, neon or mixtures of these gases. Lamps may be used in a direct current (DC) or pulsed mode (such as a flashlamp). In the pulsed mode, flashlamps usually produce pulses of energy with durations between 1 µs and 100 ms. One example of a suitable energy source is the high energy arc lamp manufactured by Mattson Technology, Canada.

The energy from lamps may be delivered to the wafer with the assistance of reflectors and other optical components. In many cases, it may be convenient to arrange the illumination such that all of the wafer may be exposed to the radiation in one pulse of energy. However, if so desired, the radiant energy may be delivered to various regions of the wafer sequentially while the wafer and/or energy source are moved with respect to each other between periods of illumination.

As will be seen hereinafter, the present invention provides a remarkable improvement over the prior art as discussed above by virtue of its ability to provide short heating cycles at high temperatures with increased performance while resolving the aforedescribed problems present in the current state of the art.

SUMMARY OF THE INVENTION

As will be described in more detail hereinafter, there is disclosed herein a method performed for heat treating a wafer in a process chamber as an intermediate part of an overall multi-step technique for processing a semiconductor wafer. The method of the present invention includes applying an energy transfer layer to at least a portion of the wafer, and exposing the wafer to an energy source in the process chamber in a way which subjects the wafer to a thermal profile having at least a first elevated temperature event and such that the energy transfer layer influences at least one part of the thermal profile. The method further includes, in time relation to the thermal profile, removing the energy transfer layer in the process chamber at least sufficiently for subjecting the wafer to a subsequent step.

The energy transfer layer of the present invention serves, for example, to absorb an emitted energy from the energy source. Alternatively, at least an initial portion of exposing the wafer subjects the wafer to an inert gas ambient and the removing of the energy transfer layer is initiated by introducing a reactive gas ambient into the process chamber. As another option, the energy transfer layer is oxidizable and removing the energy transfer layer includes causing the energy transfer layer to oxidize in cooperation with the exposing. As another alternative, removing is performed using a chemical reaction with the energy transfer layer which is exothermic so as to contribute heat to the thermal profile. The energy transfer layer may also be patterned in a way which enhances, for example, removing thereof.

In another aspect of the invention, in an overall multi-step technique for processing a semiconductor wafer, an intermediate condition of the wafer that is useful for heat treating the wafer in a process chamber as part of the overall multi-step technique is produced. The intermediate condition of the wafer includes a material layer temporarily applied to at least a portion of the wafer such that exposing the wafer to an energy source in the process chamber subjects the wafer to a thermal profile having at least a first elevated temperature event and such that the material layer influences at least one part of the thermal profile by undergoing a reaction in a predetermined way at least as the material layer is removed from the wafer so as to be substantially absent from a target structure being formed on the wafer.

In yet another aspect of the invention, in an overall multi-step technique for processing a semiconductor wafer, a method is performed for heat treating the wafer as an intermediate part of the overall multi-step technique in which the wafer is exposed to an energy source arrangement. The method includes applying a material layer temporarily to at least one portion of the wafer such that the material layer exhibits a given response to the energy source arrangement. The method also includes subjecting at least the material layer to a stream containing energetic species such that the material layer thereafter exhibits a modified response to the energy source arrangement. The method further includes exposing the wafer including the material layer having the modified response to the energy source arrangement to perform the heat treating, and removing the material layer.

In still another aspect of the invention, in an overall multi-step technique for processing a semiconductor wafer, a method is performed for heat treating the wafer in a process chamber as an intermediate part of the overall multi-step technique. The method includes applying a first material layer to at least a portion of the wafer, and subjecting the first material layer to a second material in cooperation with exposing the first material to an energy source in the process chamber in a way which causes the first material layer to react with the second material so as to generate heat which induces a temperature rise of the wafer. The second material may be, for example, provided in a gaseous form in the process chamber for reaction with the first material, or applied to an area of the wafer to cooperate with the first material layer on the portion of the wafer to produce the reaction. The temperature rise may contribute, at least in part, to a desired material transformation of the wafer.

In a further aspect of the invention, in an overall multi-step technique for processing a semiconductor wafer, a method is performed for heat treating the wafer in a process chamber as an intermediate part of the overall multi-step technique. The method includes applying a material layer to at least a portion of the wafer, and exposing the material layer to an energy source in the process chamber in a way which causes the material layer to decompose into at least two by-products, thereby releasing thermal energy.

BRIEF DESCRIPTION OF THE DRAWINGS

The present invention may be understood by reference to the following detailed description taken in conjunction with the drawings briefly described below. It is noted that, for purposes of illustrative clarity, certain elements in the drawings may not be drawn to scale. Furthermore, descriptive nomenclature such as, for example, vertical, horizontal and the like applied to the various figures is used for illustrative purposes only and is in no way intended as limiting useful orientations of the structure or device described.

DETAILED DESCRIPTION

Figure 1:
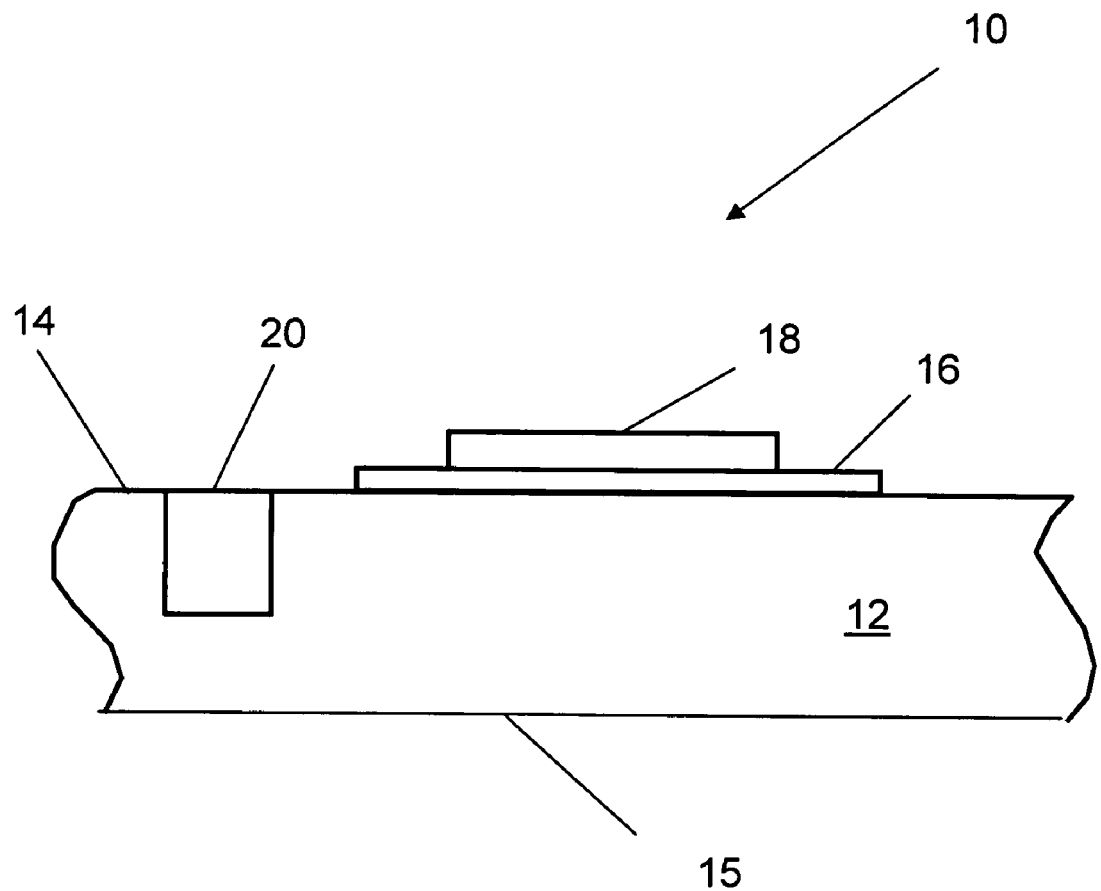
FIG. 1 is a diagrammatic fragmentary illustration, in partial cut-away view, of a semiconductor device, shown here to indicate the variety of topology potentially present on the surface of a typical semiconductor wafer.

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

It is important to appreciate that concerns with respect to non-uniformity across the wafer surface in the thermal processing of semiconductor wafers are especially important in sensitive processing steps such as the annealing of ion implantation damage and the electrical activation of implanted dopant species. For instance, such processes are vital in the formation of source and drain regions of advanced transistors. These processes must be very carefully controlled such that the electronic devices function as designed, and so that different devices across the wafer have uniform characteristics.

Other thermal processes that involve diffusion, annealing, chemical bonding rearrangements, chemical reactions or phase changes, may also require very strict process control. Examples of such processes include, for instance, metal silicide formation and annealing. The semiconductor material involved in such processing include, for example, Si, Ge, alloys of Si and Ge, and other compound semiconductors such as gallium arsenide (GaAs), indium phosphide (InP), indium antimonide (InSb), aluminum arsenide (AlAs), gallium nitride (GaN), silicon carbide (SiC) and alloys of these materials. Such materials may be employed directly on the semiconductor wafer or may be present as a thin film over an insulating substrate or an insulating film on top of another substrate. For example, a semiconductor film may be formed in a silicon-on-insulator configuration, in which a thin Si film is formed on top of a $SiO_2$ layer, which in turn is disposed on top of a silicon substrate.

One aspect of the present invention is based on the concept of applying a film of material to the wafer surface, then inducing a chemical reaction or a physical change in that layer to either generate heat (exothermic reaction) or absorb heat (endothermic reaction). This film of material essentially acts as an energy transfer layer/structure which assists in the transfer of energy into and/or out of the wafer. For instance, in an exothermic reaction, the heat released from the energy transfer layer by the reaction diffuses into the surface of the semiconductor wafer and thereby induces a temperature rise to induce the desired process in the wafer. In an endothermic reaction, heat is diffused out from the wafer surface, thereby lowering the wafer temperature in order to, for instance, quench a high temperature process in progress. In other cases, the energy transfer layer may act as an absorber layer, which facilitates the coupling of external energy onto a wafer surface. Additionally, an energy transfer layer/structure may include an arrangement of films or "sub-layers" that cooperate in order to achieve a particular objective. Furthermore, the energy transfer layer/structure may be segmented, as will be discussed in detail at an appropriate point in the following narrative.

As an example of an exothermic reaction in RTP, the energy transfer layer RTP concept may be applied to the process of annealing an ion-implanted layer to create an ultra-shallow junction (USJ) structure. This use of the energy transfer layer in a heat-generation/absorption application may be referred to as the reactive RTP concept hereinafter. As an exemplary reactive layer, a film of carbon may be applied to the surface of the wafer by a deposition process. The carbon-coated wafer may then be loaded into an RTP system and heated to an elevated temperature (e.g., 1000° C.) in an inert ambient, such as in nitrogen gas. A reactive gas, such as oxygen, is then admitted to the RTP chamber. The oxygen gas rapidly oxidizes the carbon film, thus releasing heat into the wafer surface. The heat increases the wafer surface temperature and, consequently, the ion-implant is annealed. This exothermic reaction terminates when all of the carbon has been consumed and removed from the wafer surface in a gaseous form. The wafer is then allowed to cool and removed from the RTP system.

For the above exothermic reaction approach to be useful, two requirements must be met. Firstly, the reaction must provide sufficient energy to heat the wafer surface adequately while releasing that energy into the wafer surface over a timescale that is sufficiently short, such that the heat is dissipated by thermal conduction, convection or radiation.

In the aforedescribed example of the carbon film, a 1-μm thick film of carbon coating the surface of a wafer has a total volume of $10^{-4}$ cm$^3$ for every square centimeter of wafer surface area. Assuming that the carbon film has the density of graphite (i.e., ~2.26 g/cm$^3$), then there is approximately $2.26 \times 10^{-4}$ g/cm$^2$ of carbon on the wafer surface. Since a mole of carbon weighs approximately 12 g, there are ~$1.88 \times 10^{-5}$ mol/cm$^2$ of carbon on the wafer surface. The combustion reaction:

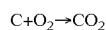

$$C + O_2 \rightarrow CO_2$$

releases 393.5 kJ/mol, so the conversion of 1-μm thick film of carbon on the wafer surface to $CO_2$ releases an energy per unit area of $393.5 \times 10^3 \times 1.88 \times 10^{-5} = 7.4$ J/cm$^2$. This amount of energy is a useful amount of heat for producing a temperature rise in the surface of a silicon wafer. Therefore, by this calculation, the energy available from combustion of a carbon film in oxygen should be large enough to be useful in RTP.

It is recognized that not all of the heat produced in the above exothermic reaction would be directed into the wafer, since the reaction product tends to carry away a fraction of the produced energy. However, as a broad concept, Applicant has found that such chemical reactions are able to generate useful heat for promoting the surface reactions necessary in processing a semiconductor wafer.

The second requirement for the exothermic reaction approach to be useful is that the rate at which heat is generated by the chemical reaction is large compared to that at which heat is lost from the reacting region and the semiconductor wafer itself. For instance, if it is desired to heat the wafer surface over a millisecond timescale, then the 1-μm layer of carbon in the above example must be consumed in a similar timescale. This requirement places limitations on the kinetics of the reaction and the way in which the reaction is carried out.

Methods for Accelerating Reactions

Various methods to accelerate the rate of exothermic reaction may be implemented, as described in detail immediately hereinafter.

(A) The wafer may be pre-heated to a reaction temperature before the reactive gas (i.e., oxygen in the present example) is admitted into the RTP chamber. The pre-heating promotes the sudden combustion of the carbon film when the hot carbon surface is exposed to oxygen or another reactive species. The reaction temperature may also be selected to optimize the reaction rate.

(B) The ramp rate for heating the wafer in the oxidizing ambient may be made large such that most of the exothermic reaction occurs in a temperature regime that favors the rapid release of heat. This approach is particularly useful if there are difficulties in providing an adequately fast switching of the ambient gas to initiate the reaction.

(C) A pulse of heat may be applied to the wafer surface to initiate a fast reaction. This pulse may be applied from the main heat source or from a secondary pulsed energy source. This approach may be used to provide a hybrid method for pulsed anneals. Namely, some of the energy for the surface heating may be provided by the energy pulse while additional heat is provided by the chemical reaction. The pulse of energy may be provided by, for example, flashlamps, lasers or other forms of pulsed electromagnetic radiation or particle beams.

(D) The reactive species may be optimized to the specific chemical reaction used in the process. Particularly, in the present carbon oxidation example, a wide variety of approaches may be adopted. For example, the reactive oxygen gas may be provided in the form of oxygen molecules, oxygen ions, oxygen radicals, ozone ($O_3$) or other oxidizing species and chemicals. The desired species may be supplied by a number of approaches including, but not limited to, direct generation within or near the process chamber. For instance, highly reactive species may be generated through photo-excitation of gases with high energy photons or particles, plasmas, flames and chemical reactions in the gas phase. The gases may be exposed to these excitation methods either directly within the RTP chamber itself or, alternatively, the desired species may be generated separately then transferred into the chamber. The reactive species may also be formed by mixing a given combination of gases together to provide the process ambient.

(E) A stimulating energy may be applied directly to the wafer itself in order to, for example, promote a reaction at the wafer surface. The stimulating energy may be provided from photons, such as ultraviolet (UV), visible or infrared (IR) radiation, or other electromagnetic waves, such as radio frequency (RF) or microwave excitation. Energy sources for simulating reactions may include, but are not limited to, lasers, lamps, flash-lamps, X-ray generators, RF and microwave power sources. The reactive processes may also be stimulated by exposure to a plasma or particle beams, such as electron or ion radiation or even beams of energetic neutral species.

(F) The reactant pressure may be optimized in order to increase the reaction rate. In some cases, the chamber pressure may be increased to accelerate the reaction rate. In other cases, it may be desirable to decrease the chamber pressure in order to optimize, for example, the flow of reactants and reaction by-products towards and away from the wafer surface.

(G) The design of the process chamber may be optimized to achieve gas flow behavior that facilitates the reactions. For example, a pulse of the reactive gas may need to be provided to the surface of the wafer in a rapid and uniform manner. In this case, it is useful to design a chamber in which the reactive gas is introduced using, for instance, a shower head configuration facing the wafer such that the reactive species concentration is uniform across the wafer surface. Additionally, the gas flows and pressures may be engineered to allow rapid introduction of reactive species and their removal through suitable exhaust arrangements. For instance, it may be useful in some applications to form high velocity beams of reactive species that may be directed at the wafer surface. This approach may be combined with the use of a low pressure environment that allows rapid removal of reaction by-products from the wafer surface.

(H) Catalytic methods may be used to promote the reaction which generates the heat. The catalyst may be included within the deposited energy transfer layer structures on the wafer surface or provided within a gas introduced into the chamber.

(I) The structure of the energy transfer layer may be optimized to allow rapid reaction or to improve the repeatability and uniformity of the process. For instance, factors such as, but not limited to, thickness, composition, microstructure, density, porosity and surface texture of the film may all influence the reaction rate.

For example, combinations of films, such as multi-layer structures, may also be optimized in view of acceleration of the reaction rate, especially if one material on its own cannot meet all of the requirements for optimization. In particular, it is recognized that the structure of the energy transfer layer will influence how well the heat is transferred to the semiconductor wafer. In this sense, optimization of film characteristics such as the thermal conductivity may also be influential in accelerating the reaction rate.

As another example, the way in which the energy transfer layer absorbs and radiates heat and light may also be optimized to promote efficient processing. For example, it may be useful to design the film's optical properties so as to enable uniform and efficient coupling of the radiation used to heat the wafer or to initiate the reaction. This effect may be useful, for instance, if a flash-lamp or laser source is used to provide a pulse of heat to the wafer surface, either to stimulate a reaction or provide heat to the wafer surface.

As yet another example, the energy transfer layer may be designed to absorb a specific lamp spectrum or laser wavelength. Such coatings may also be patterned if it is necessary to vary the energy delivered to different regions on the wafer surface. For example, this approach is useful if certain regions of the wafer surface are more sensitive to thermal exposure than other regions. In another case, it may be useful to add a transparent surface layer which allows transmission of some fraction of stimulating radiation to a depth within a multi-layer reactive coating structure, for example, to deposit heat or high-energy photons to that depth.

(J) The energy transfer layer itself may be designed to have optical properties that improve the ability to measure or control the temperature of the wafer being processed. For example, a coating may be designed to exhibit a known spectral emissivity at a given wavelength. In this case, a pyrometer that senses radiation at the given wavelength may be conveniently used to determine the wafer temperature.

(K) The energy transfer layer may be designed to provide additional functionality in addition to the exothermic or endothermic reaction. That is, although the energy transfer layer RTP concept emphasizes the emission or absorption of heat from an energy transfer layer formed on the wafer surface, the energy transfer layer may be used to assist in thermal processing of the wafer in various other ways. For example, when the properties of the energy transfer layer are engineered as in the approaches (I) and (J) described above, an energy transfer layer may actually perform a function more concerned with improving the control or uniformity of a thermal process than with merely generating or absorbing heat.

One instance in which this added functionality concept is useful is in mitigating the so-called "pattern effects" in wafer processing. In particular, the processing of patterned wafers can pose a problem in any processing approach that involves the use of optical radiation to heat the wafer because the patterns on the wafer disturb the power coupling into the wafer as well as the heat loss from the wafer, thereby leading to large temperature non-uniformities known as pattern effects. A possible solution to the pattern effect problem is to deposit an extra film over the wafer surface for improving the coupling of radiation, thus reducing non-uniformities (i.e., in an approach similar to the ninth approach described above). However, the extra processing steps of depositing this extra film, then removing the extra film, add processing costs. The energy transfer layer concept is useful in this capacity since the extra film may be formed or removed by a chemical reaction.

As a specific example, an opaque film of carbon may be formed on a wafer surface to assist in the absorption of a pulse of heat energy at the wafer surface. Then, the carbon film may be removed either during or immediately following the pulse thermal process by exposing the wafer to a supply of oxygen gas.

It is recognized that, if the chemical reaction is rapid enough, then the heat generated by the combustion process may be useful in assisting the pulse heating process. However, even if the opaque film were removed by a slower oxidization process (e.g., at a lower temperature or after introduction of a different gas ambient), a properly designed film would not need to be removed in an additional stage of processing. In this mode of processing, the key features of the energy transfer layer concept are that the energy transfer layer improves the heating process while being capable of convenient removal by a chemical reaction, which may even be performed in the same process step as the heating process.

Such an energy transfer layer may additionally be used to improve temperature measurement and control, for example, by allowing more accurate and repeatable measurements as suggested in approach (J) described above. Furthermore, the energy transfer layer may be designed to yield additional benefits by altering the thermal radiative properties of the wafer surface, such as providing an increase in emissivity, which increases the cooling rate of a wafer during a spike-anneal process.

Still further, the energy transfer layer may also be formed within the process chamber, prior to exposure to the heating process of interest, then removed by a second reaction. In this case, the energy transfer layer may be formed by, for example, a deposition process or through a chemical or physical conversion of another material already deposited on the wafer.

The aforedescribed approaches may be used in combination to optimize the reaction acceleration in each instance. Although the above approaches have been described in the context of the example of carbon and oxygen reactions, the same approaches may be applied to other reactions including, but not limited to, alternative materials and alternative reactions, such as solid-phase reactions and phase changes.

The foregoing discussion has so far concentrated on the use of exothermic reactions to produce pulses of heat in the wafer. As mentioned previously, it is also sometimes advantageous to use an endothermic process to provide a method for cooling the wafer surface. For example, in the spike-anneal approach discussed above, it is desirable to increase the cooling rate of the wafer surface, along with increases in the heating rate, so as to further reduce the peak width of the spike-anneal. Heat loss from the wafer is usually limited to that achievable by a combination of heat radiation, convection and conduction. By promoting an endothermic process at the wafer surface, the heat loss may be further increased so as to accelerate the cooling rate.

Again considering the example of a wafer with a carbon layer deposited on the surface, it is noted that the reaction of the carbon layer with carbon dioxide yields an endothermic process:

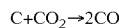

$$C+CO_2 \rightarrow 2CO$$

This process absorbs ~172.5 kJ/mol. Following a similar calculation to that used in the aforedescribed exothermic reaction, it may be calculated that the above reaction using a one micron-thick film of carbon absorbs ~3.2 J/cm$^2$ of energy from the wafer surface.

This endothermic process approach may be used to assist in rapid quenching of a wafer processing step, such as in a spike-anneal process. For example, a typical 300 mm diameter Si wafer has a thickness of 775 μm, while the density of Si is 2330 kg/m$^3$ with a specific heat capacity at 1000° C. of ~960 J/(kg K). That is, in order to decrease the wafer temperature by 1° C., ~0.173 J/cm$^2$ of heat must be removed from the wafer. If a one micron-thick film of carbon deposited on the wafer surface is reacted completely and all of the absorbed heat in the endothermic reaction is used to cool the bulk temperature of the wafer, the wafer temperature drops by approximately 18° C. Furthermore, for this application, the carbon film may be applied to both surfaces of the wafer, thereby leading to a theoretical temperature drop of 36° C. The reaction acceleration measures described in the like-named section appearing above may also be used to accelerate the reaction, if it is necessary, to remove heat at a higher rate.

Specifically considering reactive layers and the endo- and exothermic reactions associated therewith, it is noted that any chemical or physical change that releases or absorbs energy may be of potential value for providing heating or cooling to the semiconductor wafer. One useful characteristic of the reaction is a suitably large change in enthalpy as a result of the reaction. For example, a useful reaction may yield greater than ~5 kJ/mol of the reacting coating material, while possibly greater than ~100 kJ/mol may be desirable.

Another useful characteristic of the reaction is that the kinetics of the reaction should allow rapid reaction. For most RTP applications, the reaction should be completed in a time period of less than one minute and, in many applications, it is desirable to complete the reaction in less than two seconds. For surface heating or cooling applications, such as the millisecond spike-anneal processes described above, the reaction should be completed in a time less than it takes for heat to diffuse through a significant fraction of the wafer thickness. In such cases, the reaction time should be less than ~50 ms and, even better, less than 5 ms. As discussed in detail above, it may often be useful to optimize a variety of process conditions to obtain these fast reaction rates. In some instances, the reaction may be capable of releasing enough energy, but the rate-limiting step has an activation energy that is too high to permit an adequate rate of reaction at the process temperature of interest. In these situations, the use of stimulating radiation or catalysts, as described above, for enhancing reaction rates is especially valuable. In other cases, some reactions will proceed at a very high rate once they have been initiated. In such cases, the reaction may be initiated by the use of a pulsed energy source, such as pulsed laser radiation, to heat a thin region of the surface of the energy transfer layer to a high temperature.

The energy transfer layer should also be able to be incorporated into the semiconductor manufacturing process without introducing the risk of chemical contamination of the semiconductor wafer. In particular, it is desirable to avoid degradation of the electronic properties of the semiconductor device by contamination with certain chemical impurities, such as fast-diffusing metallic impurities. In this regard, the use of reaction films containing Si, Ge, carbon (C), oxygen (O) and nitrogen (N) is particularly useful, although dopant elements such as boron, arsenic and phosphorus may also be acceptable. Some metals that are frequently present during high temperature processing of semiconductor devices, such as titanium, tungsten and aluminum may also be useful in the reaction films.

Reaction films may be deposited by any standard method including, but not limited to, evaporation, sputtering, chemical vapor deposition and spin-on coating. For example, one useful method of forming a carbon film on the wafer surface is to apply a layer of an organic polymer using a conventional spin-on process, as used during the application of photoresist films in lithography. After the wafer is coated with this film, the wafer may be heated to ~500° C. in an oxygen-free ambient in order to convert the organic polymer film into carbon by a charring process.

Materials containing undesirable impurities may still be used in the reactive layer, but, in this case, a diffusion barrier should be placed between the semiconductor wafer and the reactive layer. This barrier layer should be chemically compatible with the semiconductor structures, yet it should be impermeable to the undesired impurities.

In general, the reaction process should leave no byproducts on the wafer surface, e.g., by only generating volatile byproducts. However, in some cases, it may be acceptable for the residual byproducts to be removed from the wafer surface by a separate cleaning or etching process. In the context of the present invention, the term "dispersing" is understood as sublimation, evaporation, vaporization or similar process or removal of a layer through exposure to processes such as a wet etch, dry etch, or dissolution.

It should also be noted that, for some reactions, diffusion barriers may have to be applied to both the front and the back of the wafer. One such case is if a reaction on one surface of the wafer produces a volatile species that might be transported to the opposite surface through the gas ambient in the processing chamber.

In certain cases, there may be difficulties in finding diffusion barrier layers that do not interact with the energy transfer layer or the semiconductor wafer. In this case, additional layers may be used between the barrier and the wafer and/or between the barrier and the reactive layer. These extra layers are designed to prevent undesirable reactions between the films. Multilayer structures of various types may be constructed to meet these objectives.

In some cases, the reaction leaves behind a residue which must be removed from the wafer surface or the barrier layer structures must be separately removed. At times, the cleaning or etching process for removing the residue or barrier layer structures may potentially damage the semiconductor devices. In such cases, it may be useful to include an additional layer between the energy transfer layer and the semiconductor devices. This additional layer should be designed to be resilient to the cleaning or etching process used to remove the residue, but to also be easily removable by an etching process that does not damage the semiconductor devices while being compatible with a variety of reactive layers and/or diffusion barriers.

The residue formation problem may also be addressed by performing a second reaction within the process chamber soon after the completion of the desired thermal process. For instance, if the reaction has produced a residue which is known to be difficult to remove by conventional etching processes, it may be possible to convert this residue into another form that is more easily removed. If the reaction was an exothermic oxidation of a metal, for example, then it may be possible to convert the residual oxide back into a metal form by a reduction process by introducing hydrogen. The reaction temperature and other processes should be optimized to prevent undesired thermal budget for the device layer. In this regard, a variety of process conditions, such as, but not limited to, partial pressures of gaseous species, temperature and time, may be optimized to meet this goal. Once the metal has been re-formed, the metal layer may be removed by another etching process either in the process chamber or in a separate processing step.

Another approach for dealing with residue removal is through an in-situ etch. For example, after a metal oxide has been formed, it may be possible to switch the gas ambient within the process chamber and, subsequently, introduce a halogen-containing gas for etching away the metal oxide. Since many metals react with halogens to form volatile halides, this approach may be a convenient way to remove the residue without requiring an extra process step. The etching conditions may be optimized to remove the residue layer without damaging underlying device layers.

Types of Useful Reactions

Several types of reactions or physical processes may be useful for generating or absorbing heat from a semiconductor wafer, such as the following:

(1) The reaction between a surface coating and a gas, such as the carbon and oxygen reaction (exothermic) and the carbon and carbon dioxide reaction (endothermic) as described above. Many other combinations of film materials and gases are possible. The gaseous species may include any of the highly reactive species (i.e., ions, radicals, etc.) as discussed above.

(2) The transformation of a surface coating. This type of reaction includes materials that undergo a transformation when heated. The transformation may be of any physical or chemical nature that results in an enthalpy change. A special case of this transformation type is a phase transition such as, for example, melting, sublimation, crystallization or change of microstructure with an associated enthalpy change.

(3) The decomposition reaction, such as when a material undergoes a chemical reaction that converts the material into multiple species, without necessarily requiring the presence of a second reactant in the reaction.

(4) The formation of a surface coating. In some cases, the adsorption of a species from a gaseous phase at a surface may be associated with the release or absorption of heat. This heat release or absorption may be associated with a phase change, such as condensation of a vapor. This type is a rather special example of the energy transfer layer concept because the energy transfer layer is formed during the reaction process.

(5) The reaction between materials co-deposited on the wafer. In this case, the reaction film may be formed from more than one constituent species, which species undergoes a reaction when heated or when the reaction is initiated by some other mechanism, such as irradiation or through the introduction of a catalyst. It may additionally be useful to ensure that the ratio of the quantities of reactants deposited favors a particular chemical reaction or optimizes any byproducts or residues resulting from the reaction. This type of reaction may be implemented in a variety of ways. For instance, the species may be intimately mixed by co-deposition, or the species may be in separate layers, one on top of another. The species may also be separated by an intermediate layer.

In one special case of this type of reaction, this intermediate layer may be designed to disintegrate on heating to a given temperature, thus allowing contact between the two reactants and resulting in the initiation of the chemical reaction. Reactions between deposited species may also be triggered by various types of stimulation including, but not limited to, absorption of electromagnetic energy or energetic particles and exposure to a catalyzing or reactive species. In another special case of this type of reaction, a multilayer structure with alternating layers of two reactive species may be created. This special case is useful for a rapid reaction because the reacting layers may be placed in contact over a large surface area. The reaction then proceeds in all of the layers simultaneously. One may even design the thicknesses and composition of such film structures in such a way that the heat output is controlled in time. For instance, a rapid initial output of heat from thin films reacting may be followed by a more gradual output of heat from thicker layers.

In these approaches where two or more films are involved in the reaction, it may be useful to optimize the film texture or microstructure in order to adjust the surface area in contact or the relative quantities of the reactants present. Porous structures may also be used where one chemical species forms the matrix and a second species coats or fills pores. Such a configuration leads to a reaction that proceeds very rapidly, using the large internal surface area of contact between the reactants. Any structure where particles of one material are embedded within a matrix of another material may be used in a similar fashion.

(6) A surface film containing an agent that catalyzes a reaction may be used. In this case, the heat is generated by a reaction which takes place at the surface, although the surface film itself may not be a reactant as such. The reaction itself may involve gaseous species that are adsorbed at the wafer surface and consequently undergo a reaction at the surface. This type of reaction is a special case of the energy transfer layer concept since the film itself may not undergo any kind of transformation, merely serving as a catalyst that promotes the liberation or absorption of heat at the surface.

(7) Any of the above types of reactions may be promoted by the aforedescribed approaches including stimulation by pulses of heat, photons or electromagnetic radiation, bombardment by particles and chemical catalysts. Some specific examples of useful reactions are discussed immediately hereinafter.

Specific Example Reactions (A) Reactions Between Films and Gaseous Species (A.1) Oxidization of non-metals through a reaction with oxygen, oxygen ions or radicals or other oxidizing species. For instance, the aforedescribed reaction of a C film with $O_2$ to produce carbon dioxide ($CO_2$) or carbon monoxide (CO) in an exothermic reaction. Other useful non-metals include, but are not limited to, Si and Ge.

(A.2) Reaction of C with $CO_2$ or steam, which provides an endothermic reaction, as described earlier.

(A.3) Reaction of non-metals (e.g., C, Si or Ge) with halogens or halogen ions or radicals (fluorine ($F_2$) or chlorine ($Cl_2$)) in an exothermic reaction. Halogen-assisted reactions may also be stimulated through reactions with hydrogen halides, such as hydrogen fluoride (HF), hydrogen chloride (HCl) or hydrogen bromide (HBr). In certain cases, it may also be useful to introduce the halogen through a compound that decomposes to liberate the halogen within the reactive layer. For example, trans-1,2-dichloroethylene ($C_2H_2Cl_2$) decomposes when heated to generate HCl species.

(A.4) Reaction of metals with oxygen, oxygen ions or radicals or other oxidizing species. This type of reactions includes, for example, combustion of magnesium (Mg), boron (B), aluminum (Al), gallium (Ga), scandium (Sc), yttrium (Y), lanthanum (La), titanium (Ti), zirconium (Zr), hafnium (Hf), vanadium (V), niobium (Nb), tantalum (Ta), molybdenum (Mo), tungsten (W), rhenium (Re), ruthenium (Ru), cobalt (Co), indium (In), tin (Sn) or antimony (Sb) in $O_2$. Reactions between $O_2$ and the rare earth group of metals, such as cerium (Ce), praseodymium (Pr), neodymium (Nd), promethium (Pr), samarium (Sm), europium (Eu), gadolinium (Gd), terbium (Tb), dysprosium (Dy), holmium (Ho), erbium (Er), thulium (Tm), ytterbium (Yb) and lutetium (Lu), may also be useful. Alloys or mixtures of metals and intermetallic compounds may also be used. Certain elements such as iron (Fe) and copper (Cu) are avoided in some cases because these elements are known to be potentially deleterious to semiconductor device properties and have high diffusion rates through semiconductor device structures and materials. The application of diffusion barriers is likely necessary in most cases when using this type of reactions, partly to prevent contamination and also to prevent undesired reaction of the metal with the device structures. In some cases, combustion of the metals may be assisted with the additional presence of halogen species, such as B with $O_2$ and $F_2$. Reactions of this type will typically be highly exothermic. Some metals form oxides that are volatile, therefore may be advantageous in the removal of the reaction product from the wafer surfaces.

(A.5) Reaction of metals with halogens. Typically, the list of metals of particular interest is similar to that for interaction with oxygen as described above, such as the reaction of Al, B, Ti, W, or Zr with $F_2$ or $Cl_2$. Reactions will typically be exothermic, although evaporation of reaction product may be endothermic. Many metal halides are quite volatile, thereby allowing convenient removal of reaction byproducts from the wafer surface in the vapor phase.

(A.6) Reaction of metals with steam (e.g., Zr or B with steam ($H_2O$)).

(A.7) Reaction of metals with nitrogen (e.g., Ti, Ta, Hf, Nb, Zr or Al with nitrogen gas ($N_2$)).

(A.8) Reaction of metals with $CO_2$ (e.g., Mg with $CO_2$).

(A.9) Reaction of a variety of elements with hydrogen gas ($H_2$). For example, the reaction of C with $H_2$ to form methane ($CH_4$) is exothermic. On the other hand, the formation of germane ($GeH_4$) through the reaction of Ge with $H_2$ is endothermic.

(A.10) Reaction of various elements with ozone (e.g., reaction of C with $O_3$).

(A.11) Reaction of elements with nitrogen oxides such as nitric oxide (NO), nitrous oxide ($N_2O$) and nitrogen dioxide ($NO_2$).

(A.12) Reaction of compounds and elements with ammonia ($NH_3$) gas.

(A.13) Reduction of oxides by a reducing agent (e.g., reduction of metal oxides in $H_2$ or $NH_3$).

(A.14) Hydration processes to release heat (e.g., hydration of zeolites by $H_2O$ vapor to provide an exothermic process).

(B) Reactions between Metals Deposited Together (B.1) Reaction forming a silicide or a germanide, such as a reaction between Si and W, Ti, Co, Ni, platinum (Pt), palladium (Pd), Ta, Mo or iridium (Ir). It may be beneficial to provide a stoichiometric mix favoring a particular reaction product, such as 5 Ti+3 Si to produce titanium silicide ($Ti_5Si_3$) or Mo+2 Si to produce molybdenum disilicide ($MoSi_2$). Similar reactions are also possible with other group IV elements, such as Ge.

(B.2) Reaction forming a carbide, such as the reaction of C with Si, Al, Ta, Ti, Hf, Nb, Zr or W.

(B.3) Reaction between metals and oxides, such as the reaction of Al with nickel oxide (NiO), Al with boric oxide ($B_2O_3$), Zr with cobalt oxide (CoO) or Mg with $SiO_2$. Typically the metal will reduce the oxide, thereby forming its own oxide in the process. The selection of metals and oxides is usually based on the metal having a greater affinity for oxygen than the metal species incorporated in the metal oxide used. Useful metals in this context include Al, Mg, Zr and Hf. This type of reaction is sometimes called a thermite reaction, where a classic example is the reaction between Al and ferric oxide ($Fe_2O_3$) resulting in aluminum oxide ($Al_2O_3$) and Fe. This particular reaction is not ideal for the present application of semiconductor processing because Fe is considered an undesirable contaminant in the semiconductor manufacturing environment. Most reactions involving metal species would likely require the use of a diffusion barrier to prevent contamination. It may also be useful to combine this type of reaction with a second reaction involving the liberated metal, such as a reaction with silicon to form a silicide.

(B.4) Reaction between metals, such as a reaction between Al and Ti, Ni, Mg or Nb, between Ru and Al, between Ti and B or Ni, and between Nb and B.

(B.5) Reaction between oxidizing agents and elements, such as the reaction between ammonium nitrate ($NH_4NO_3$) or ammonium perchlorate ($NH_4ClO_4$) and Al.

(C) Chemical Decomposition of Materials Deposited on the Surface (C.1) Decomposition of energetic materials, such as $NH_4NO_3$ or other inorganic or organic compounds including nitrate, chlorate, bromate, iodate, perchlorate, peroxide or azide groups.

(C.2) Dehydration of certain materials. For example, the dehydration of zeolites will absorb energy. This process is the reverse of process (A.14) listed above, which illustrates a useful general concept relating to this invention, i.e., it is often possible to reverse a reaction in order to provide an endothermic process, as opposed to an exothermic process. The reaction "direction" may be influenced by selecting the appropriate combination of factors including, but not limited to, concentrations of reacting species in the gas ambient, pressures and temperature.

(D) Physical Change of Materials Deposited on the Surface (D.1) Evaporation or sublimation of films, such as SiO sublimation. Other materials may include the more volatile oxides and halides. This type of process is usually endothermic and may provide a useful extra heat-loss mechanism in cooling applications. This type of process also has the advantage of potentially leaving the wafer surface clear of by-products.

(D.2) Melting, e.g., melting of a film of Ge.

(D.3) Crystallization, e.g., crystallization of amorphous Si or Ge (D.4) Change in a crystal lattice structure.

(E) Formation of a Layer on the Wafer Surface (E.1) Condensation of a vapor, e.g., SiO. This process is the reverse of the evaporation process (D.1) listed above.

(E.2) Release of heat from an adsorption process.

Applications

The energy transfer layer approach may be useful in a wide variety of applications such as, but not limited to, the following:

(1) The enthalpy change may be used to promote an annealing process in a semiconductor wafer that has undergone an ion-implantation process. In particular, it may be useful for forming ultra-shallow junction (USJ) structures. These USJ structures may be formed by implanting various dopant species at low energies. For example, for doping Si, SiGe or Ge semiconductors, the following implants may be of interest: B at energies E<2 keV; boron fluoride ($BF_2$) at E<9 keV; arsenic (As) at E<15 keV; phosphorus (P) at E<6 keV; Sb at E<20 keV; and In at E<20 keV.

It should also be noted that, for a light dopant like B, it is often advantageous to introduce the dopant via a heavier ion that disintegrates on implantation. The advantage of this method is that a higher acceleration energy may be used, thus increasing the ion implantation beam current available and assisting in increasing wafer throughput. For example, the decaborane species $B_{10}H_{14}$ or even heavier molecules such as $B_{18}H_{22}$ may be useful in this context. Dopants may also be introduced by plasma implantation methods.

The typical dose for implants used in the formation of shallow junction structures is in the range between $10^{14}/cm^2$ and $10^{16}/cm^2$. Other implants may also be used in conjunction with the dopant species. For example, it may be useful to amorphize the regions to be doped with a pre-amorphization implant (PAI) before ion-implanting the dopant species. Pre-amorphization aids in reducing the channeling of the dopant implant, where ions may preferentially penetrate deep into the lattice along certain directions defined by the crystalline lattice. Pre-amorphization is typically performed by implanting the wafer with Si or Ge, but other species, such as As and Sb, may also be used. The energy used in the PAI varies with the dopant species being used. In the case of Ge, typical values fall between 2 and 40 keV. The doses used in PAI depend on the energy and mass of the species being used, but usually fall in the rage between $10^{14}/cm^2$ and $10^{16}/cm^2$.

In certain situations, the co-implantation of other species with the dopant may have a beneficial effect on activation and diffusion behavior. For instance, the use of fluorine (F) implants in combination with B doping has been found to be useful. Any combination of doping, PAI and co-implantation steps may be usefully combined with the energy transfer layer concept of the present invention.

(2) As a variation to application (1), it may be useful to have an energy transfer layer process that takes place on a millisecond timescale to perform the anneal. This variation is particularly useful if the peak temperature achieved is greater than 1100° C.

(3) In some situations, it may be useful to tailor the wafer by generating heat at the surfaces and/or by the presence of a film coating, which may or may not contribute to heat generation or distribution. For example, for application (2) listed above, a millisecond pulse of heat that heats the surface by several hundred degrees induces large thermal stresses in the substrate, which may cause undesirable wafer deformation. In order to alleviate this problem, the wafer may be coated with a film in such a way such that a second stress distribution is applied, thereby tailoring the stress distribution and avoiding such deformations. For instance, coatings may be applied at various locations on either one or both sides of the wafer. The coatings at various locations of the wafer may be of different thicknesses or different materials for generating different stress behavior and/or amounts of heat.

It may be beneficial in some cases to vary the thicknesses or composition of the reactive layers over the wafer surfaces in order to improve the temperature or stress distribution across the wafer, for instance, to minimize distortion or damage to the wafer. Such variations may be obtained by various approaches including, but not limited to, spatially patterning the layers, modifying the deposition process to produce non-uniform films and by depositing several films on the wafer while patterning them as necessary.

This type of approach to provide compensating stresses on opposing sides of the wafer may also be performed by using a pulsed energy source that irradiates the two sides of a substrate simultaneously, although such pulsed energy sources may add to the processing equipment cost and complexity. Another possibility is the use of a mechanical wafer support arrangement for imposing compensating stresses on the wafer. Compensation for stress is also contemplated using a film that is not intended as being reactive but is positioned on the substrate in a way that is intended to favorably influence the overall stress distribution in the substrate. Such a film may be tailored, for example, in thickness, extent and distribution pattern in order to achieve the desired effect of compensating for potential stresses in the wafer.

(4) A special case of application (1) is to thermally process in a way which promotes epitaxial crystallization of an amorphous layer formed during the implantation process (either by the dopant itself or by a PAI step). This solid phase epitaxy (SPE) process is known to result in highly electrically active layers. One difficulty in using this process on its own for forming USJ structures is that, although SPE repairs most of the crystal damage, the process leaves some residual defects in the crystal and possibly in regions of the gate dielectric that have been affected by the ion implant. As a result, an additional high temperature anneal stage is typically required. Unfortunately, this additional anneal may deactivate the dopants, thereby reducing the benefit of the SPE step. However, if a pulse of heat from the energy transfer layer is used to repair the residual damage, annealing out the residual damage in the crystal or gate dielectric is contemplated without deactivating the dopants. This approach may be implemented as a pulse of heat after the SPE process or as a pulse of heat that also promotes the SPE process itself.

There are advantages in using a pulse of heat from an energy transfer layer to stimulate the SPE process itself. For example, it is known that large concentrations of dopant in the amorphous layer may decrease the SPE recrystallization rate and may be associated with generation of defects. It is also know that this effect is reduced at higher temperatures. Therefore, in some cases it may be useful to exploit a pulse of heat from the energy transfer layer to assist the SPE process. It is also possible to apply a pulse of heat for defect annealing before the SPE process if desired, and such a pulse also typically promotes the SPE process itself.

(5) For spike anneal processes, the application of a coating that leads to an endothermic process that removes heat from the wafer may be particularly advantageous. This energy transfer layer accelerates the cooling of the wafer. The endothermic process may be in progress throughout some portion of the processing recipe, thus providing an increased heat loss over and above the losses from radiation, convection and conduction into the surroundings. It may also be triggered at a specific point in the process such as, for instance, just after the ramp to the peak temperature of the spike anneal has been completed. In this case, the endothermic process does not compromise the ramp-up rate nor lead to an increased power demand from the heating system. The endothermic process may be carried out on either surface of the wafer because the heating rates in a conventional spike anneal process are relatively small and the time for the heat to be transferred through the substrate thickness is only approximately 50 milliseconds. If the endothermic reaction is promoted on both surfaces of the wafer by the use of reactive layers, then the cooling effect is even more significant.

(6) Reactive layers may be used to optimize annealing processes other than ion-implantation damage. Other structures that may be annealed include deposited films, dielectrics and various types of semiconductor materials. Furthermore, the energy transfer layer approach may be useful in fields outside of traditional semiconductor processes such as, for example, in the processing of new semiconductors, magnetic materials and optical materials.

(7) The energy transfer layer approach may be used in the formation of films and coatings through chemical reaction, either by: a) a reaction between energy transfer layer components; b) a reaction between the substrate and the energy transfer layer; and c) a reaction in which the energy transfer layer serves to provide heat to a film of a second material disposed between the energy transfer layer and the wafer, thereby causing the film of the second material to form a desired structure on the wafer. A diffusion barrier, for instance, may be placed between the energy transfer layer and this second material; or d) reaction of the energy transfer layer with an external gas.

One example of this application is the reaction of the semiconductor with metals to form silicides with the aid of the energy transfer layer approach.

(8) A specific material, which acts as a dopant in silicon, may be included as a part of the energy transfer layer such that the energy transfer layer is used simultaneously as a dopant source and a heat generation source. In this sense, it should be appreciated that the energy transfer layer may comprise a series of sub-layers. For instance, a dopant may be provided in an associated structure, such as in a film on the substrate, and heat provided to this doped film (using, for instance, a reactive film on top of the doped film) drives the dopant into the substrate. This application is advantageous because the ion-implantation process normally used to introduce the dopant is eliminated. Appropriate dopants include, for example, B, Al, As, P, In and Sb.

(9) An energy transfer layer may be used in pulsed processing processes as earlier described.

Optimization Approaches

In order to ensure optimal thermal processing as well as uniformity and repeatability of processing using the energy transfer layer concept, certain conditions should be established. A variety of exemplary approaches in this regard are described immediately hereinafter.

The choice of reaction may be selected according to the aforedescribed approaches. Initial film thicknesses and compositions may be estimated, for instance, from knowledge of the reaction stoichiometry and the thermodynamic data on enthalpy change associated with the particular reaction. The initial process conditions may be identified from, for example, knowledge of the Gibbs free energy change associated with the reaction as well as from kinetic data regarding the rate of reaction.

The process conditions may be optimized, for instance, through a combination of selection of the coating materials and their thickness, composition and microstructure. For example, once a specific energy transfer layer has been chosen, selection of the coating thickness allows control over the amount of heat liberated in the reaction and, consequently, the thermal cycle experienced by the wafer for desired results.

For instance, in a millisecond annealing process, the temperature rise induced in the wafer may be adjusted in the following manner. First, an energy transfer layer is formed on the wafer then a reaction is induced. Characteristics of the resulting ultra-shallow junction are then evaluated. Relevant characteristics of the USJ may include, for instance, the sheet resistance, junction depth and leakage current. If it is found that the temperature rise induced was inadequate to form a USJ with the desired characteristics, the thickness of the energy transfer layer may be increased to increase the temperature rise accordingly. That is, adjustment of the film thickness varies the amount of energy generated in the pulsed heating process. Other aspects of the process, such as the concentration of the reacting gas species, the temperature at which the reaction is initiated and the ramp rate, may also be optimized.

Additionally, variation in the spatial uniformity of the coating thickness across the surface of the wafer provides control over the uniformity of the process across the wafer. That is, the energy transfer layer may be patterned such that different parts of the wafer receive different heat treatments. For instance, the energy transfer layer may be masked from regions which are not to be heated. Such an approach may be useful, for instance, during process development activities. As an example, if the appropriate thickness of the energy transfer layer for a desired result is not known, the energy transfer layer may be deposited in such a way that the coating thickness is deliberately varied across the wafer surface. When this wafer is processed and the energy transfer layer is reacted, the temperature changes, and thereby the thermal processes induced, vary across the surface of the wafer. Various regions of the wafer may then be analyzed to determine the location of the best results, and the appropriate energy transfer layer thickness may be selected accordingly. Alternatively, discrete regions on a test wafer with different energy transfer layer thicknesses may be formed for the same purpose. Another possibly less efficient approach is to process multiple wafers with different energy transfer layer thicknesses. Furthermore, the energy transfer layer thickness may be optimized for lasers and lamp power coupling. For instance, the thickness design may be formulated by providing a film of varying thickness across a wafer, then studying the effects of processing in correlation to the thickness variation. In this way, the optimum thickness of an energy transfer layer may be identified for the particular type of processing heat source.

For repeatable and uniform processing in a manufacturing environment, the coating thickness should be accurately controlled. One approach in such a regard is to perform measurements of the energy transfer layer thickness before the reaction is induced so as to maintain the repeatability and uniformity of processing. The thickness measurement may be conducted by any standard method including, but not limited to, ellipsometry for transparent films and physical measurements based on propagation of sound waves or thermal waves for opaque films. The thickness measurement may be checked for accuracy by measurements of electrical properties such as sheet resistance.

Energy Transfer Layer Applications

Various options are possible for designing, forming, using and removing a surface layer on a wafer in order to improve the uniformity of processing across the surface of the wafer. As discussed above with respect to FIG. 1, the surface of a semiconductor wafer, which includes a plurality of layers and trench-like features formed thereon, is inherently non-uniform, thus potentially resulting in pattern effects during thermal processing by exposure to energy from a radiant heat source or other forms of energy. The energy transfer layer concept of the present invention may be adapted for the energy transfer layer to function as an energy transfer layer to help optimize the absorption of energy from a variety of energy sources.

The absorption of optical energy of a material may be evaluated by considering the optical properties of that material. In the present document, the terms "optical energy", "light" and "radiant energy" are considered to be equivalent to electromagnetic energy in a broad sense. Hence, the term "optical properties" applies generally to characteristics that describe the manner in which a given material or object interacts with any form of electromagnetic radiation including, but not limited to, x-rays, ultraviolet (UV) radiation, visible light, infrared (IR) radiation, terahertz radiation, millimeter wave radiation, microwave radiation and radio frequency (RF) radiation.

An object generally exhibits a reflectance $R_O$, which indicates the fraction of optical energy incident thereon that is reflected by the object. $R_O$ is also frequently called reflectivity, although the term reflectivity is more specifically used to refer to the portion of light reflected at a specific surface of an object. For example, if the object under consideration is a semi-transparent slab of material, then some of the light incident thereon will be reflected from a first surface (e.g., front surface) while another portion may be transmitted through the first surface then subsequently reflected from a second surface (e.g., back surface). This portion of light reflected from the second surface may in part be transmitted through the first surface, thereby contributing to the total energy reflected from the object. In this case, the reflectivity values of both the front and back surfaces play a part in determining the total energy reflected from the object.

The focus here is mainly concerned with the absorption of energy in substantially opaque objects. Therefore, the term "reflectivity" will be used to refer to the total fraction of incident energy that is reflected by the object. When considering a situation in which the object (e.g., wafer) is semitransparent, the term "reflectance" will be used.

A given object may also exhibit a transmittance $T_O$, which indicates the fraction of incident energy that is transmitted through the object. $T_O$ is frequently called transmissivity, but the term "transmissivity" is generally understood to refer to the energy transmitted through a specific surface (in the manner analogous to the use of the term "reflectivity" as discussed above).

An object also generally absorbs a fraction of the incident energy. This characteristic is referred to as absorptance or absorptivity A. The terms "absorptance" and "absorptivity" are considered to be substantially equivalent, and, in the present document, the term absorptivity is used throughout.

Conservation of energy dictates that absorptivity may be expressed as:

$$A = 1 - R_O - T_O. \tag{1}$$

For objects that are opaque, the transmittance $T_O$ is essentially zero, and the reflectance $R_O$ is equal to the reflectivity R of the surface being considered. The absorptivity of the object for radiation incident on the object is then given by:

$$A = 1 - R. \tag{2}$$

The reflectivity exhibited by an object is often a function of wavelength λ of the incident electromagnetic radiation. The dependence of the reflectivity on the incident wavelength is expressed as the spectral reflectivity function R(λ), which depends on the optical properties of the material composition of the object as well as the physical structure of the object. The variation of the reflectivity with wavelength is often described as the reflection spectrum of the object. For an opaque object, the corresponding absorption spectrum or absorptivity spectrum is described by the function A(λ), which is related to R(λ) through Equation (2) such that A(λ) = 1 − R(λ).

Any electromagnetic radiation source has an emission spectrum S(λ), which describes the power emitted by the source at any given wavelength. In a small wavelength range Δλ around a given wavelength λ, the source emits a power S(λ)Δλ. The power radiated by the source in any wavelength interval may be calculated by integrating the emission spectrum over the wavelength range of interest, such as from $\lambda_1$ to $\lambda_2$:

$$P_{\lambda_1,\lambda_2} = \int_{\lambda_1}^{\lambda_2} S(\lambda) d\lambda. \tag{3}$$

The total power radiated by the source is obtained by evaluating the integral:

$$P_{source,total} = \int_0^\infty S(\lambda) d\lambda. \tag{4}$$

When radiation from such an energy source falls on an opaque object, the radiation may be reflected or absorbed by the object. The amount of power reflected at a particular wavelength is determined by evaluating the product of the spectral reflectivity and the incident power. Hence, the total power reflected in a given wavelength range (e.g., $\lambda_1$ to $\lambda_2$) is given by the integral:

$$P_{reflected,\lambda_1,\lambda_2} = \int_{\lambda_1}^{\lambda_2} R(\lambda) S(\lambda) d\lambda. \tag{5}$$

A total or integrated reflectivity $R_{total,S}$ for a given object with respect to the radiation from a source S may be defined as the ratio of the total power incident on the surface of the object to the total power reflected from the surface:

$$R_{total,S} = \frac{P_{reflected,total}}{P_{source,total}} = \frac{\int_0^\infty R(\lambda) S(\lambda) d\lambda}{\int_0^\infty S(\lambda) d\lambda}. \tag{6}$$

It should be noted that integrated reflectivity $R_{total,S}$ is a function of both the object and the illumination spectrum. A similar approach may be used to define an integrated absorptivity $A_{total,S}$ based on the fraction of the power that is absorbed by the object:

$$A_{total,S} = \frac{P_{absorbed,total}}{P_{source,total}} = \frac{\int_0^\infty A(\lambda)S(\lambda)\,d\lambda}{\int_0^\infty S(\lambda)\,d\lambda}. \quad (7)$$

Alternatively, an integrated absorptivity for a given wavelength range may be calculated by limiting the range of the integrals to the range of wavelengths in question.

The equations defined above will be further discussed in the context of various types of energy sources and the various types of objects that may be processed in the present application. One consideration which should be noted is that the reflectivity and absorptivity of many surfaces are also functions of the incident radiation's angle of incidence and state of polarization. When calculating the integrated absorptivity, these factors also should be taken into account through the selection of the appropriate optical property values and integration over the appropriate range of angles of incidence and states of polarization. Most of the following discussion will concentrate on the case of normal incidence (i.e., the angle of incidence is zero and the radiation is incident at right angles to the plane of the wafer surface).

Suitable Energy Sources

Figure 2:
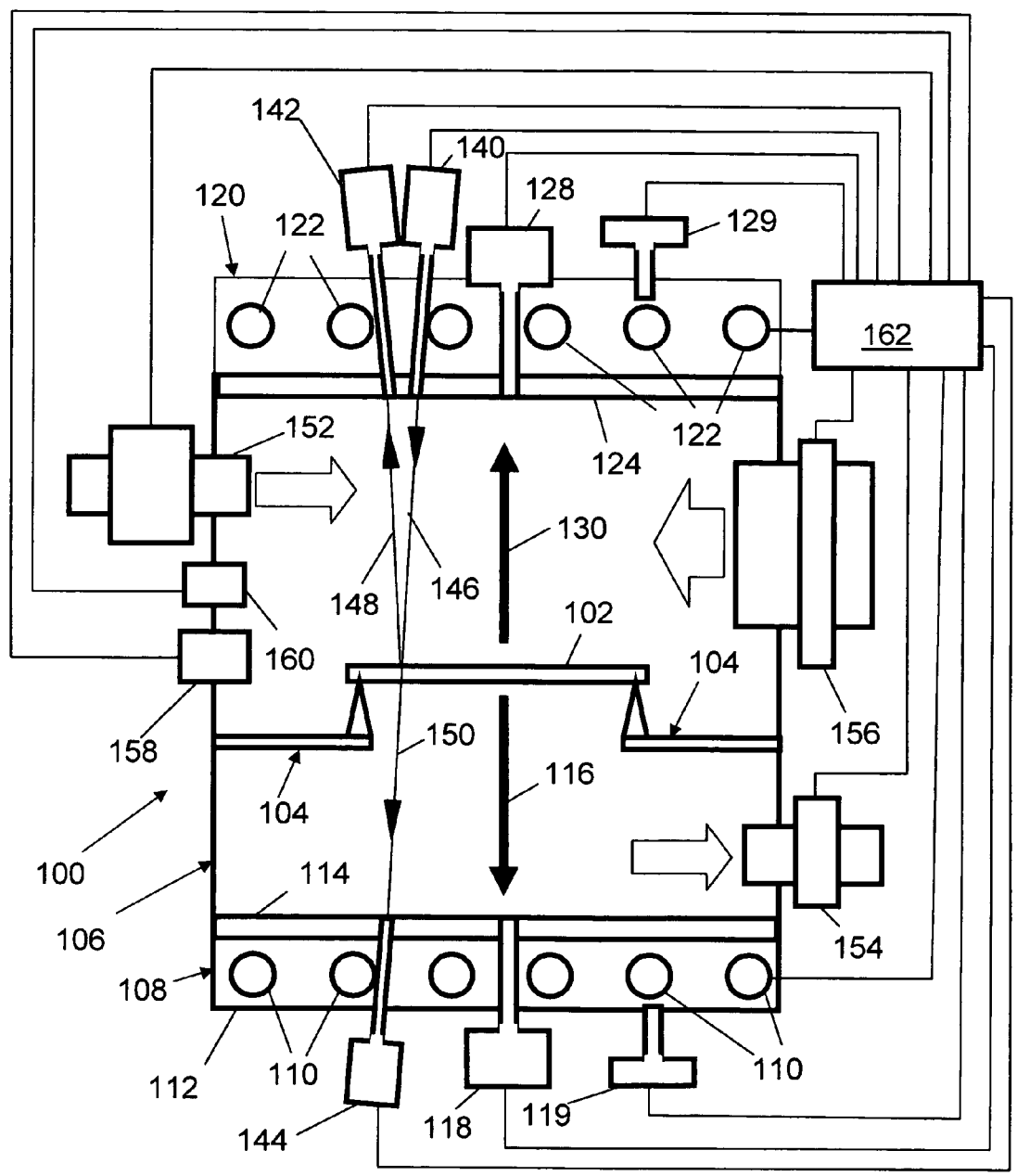
FIG. 2 is a diagrammatic illustration, in elevation, of a lamp-based thermal processing apparatus suitable for use in thermal processing of semiconductor wafers in accordance with the present invention.

FIG. 2 illustrates a lamp-based thermal processing apparatus 100, which is suitable for use in thermal processing of semiconductor wafers in accordance with the present invention. In apparatus 100, a wafer 102 is held on wafer supports 104 within a processing chamber 106. A preheating energy source 108, which is located below the wafer in the present figure, may be used to preheat wafer 102 to a given intermediate temperature. Preheating energy source 108 includes a plurality of preheating lamps 110 and a reflector 112 for reflecting the energy produced by preheating lamps 110 toward wafer 102. It should be noted that preheating energy source 108 may be disposed elsewhere in apparatus 100 including, but not limited to, above the wafer, both above and below the wafer, and elsewhere. The preheating lamps may be, for example, an array of arc lamps, flashlamps or tungsten-halogen lamps. Preheating lamps 110 are usually isolated from the portion of processing chamber 106 containing wafer 102 by a bottom window 114.

Additionally, wafer 102 may thermally emit radiation 116 therefrom toward bottom window 114. Bottom window 114 is configured to allow a portion of radiation 116 therethrough to a bottom pyrometer 118, which is configured to measure the temperature of wafer 102 according to radiation 116. Bottom window 114 may be designed to block certain wavelengths of radiation emitted by preheating lamps 110 from reaching wafer 102. In this case, bottom pyrometer 118 may be further configured to operate at one of the blocked wavelengths so as to minimize distortion of the pyrometer reading due to the entry of stray light into the pyrometer optics, thereby improving the accuracy of the temperature measurement. Other methods for filtering and/or controlling such stray light are described in commonly owned U.S. Pat. No. 6,835,914, (hereinafter the '914 patent), entitled APPARATUS AND METHOD FOR REDUCING STRAY LIGHT IN SUBSTRATE PROCESSING CHAMBERS, and U.S. patent application Ser. No. 10/629,400, entitled SELECTIVE REFLECTIVITY PROCESS CHAMBER WITH CUSTOMIZED WAVELENGTH RESPONSES AND METHOD (hereinafter, the '400 application), as well as International Publication No. WO 03/060,447 A1, entitled TEMPERATURE MEASUREMENT AND HEAT-TREATING METHODS AND SYSTEMS (hereinafter, the '447 application). regarding "water windows" now owned by Mattson Technology, Canada, and all of which are incorporated herein in their entirety by reference.

Although preheating energy source 108 in FIG. 2 is shown to include a plurality of preheating lamps 110, preheating lamps 110 may be substituted with other types of radiant energy sources including, but not limited to, hot plates, susceptors, blackbody radiators and other types of incandescent sources, lasers, particle beams, and RF, microwave or millimeter-wave energy sources. If necessary, such radiant energy sources may be provided inside the processing chamber, that is, without a window separating the radiant energy source from the wafer. The preheating of wafer 102 by preheating energy source 108 may occur through thermal radiation or by conduction or convection through a gas that transfers energy from a hot object to the wafer. For example, wafer support 104 may be replaced with a hotplate (not shown). For instance, wafer 102 may be supported in thermal contact with and in proximity of the hotplate using a vacuum chuck, electrostatic chuck or by mechanical clamping. The wafer may also be supported on a cushion of gas emanating from a gas support structure (not shown).

Thermal processing apparatus 100 further includes a surface heating energy source 120 for surface heating of wafer 102. Surface heating energy source 120 is located above wafer 102 in processing chamber 106 and includes a plurality of surface heating lamps 122. Surface heating lamps 122 radiate energy for heating the surface of the wafer, on which a variety of electronic devices may be formed, and may be operated, for example, in a pulsed mode. When surface heating energy source 120 is in operation, the temperature of the surface of the wafer which faces surface heating energy source 120 may be raised above that of the opposing surface of the wafer, thereby creating a thermal gradient through the wafer. Methods and applications of such processing are described U.S. Pat. No. 6,849,831 (hereinafter, the '831 patent), entitled PULSED PROCESSING SEMICONDUCTOR HEATING METHODS USING COMBINATIONS OF HEATING SOURCES, which is also assigned to the assignee of the present application and incorporated herein by reference. Like preheating energy source 108, surface heating energy source 120 includes a top window 124 for separating surface heating lamps 122 from the rest of the processing chamber as well as a top pyrometer 128. Wafer 102 may further thermally emit radiation 130 toward top window 124, and top pyrometer 128 may be configured for providing a temperature reading based on radiation 130 emitted by wafer 102.

Continuing to refer to FIG. 2, processing apparatus 100 further includes various sensors that enhance the reliability and repeatability of the processing steps, for example, through various approaches disclosed in the '831 patent. For instance, bottom pyrometer 118 and top pyrometer 128 provide temperature readings of the top and bottom surfaces of wafer 102 throughout the thermal processing cycle. Other types of temperature sensing devices, such as those described in U.S. patent application Ser. No. 10/178,950, entitled SYSTEM AND PROCESS FOR CALIBRATING TEMPERATURE MEASUREMENT DEVICES IN THERMAL PROCESSING CHAMBERS (hereinafter the '950 application), which is incorporated herein by reference in its entirety, may be used in place of or in addition to the pyrometers.

The processing apparatus of FIG. 2 may also include sensors for measuring the reflectance, transmittance and light scattering qualities of the wafer at one or more wavelengths of interest so as to determine certain characteristics of the wafer during processing. For example, the emissivity of the wafer at a pyrometer wavelength may be deduced from these measurements. Also, these sensors may be used to determine the amount of radiation that is produced by the lamps, is reflected from the wafer surface or is transmitted through the wafer. Such information may be useful for adjusting the lamp intensity in order to take into account changes in the lamps as they age or as other processing chamber components change their optical characteristics over time. To this effect, processing apparatus 100 also includes a light source 140, a top detector 142 and a bottom detector 144. Light source 140 is configured to produce a test radiation (indicated by an arrow 146), which may include one or more wavelengths therein and is directed toward wafer 102. Top detector 142 is configured to capture a reflected portion 148 (indicated by an arrow) of test radiation 146 reflected by the top surface of wafer 102. Bottom detector 144 is configured to detect a transmitted portion 150 (indicated by an arrow) of test radiation 146 transmitted through wafer 102. The scattered light within the processing chamber may also be collected using, for example, a detector. Furthermore, the intensity of the light emitted by the lamps may be monitored by detecting the reflected/transmitted/scattered lamp light.

When one or more arrays of lamps is used, as shown in FIG. 2, additional sensors (not shown) may monitor the output of individual lamps at one or more locations and thereby detect changes in the radiative properties that may affect the uniformity of the illumination pattern. Top detector 142 and bottom detector 144 may be configured to capture light only at fixed locations with respect to processing chamber 106 or, alternatively, may be configured to capture light over a broad area, thereby forming an image of the wafer which may be used to interpret the temperature, reflectance, transmittance and/or emissivity distribution across the surface of the wafer.

Processing apparatus 100 further includes a gas inlet 152 and a gas exhaust 154 for introducing gases into processing chamber 106 and for removing gases from processing chamber 106, respectively. Gas inlet 152 and gas exhaust 154 may include, for example, valves, mass-flow controllers and other standard mechanisms (not shown). A variety of gases may be directed into and out of processing chamber 106 through gas inlet 152 and gas exhaust 154, respectively, for purposes such as, for instance, purging the chamber, cleaning the chamber, performing a deposition process (e.g., to form an energy transfer layer), providing a suitable ambient for the thermal processing or removing an energy transfer layer. Gas inlet 152 and gas exhaust 154 may be configured to provide a variety of chamber pressure values from ultra-high vacuum conditions (e.g., less than $\sim 10^{-10}$ Torr) up to high pressure conditions (e.g., up to 1000 bar). Thermal processes are typically performed in the regime between $10^{-6}$ Torr and 2 bar.

Processing apparatus 100 also includes a reactive species source 156 for introducing excited reactive gas species into processing chamber 106. Reactive species source 156 may provide one of a variety of reactive species such as, for example, an atomic beam, a stream of radicals or ions or a plasma. These reactive species may be, for instance, generated outside of processing chamber 106 (e.g., at a remote plasma source) then introduced into processing chamber 106 or, alternatively, be generated directly within the chamber. The reactive species may be generated by a variety of plasma excitation such as, but not limited to, DC discharge, glow discharge, RF or microwave excitation, or plasmas generated by electron cyclotron resonance, inductive coupling or by a helicon. Excited species may also be created by irradiating gas with high energy photons, such as UV photons or x-rays, or by irradiation with particles such as electrons or ions. Additionally, excited species may be generated from a flame or other chemical reaction. Such reactive species may help facilitate deposition of an energy transfer layer, the thermal processing steps themselves or in etching the energy transfer layer.

Still referring to FIG. 2, processing apparatus 100 includes a pressure sensor 158 and a species sensor 160. Pressure sensor 158 may be configured to detect the pressure in the vicinity of the wafer. Species sensor 160 may be configured for detecting the types of species present in the gas ambient around the wafer, near the wafer surface or on the wager surface. Such sensors may include mass spectrometers or residual gas analyzers. Useful sensors in this regard may also include sensors that detect the presence of a species through a spectroscopic measurement, such as optical emission spectroscopy, which is particularly useful for characterizing the species present in a plasma. Other types of emission or absorption spectroscopy may be used as desired.

The variety of sensors included in processing apparatus 100 may be centrally controlled and monitored, for example, by a controller 162, which is electrically connected with the various components as diagrammatically illustrated in FIG. 2. Some or all of the lamps in preheating energy source 108 and surface heating energy source 120 may be replaced by a laser energy source or other suitable radiation sources.

Figure 3:
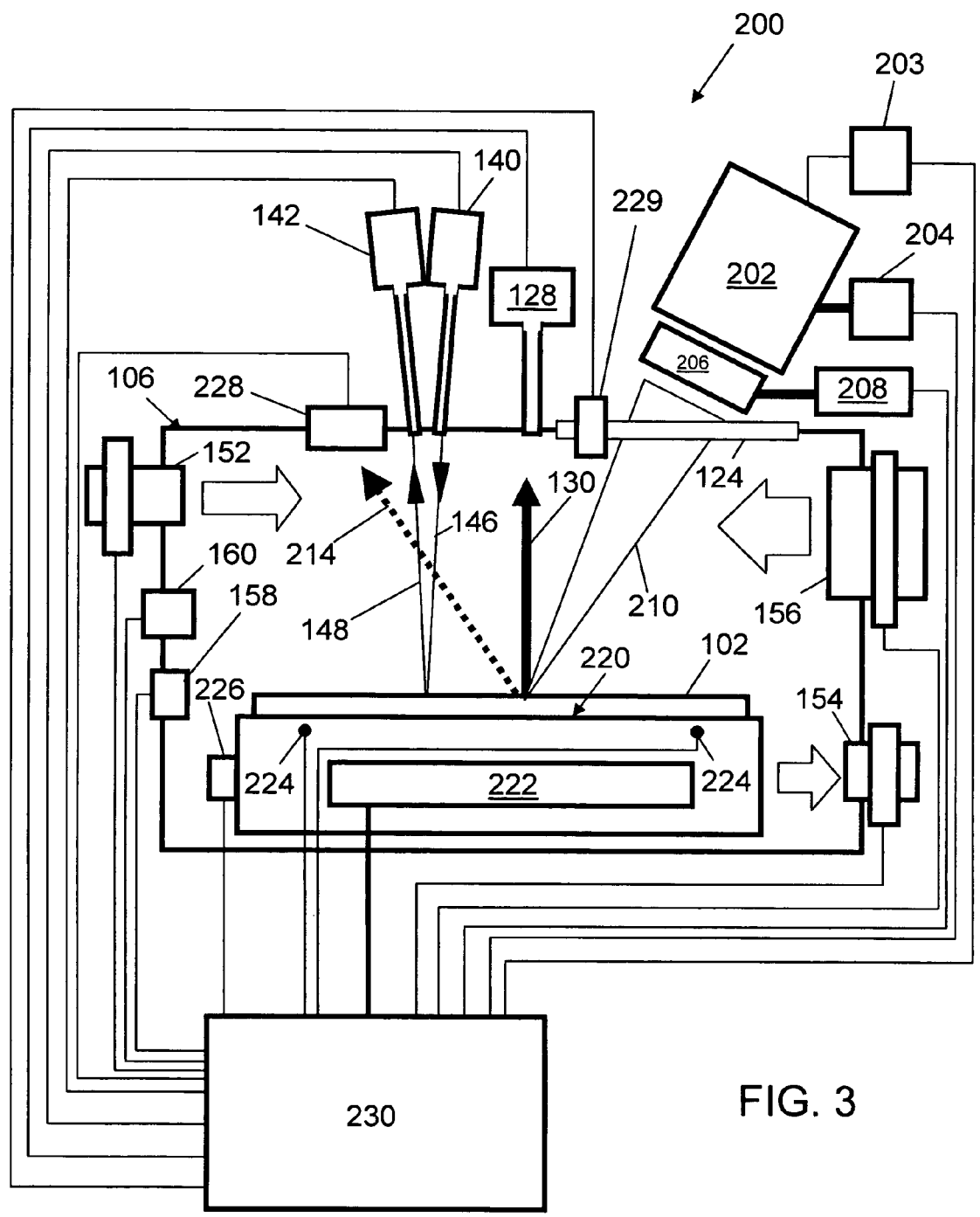
FIG. 3 is a diagrammatic illustration, in elevation, of a laser-based thermal processing apparatus suitable for use in thermal processing of semiconductor wafers in accordance with the present invention.

Turning now to FIG. 3, another processing apparatus 200 suitable for use in accordance with the present invention is shown. In place of surface heating lamps 122 of FIG. 2, processing apparatus 200 includes a laser 202, which is powered by a laser power supply 203 and controlled by a laser controller 204, and an optical arrangement 206, which is controlled by an optics controller 208.

Laser 202 may be configured to operate in a continuous wave (CW) mode or in a pulsed mode. In the pulsed mode, lasers typically produce energy pulses with durations between 1 femtosecond and 10 milliseconds. Lasers may also be operated in a quasi-CW mode to provide an output radiation consisting of a sequence of pulses. In the quasi-CW mode, the ratio of the intervals when the laser is producing optical power output to the intervals in which the laser is emitting either no power or a reduced level of power may be varied, as well as the power output level and the pulse duration. Lasers suitable for use in processing apparatus 200 include, but are not limited to, semiconductor lasers, solid state lasers, gas lasers and dye lasers. Semiconductor lasers may include single diode lasers, diode laser arrays and a stack of diode lasers. Suitable gas lasers may include excimer lasers, argon ion lasers, krypton ion lasers, helium neon lasers, HF or DF lasers, iodine lasers and CO or $CO_2$ lasers. Examples of solid state lasers include Ti:Sapphire lasers, alexandrite lasers, ruby lasers, Nd:YAG lasers, Nd:Glass lasers and other lasers based on lasing in media doped with other rare earth atoms, such as ytterbium (Yb), erbium (Er), neodymium (Nd) or combinations thereof. Solid-state lasers may be pumped by a variety of energy sources including, but not limited to, flashlamps, diode lasers and other lasers. Solid-state lasers may use a gain medium in various shapes including a rod, slab, cylinder, ring, prism, disc or fiber. Fiber and disc lasers may be particularly suitable for forming high power sources for the present application due to their high efficiency and optical qualities of the output beam. For example, YLR-5000 Yb-doped laser available from IPG Photonics in Oxford, Mass., is suitable for use in a processing apparatus in accordance with the present invention. DS030HQ Yb-doped YAG disc laser available from Rofin-Sinar in Plymouth, Mich., is a disc laser that may be suitable for use in the present application. The laser output should be of such quality so as to allow formation of small focused spots with a regular and predictable shape and, more advantageously, to allow coupling of the laser power into fine light pipes or optical fibers such that the laser radiation may be conveniently and efficiently delivered to the wafer surface. More exotic types of lasers, such as chemical lasers and free-electron lasers, may also be used. Furthermore, the range of wavelengths that can be employed can be extended, for example, by using non-linear optical materials for frequency-doubling, -tripling or -quadrupling or for frequency mixing. The wavelength range may also be extended by the use of optical parametric oscillators.

In FIG. 3, laser energy (indicated by a wedge 210) from laser 202 is delivered to the wafer through optical arrangement 206 that shapes the beam emitted by the laser into an illuminated region on the wafer. Alternatively optical arrangement 206 may be configured to deliver laser energy 210 to a spot or a line-shaped region on the wafer. In many cases, a laser will not have sufficient power output to be able to process the whole of the wafer, and, therefore, the output of the laser must be stepped or scanned across the wafer so as to achieve adequate coverage of the wafer. For example, a line-shaped beam may be swept across a given area of the wafer, then the beam and/or the wafer can be moved to process a different region of the wafer. When pulsed lasers are used, different areas of the wafer may be exposed in a series of flashes. In some situations, it may be advantageous to align the device structures on the wafer with the illumination from the laser so that, for example, an entire device die may be processed with one sweep of a line-shaped energy beam or with one flash of energy from a pulsed laser. In this case, it is important to align the device pattern on the wafer with the illuminated region. A portion of laser energy 210 may be reflected by wafer 102 as reflected light 212 (indicated by a dashed arrow). Reflected light 212 may be, for instance, measured or reflected back toward the wafer by retroreflective approaches as described in, for example, U.S. patent application Ser. No. 10/040,272 entitled SYSTEM AND PROCESS FOR HEATING SEMICONDUCTOR WAFERS BY OPTIMIZING ABSORPTION OF ELECTROMAGNETIC ENERGY (hereinafter the '272 application) which is incorporated herein by reference.

The light from laser 202 may be manipulated to form the desired beam to be incident on the wafer. For example, the beam size and shape, beam divergence, angle of incidence, plane or state of polarization, location at which the beam contacts the wafer and scanning speed may all be controlled by using optical arrangement 206. Optical arrangement 206 may include lenses, mirrors (both planar and curved), filters, beam-splitters, apertures, polarizers, compensators, half-wave or quarter-wave plates, prisms, light-pipes, optical fibers, holographic optics, gratings, and other optical components. For instance, various types of optical fiber may be used including, but not limited to, silica fibers, glass fibers, infrared transmitting fibers, polarization maintaining fibers, photonic crystal fibers, hollow core fibers, fiber bundles, waveguides and hollow light pipes. One example of a useful optical component is an optical isolator that prevents laser power from being reflected back into a laser source. Such back reflections may cause instability or even damage of the laser. In order to reduce the possibility of laser damage due to back reflections, optical components used in the system may be anti-reflection coated in order to prevent laser energy from being reflected back towards the source, or the components may be oriented in a way which directs potential back reflections on a path away from the laser source. The optical design may also be selected to minimize back reflections, for example, by avoiding normal incidence of laser radiation onto the wafer such that some power may still be back-reflected inadvertently into the processing chamber but not cause damage to the laser. The processing chamber may also include optics for collecting reflected radiation and returning it to the substrate in order to improve heating efficiency and to reduce the effect of variations in absorbed laser power. Such optics may include, for instance, plane mirrors, curved mirrors, prisms, retroreflectors, retroreflector arrays and retroreflective materials. The components within optical arrangement 206 should be carefully controlled, since it is particularly important to keep the optical characteristics of the laser beam constant during thermal processing, although the high power of the laser beam in thermal processing applications makes this task more difficult than in low-power laser applications. Optical arrangement 206 may include, for instance, a cooling fluid circulating around the optical elements contained therein to keep them clean and cool. Commonly, as shown in FIG. 3, wafer 102 is contained in process chamber 106 while laser 202 and optical arrangement 206 are separated from the process chamber by top window 124. Top window 124 may also need cooling due to heating effects from laser 202 as well as thermal energy from wafer 102 and hot-plate assembly 220. The cooling may be provided, for example, by directing a gas or liquid flow over the window. If the laser beam must pass through the cooling flow, the fluid used for cooling should not absorb a large amount of laser energy. For instance, water may be used as the cooling fluid if the heating source is a laser source with wavelength less than 1.4 µm, For longer wavelength infrared sources, for example, the cooling fluid should be a compound that does not exhibit strong absorption at the longer wavelengths, such as a compound only containing C—C and C—F bonds (e.g., a fluorocarbon compound). Also, process chamber 106 may also be cooled to provide additional heat removal.

Optical arrangement 206 and top window 124 should be designed to efficiently transmit the laser energy. For UV radiation, visible radiation, and IR radiation up to ~2.5 µm in wavelength, suitable window materials include fused silica and many other glass materials. For wavelengths between 2.5 and 3.5 µm, it is additionally useful to utilize forms with low concentrations of OH species (for example less than 1000 ppm of OH species). For wavelengths greater than ~3.5 µm, special IR-transmitting materials should be used. Suitable materials for IR-transmission include silicon, germanium, gallium arsenide, silicon carbide, AlON, sapphire, zinc sulphide, zinc selenide, calcium fluoride, magnesium fluoride, germanate glasses, IRTRAN and diamond. For instance, if a $CO_2$ laser is used as laser 202 emitting radiation near the wavelength of 10.6 µm, the use of zinc selenide, germanium, gallium arsenide or diamond is preferred for the window and for optical elements for transmitting radiation in this wavelength range. If the material included in optical arrangement 206 and/or top window 124 has a refractive index greater than ~2, it is especially advantageous to apply an anti-reflection coating thereon to prevent excessive power loss by reflection therefrom. Reflective optics, such as mirrors made from high thermal conductivity materials such as aluminum, copper, silicon, silicon carbide or beryllium, may also be useful in this context to manipulate the laser energy. Coatings may be applied to such mirrors to enhance their reflectivity in the spectral range of interest. For example, gold-coatings are known to exhibit very high reflectivity in the IR wavelength range.

Particularly in situations where the laser beam is directed at the wafer as a beam scanned over the surface of the wafer, it is important that the shape of the laser beam at the wafer surface is well defined and does not vary in an unpredictable manner. In this regard, the optical system should keep the beam size and shape substantially constant, regardless of the position of the beam on the wafer. Difficulties may arise if the wafer does not lie in a known plane, for example because the wafer support is at a slightly different height from the expected height or the wafer surface is tilted from an expected angle with respect to optical arrangement 206. Hence, the laser beam shape should be monitored by, for example, observing the light reflected or scattered from the wafer using a detector 228. The beam shape may also be characterized by scanning it over a detector element located in the plane of the wafer (not shown), although such a detector should be well protected from the high power of the laser beam. Additionally, the location of the wafer surface should be in an expected position with respect to optical arrangement 206, such that the beam size is well controlled at the wafer surface. For example, position sensor 229 may be used to sense the height of the wafer and/or the tilt of the wafer surface. In this case, information regarding the wafer height and/or tilt may be fed back to a controller 230 that adjusts the optics of the laser beam, or its position, in a manner that keeps the heating conditions at the wafer surface in a specified range. Controller 230 is connected with various components as is diagrammatically illustrated in FIG. 3.

In order to reduce such difficulties with wafer location, it is convenient to support the wafer by an apparatus which keeps the wafer flat and located in close proximity to a well-defined surface. For example, the wafer may be held on a vacuum chuck or an electrostatic chuck, or it may be levitated on a thin layer of gas. Such approaches may be combined with preheating by making the supporting structure part of a hot-plate assembly.

It is advantageous if the top layer of such a hot-plate assembly is formed of a material that is chemically pure enough to be acceptable for use in semiconductor processing applications. For example the top layer of the hot-plate assembly may be formed of $SiO_2$, $Si_3N_4$, SiC, Si, sapphire, $Al_2O_3$, aluminum nitride (AlN), aluminum oxynitride (AlON), diamond, graphite, diamond-like carbon or another pure form of carbon.

In some cases, the inclusion of a heat-transfer medium between the wafer and the preheating source may be useful for improving the coupling between the laser and the hot-plate (or other types of pre-heating arrangement). This heat-transfer medium is selected to increase the conduction of heat between the wafer and the pre-heating energy source. An example of a suitable heat-transfer medium is a high-thermal conductivity material such as indium. However, as indium may contaminate the wafer, it may be preferable to use a gas with a high thermal conductivity as the heat-transfer medium. Suitable high-thermal conductivity gases include helium, hydrogen and mixtures of such gases. Another possibility is to use a heat-transfer medium that is solid, yet deformable to conform to the shape of the wafer. For example, an elastomer or plastic material that is suitable for high temperature use, yet has an acceptable thermal conductivity, may be used. The use of such a deformable heat-transfer medium also has the benefit of accommodating stresses that may arise from clamping forces or from deformation of the wafer, for example, during the thermal processing. The hot-plate assembly may include heating elements, such as resistive heating elements, and temperature sensing elements such as thermocouples or resistance temperature detectors (RTD). The temperature sensing elements may provide feedback to a controller for optimization of the temperature setting or the uniformity of the temperature distribution across the wafer. The temperature of the wafer itself can be inferred from the hot-plate temperature or through a direct measurement with a pyrometer. The pyrometer may sample the temperature on the top surface of the wafer, or the pyrometer may be configured to detect the temperature at the bottom surface of the wafer by sampling through an aperture in the hot-plate assembly (not shown). A direct contact approach of wafer temperature measurement may also be used, for example, by bringing a temperature sensor into close proximity to the back of the wafer.

Temperature rise induced at the wafer by the laser beam may also be monitored by a pyrometer arrangement, such as top pyrometer 128 shown in FIGS. 2 and 3. Such a pyrometer arrangement, for example, may collect some of the light emitted from the region heated by the laser beam and use this measurement to deduce the temperature in the heated region. The wavelength used by the pyrometer for temperature sensing depends on the range of temperatures to be observed while determining the peak temperature with great accuracy and repeatability. For thermal processes where the peak temperature at the wafer is >1000° C., it is advantageous to use as short a wavelength as is practical, since the use of short wavelengths tends to result in reduction of measurement errors. When the high-temperature heating is performed by a laser, laser light backscattered from the wafer may be the dominant source of stray radiation. In this case, the pyrometer system should include filters to eliminate the laser wavelength, thus preventing stray radiation from reaching the pyrometer. In this regard, the pyrometer may be provided with a filter with a passband narrow enough to exclude any component of the radiation emitted by the laser source. Filters used in the pyrometer may also be designed to exhibit blocking characteristics to prevent light from outside the filters' passband from penetrating through the filters, especially for the wavelength emitted by the laser source. Such wavelength blocking may be defined using an attenuation factor, and, for the operating wavelength range of the laser, the filters should reduce the intensity by a factor of more than $10^3$, and, if possible, more than $10^6$. Two or more filters may be interposed between the sample and the detector if a single filter does not provide sufficient blocking. Detection of stray light may also be minimized by selecting a viewing direction at which the least laser radiation is scattered toward the direction of the pyrometer optics. If the wavelength used for pyrometry falls at wavelength less than ~1 μm, the addition of screens and other measures to further block stray light emitted by external light sources from reaching the pyrometer may be advantageous. Such light blocking measures may also be helpful in preventing any laser radiation leaving the chamber, thereby providing protection for personnel operating the processing apparatus.

The pyrometer arrangement may additionally be designed to exhibit a high spatial resolution, since the laser beam typically heats only a small region on the wafer, where the small region may only have a width of less than 0.5 mm in extent. Since the beam will induce a rather large lateral temperature gradient on the surface of the wafer within this small region, the pyrometer system should be capable of resolving the temperature in a region as small as 30 μm in width, and preferably as small as 3 μm in width. A very sensitive detector should be used in the pyrometer since, when sampling light from such a small region, the signal received by the pyrometer may be greatly reduced. Suitable detectors include photodiodes (e.g., Si, Ge, InGaAs types), avalanche photodiodes (e.g., Si, Ge, InGaAs), photomultipliers, CCD sensors or CMOS image sensors. Process control approaches described above in the context of the lamp system may be applied, as may the methods described in the '831 patent.

The incident position of laser energy 210 on wafer 102 may be controlled by moving the laser beam relative to the wafer. Such manipulation may involve moving the location of the laser beam by manipulating components within optical arrangement 206, which shapes the laser energy into a form that irradiates the wafer. Alternatively, the laser may be moved relative to the wafer in order to move the irradiation position on the wafer, such as described in, for example, U.S. Pat. No. 6,717,158 entitled HEATING DEVICE FOR HEATING SEMICONDUCTOR WAFERS IN THERMAL PROCESSING CHAMBERS (hereinafter, the '158 patent), which is also assigned to the assignee of the present application and is incorporated herein by reference. For example, a scanning arrangement for deflecting the beam, such as a moving or rotating mirror or an acousto-optic modulator, may be used in this regard. Also, rather than moving the direction of the laser beam, the wafer may be moved relative to a fixed laser beam. For example the wafer stage may be scanned under the laser beam while the latter remains stationary. Alternatively, both laser beam and wafer may be moved relative to each other in order to achieve the necessary range of motion for complete processing of the wafer. In this case, the speed at which the laser beam moves across the wafer may be controlled, for example, by manipulating the laser beam deflection and/or the stage movement. The location and speed of the stage movement may be determined, for instance, by an encoder or other sensing arrangement.

In a processing apparatus based on the use of lasers for providing the heat energy required for thermal processing, the challenges presented by the presence of patterns on the wafer are especially severe due to the very narrow range of wavelengths employed for the heating process. Additional problems may arise because power limitations of the laser, which generally make it necessary to scan the laser over the wafer in several scans and the scanned areas must be stitched together to achieve approximately uniform coverage.

In some cases, the thermal process may lead to a change in optical properties of the wafer and electronic devices present thereon. For example, recrystallization of an amorphous silicon surface or formation of a silicide phase changes the reflectivity of that surface. In these cases, the power coupled into the wafer surface from the laser beam is affected by these reflectivity or light-scattering changes, leading to an unpredictable and non-uniform heating pattern. The use of an energy transfer layer approach in accordance with the present invention helps to reduce such problems.

In processing apparatus 200 of FIG. 3, wafer 102 is shown as being supported on a hot-plate assembly 220, which performs the role of preheating energy source 108 as shown in FIG. 2. Hot-plate assembly 220 includes a heating element 222 as well as thermocouples 224 for detecting the temperature at various points in hot-plate assembly 220. Hot-plate assembly 220 is configured to simultaneously provide preheating of the wafer so as to reduce the power and/or energy requirement for the laser, as well as reduction of potential thermal shock of wafer 102 from exposure to energy provided from laser 202. Furthermore, hot-plate assembly 220 is additionally configured to support wafer 102. Hot-plate assembly 220 also includes a positioning mechanism 226, for controllably moving hot-plate assembly 220 with respect to optical arrangement 206, as well as a wafer position sensor 228. As shown in FIG. 3, controller 210 provides centralized regulation of the various components in processing apparatus 200 including laser power supply 203, laser controller 204, optics controller 208, top pyrometer 128, light source 140, top detector 142, gas inlet 152, gas exhaust 154, reactive species source 156, heating element 222, thermocouple 224, positioning mechanism 226 and wafer position sensor 228.

Challenges in Power Absorption Arising from Thin Film Coatings

Figure 4:
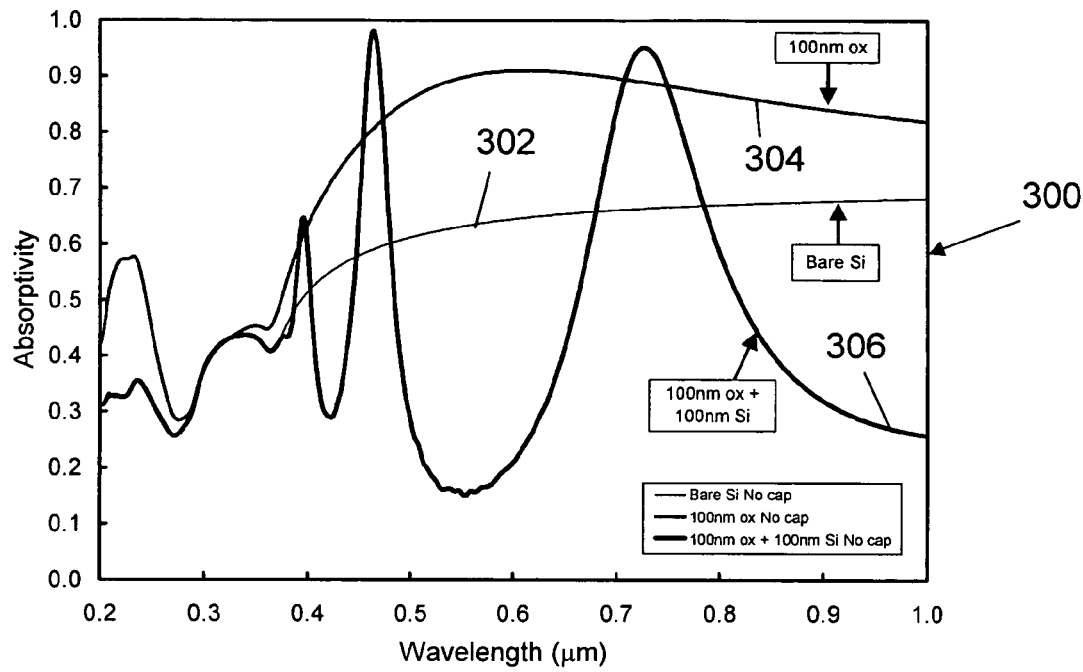
FIG. 4 is a graph showing the calculated absorptivity spectra for several thin film configurations commonly used on a semiconductor wafer.
Figure 5:
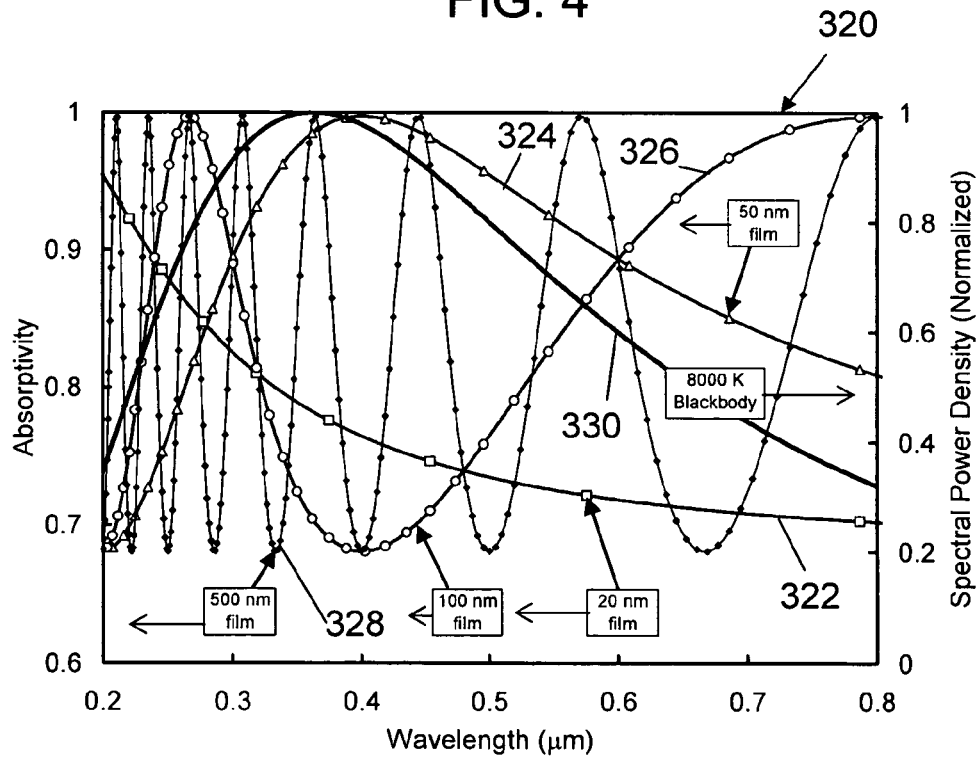
FIG. 5 is a composite graph showing the calculated absorptivity spectra for several single layer coatings on a substrate as well as the calculated, normalized spectral power density for a blackbody at 8000K.
Figure 6:
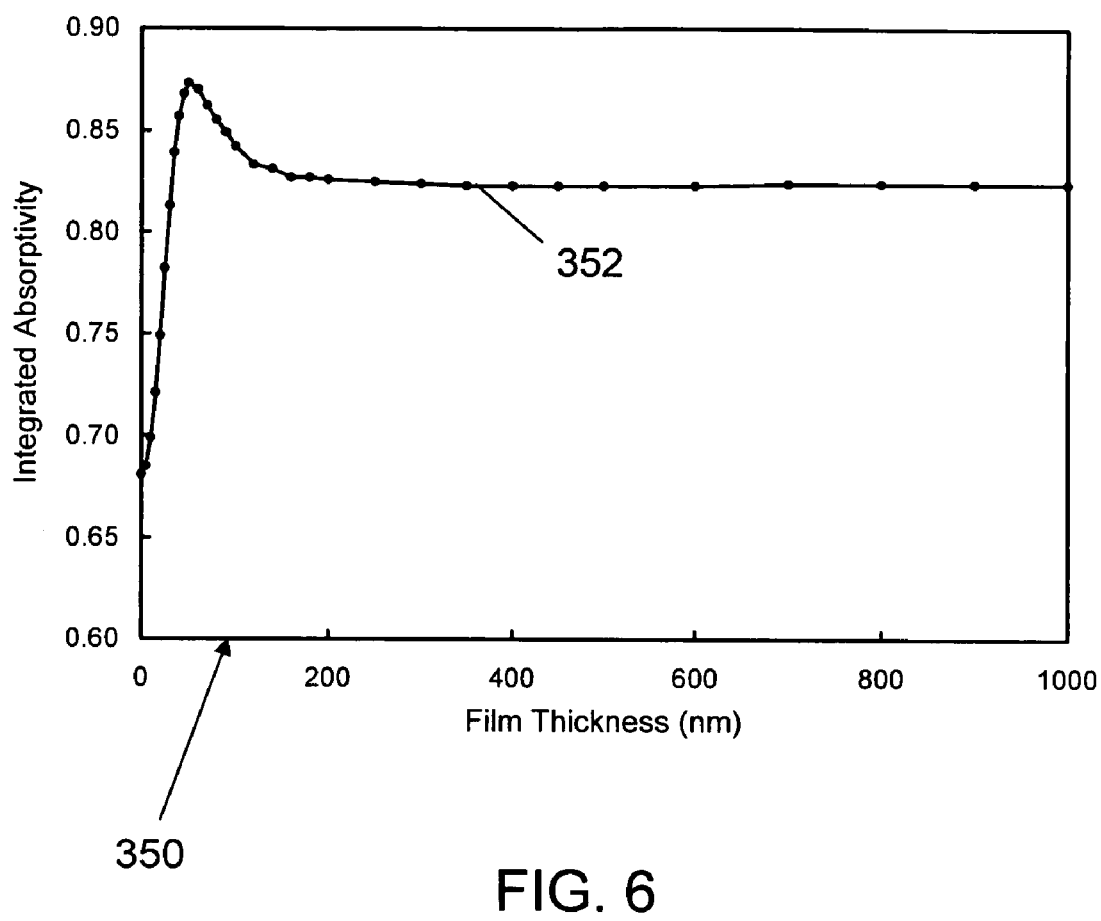
FIG. 6 is a graph showing the calculated variation in the integrated absorptivity for a single layer coating on a substrate at a variety of film thicknesses.

Referring now to FIGS. 4-6, the main challenges in controlling the absorption of energy at the wafer surface are illustrated.

In FIG. 4, a graph 300 includes three absorptivity spectra for several thin film configurations commonly used on a semiconductor wafer. These absorptivity spectra have been calculated for a wavelength interval between 0.20 to 1.00 µm based on known equations discussed previously. Spectrum A, referred to using reference numeral 302, corresponds to the absorptivity spectrum for a bare silicon surface. Spectrum B, referred to using reference numeral 304, is the absorptivity spectrum for a silicon surface coated with a 100 nm-thick film of silicon dioxide. Finally, spectrum C, referred to by reference numeral 306, is the absorptivity spectrum for a silicon surface coated with 100 nm of silicon dioxide covered by an additional 100 nm-thick layer of silicon. As may be observed by comparing spectra A-C, different thin film coatings produce large changes in the absorption characteristics of the wafer surface. Although graph 300 includes only wavelengths from 0.20 µm to 1.00 µm, it is recognized that differences in thin film coatings may have a significant impact on power absorption throughout the electromagnetic spectrum. Therefore, if the surfaces with thin films deposited thereon are heated with any given wavelength of radiation, then further differences will arise, depending on the nature of the film and the choice of the wavelength incident on the surfaces.

In FIG. 5, a graph 320 shows the calculated absorptivity spectra for several single layer coatings on a substrate. The calculations used to generate FIG. 5 assume the substrate has a refractive index, $n_s$=3.6, which is similar to the refractive index value of silicon in the near IR wavelength range, and the one layer film is assumed to have a refractive index of 2.0, which is similar to that of silicon nitride. The film thicknesses considered were 20, 50, 100 and 500 nm, corresponding to spectrum A (322), spectrum B (324), spectrum C (326) and spectrum D (328), respectively. For the thicker films, a clear oscillatory pattern is seen in the absorptivity spectra arising from thin-film interference effects (e.g., as apparent in spectra C and D). Such oscillatory patterns are usually observed when a thin-film coating is at least partially transparent in the wavelength range considered. It is known that certain film thicknesses produce an optical path length through the film that leads to a constructive interference effect, thereby causing a maximum in the intensity of reflected light, whereas other thickness values produce destructive interference that minimizes the intensity of the reflected light at particular wavelengths. Severe variations in reflectivity (and thereby absorptivity) arise from such interference effects in films that are at least partly transparent.

Thin film coatings also influence the integrated absorptivity of the surface, which describes how much energy is absorbed from a radiant energy source emitting a spectrum of radiation. FIG. 5 further includes a normalized spectral power density spectrum 330 from a black-body heat source at a temperature of 8000 K in the wavelength range of 0.2 to 0.8 µm. Spectrum 330 resembles the known emission spectrum from high-power flash-lamps.

The total absorptivity for energy from a source exhibiting characteristics of normalized spectral power density spectrum 330 may be calculated using Equation (7) discussed previously. A graph 350 in FIG. 6 illustrates the variation in the integrated absorptivity with film thickness for films such as those considered in FIG. 5. The integrated absorptivity (shown as curve 352) was calculated for a surface with a thin film coating having a refractive index of 2.0 over a substrate having a refractive index 3.6 at normal incidence of input energy. The input energy is assumed to originate from an 8000 K blackbody radiation spectrum between wavelengths of 0.2 and 3 µm. Graph 350 shows that, although the variation in integrated absorptivity is reduced by the effect of averaging the spectral absorptivity over a finite range of wavelengths, there is still some significant variation in the integrated absorptivity with film thickness, particularly at thicknesses up to ~100 nm. Such variation in absorptivity in thin films deposited on substrates lead to non-uniformity in thermal processing across a wafer surface.

Possible Solutions for Improved Control Over Energy Absorption

Processing difficulties due to variation in energy absorption across the wafer may be addressed in various ways. For example, the illumination conditions may be selected to optimize energy absorption at the illumination wavelength to reduce the variation of absorbed energy. As another example, factors such as illumination wavelength, angle-of-incidence and plane of polarization may be optimized, as outlined in commonly owned U.S. patent application Ser. No. 09/747,522 entitled HEATING CONFIGURATION FOR USE IN THERMAL PROCESSING CHAMBERS (hereinafter the '522 application) which is incorporated herein by reference, and the above incorporated '272 application. The use of multiple wavelengths may also reduce the severity of effects due to thin film interference or diffraction which are present when a single wavelength is used for illumination, such as described in the '522 application. For example, the use of a lamp as the energy source may be advantageous over the use of energy from a laser since a lamp provides a broad spectrum of wavelengths, thus mitigating the thin film and diffraction effects that may arise at any single wavelength.

Another approach that may be useful in reducing the magnitude of the temperature non-uniformities across the wafer surface that may arise from power absorption differential is to reduce the magnitude of the temperature rise required for the process. For example, the wafer may be preheated such that the temperature rise that needs to be induced by the energy source can be reduced. By using reduced powers, the differences in energy absorption are also reduced and, consequently, the temperature non-uniformities are reduced. This approach may be especially effective in combination with the methods of the above incorporated '831 patent as well as U.S. Pat. No. 6,594,446 entitled HEAT-TREATING METHODS AND SYSTEMS (hereinafter, the '446 patent), which is incorporated by reference and is commonly owned with the '447 application. However, it is noted that not all thermal processes allow the use of preheating to high temperatures.

As another approach, the wafer to be processed may be characterized before processing such that the energy absorption at each region is known ahead of processing and may be taken into account when delivering energy to the wafer to perform the desired thermal process. The characterization of the wafer may be performed, for example, by measurement of the reflectivity or scattering qualities of the wafer surface, such as described in U.S. Pat. No. 5,841,110 entitled METHOD AND APPARATUS FOR IMPROVED TEMPERATURE CONTROL IN RAPID THERMAL PROCESSING (RTP) SYSTEMS (hereinafter, the '110 patent) which is incorporated by reference. Then, the methods described in the above incorporated '831 patent may be used to optimize the distribution of the energy delivered to the wafer surface. Alternatively, the wafer may be characterized based on a description of the physical structures on the wafer to calculate the optical properties of the wafer through a modeling procedure. Such calculations may be based on the laws of electromagnetism, e.g. Maxwell's equations, to predict the optical response of the wafer for any given wavelength, angle of incidence and plane of polarization for the incident radiation. The calculation result predicts the energy absorption of the wafer as well as the resulting temperature rise. For an even greater degree of sophistication, the heat transfer in the wafer structures after absorption of the energy may be calculated and, hence, the temperature distribution across the wafer may be predicted.

Such modeling and/or measurement results may be used in various ways. For example, they may be used to optimize the design of the structures on the wafer to allow uniform absorption of the energy or any other desired physical consequence. However, the design of electronic devices is usually driven by the needs of the device and circuit characteristics, and modifications thereof are often highly undesirable.

An alternative approach is to use the understanding of the optical properties of the wafer to optimize the illumination, either by methods mentioned above or by spatially varying the energy delivery across the wafer. For instance, a special masking layer or a mask physically separated from the wafer may be used to control the intensity distribution incident on the wafer in a manner that leads to uniform absorption of energy across the wafer. This mask may be formed of regions that are transparent to the incident radiation and other regions that reflect, scatter or absorb radiation from the energy source, thus preventing the energy from reaching the wafer or attenuating the energy intensity as desired so as to form an optimized illumination profile at the wafer surface. The mask approach may be far less expensive than those typically used in lithography for semiconductor device fabrication because the features only need to be formed at a length scale that matches the length scale of the temperature non-uniformities expected in the substrate. The length scale of thermal non-uniformity depends on the diffusion of heat within the substrate, and it is typically larger when the thermal process is longer and there is more time for the diffusion of heat to equalize temperatures. For example, for thermal processing using the conventional rapid thermal processing approach where the thermal exposure time is greater than ~1 second (e.g., approaches based on W-halogen lamps), the length scales of non-uniformity are typically greater than ~10 mm. In contrast, for advanced annealing approaches based on flash-lamps or scanned laser beams, the exposure time is typically only ~1 ms, hence temperature non-uniformities may arise over much shorter length scales (e.g., ~10 µm). For pulsed-laser processing, where the heating pulse lasts less than 1 µs, non-uniformity can arise over very short length scales of less than 1 µm. The mask for any given type of processing may be designed so that its features are matched in length scale to the thermal non-uniformity expected. However, approaches relying on masks are somewhat complex and may be expensive if a special mask has to be designed and built for each wafer. The mask must also survive exposure to large energy fluxes, and potentially to high temperatures unless it is actively cooled.

An alternative to the mask approach is to modify the characteristics of the light source itself to define the spatial distribution of the energy absorbed at the wafer. For example, with a scanning laser system, the power delivery to any point on the wafer may be modulated such that the power absorption across the wafer is equalized. The scan speed or the spot size or shape may also be modulated to achieve a desired power absorption distribution across the wafer. Such methods may also be applied in real-time through sensing of the power reflected, scattered or absorbed by the wafer. For example, the methods disclosed in the aforementioned '831 patent and as well as the '400 and '447 applications may be used to perform the sensing and are particularly advantageous when a surface layer is used, as will be described immediately hereinafter.

Use of Energy Transfer Layers to Improve Energy Absorption Characteristics

One relatively straightforward concept for improving the uniformity of processing is through the use of an energy transfer layer in accordance with the present invention.

In a broad sense of the present invention, the energy transfer layer as an absorber layer is a structure formed on a wafer surface that assists in the absorption at the wafer of energy from an energy source. Such an energy transfer layer may be applied, for example, across the entire surface of the semiconductor wafer such that energy absorption at all points on the wafer is substantially equalized. The energy transfer layer also helps to reduce the effects from differences in other physical properties that may be relevant. Energy transfer layers may improve the uniformity of processing and, in some applications, may increase the flexibility of processing parameters, such as the range of energies that may be applied while achieving successful processing. An energy transfer layer may also be applied selectively to regions of the wafer to even out the absorption characteristics as needed. The design of such a patterned energy transfer may be performed through the modeling approach outlined above, or the pattern may be determined through experimental evaluation of process results or measurements of the thermal response of the wafer.

As a variation, optimization of the distribution of power absorption across the wafer surface may also be achieved by the use of coatings that reflect radiation to varying degrees. Typically, a reflector layer is considered as having a relatively high reflectivity (e.g. >0.5). However, reflectivity is merely one characteristic of a material and, in general, many surfaces will absorb some radiation while reflecting some radiation. Therefore, reflector layers and even anti-reflection coatings may be considered as merely alternative formulations of an energy transfer layer with an emphasis on the reflection characteristics. A patterned reflector layer may protect sensitive regions of the device from being processed incorrectly, thereby aiding in the achievement of optimal wafer processing. However, the use of materials with higher reflectivities typically increases the energy requirements on the heating energy source, hence the use of an energy transfer layer with a relatively low reflectivity is often preferred. It is understood that an energy transfer layer in the context of the present invention includes any type of structure that modifies or enhances the energy coupling characteristics, regardless of whether its efficacy arises through changes in the energy absorption, reflection or other optical, thermal or physical characteristics of the wafer.

Candidate Structures for Energy Transfer Layers Acting as Means for Improving Energy Coupling Referring now to FIGS. 7A-7M in conjunction with FIG. 1, various embodiments of the energy transfer layer acting as an absorber layer are illustrated. Energy transfer layers may be applied to the wafer to assist the heating process in various ways. FIGS. 7A-7M illustrate a variety of configurations for integrating energy transfer layers into the device manufacturing process, while FIG. 1 shows an example of part of the surface of a semiconductor wafer including various structures that may affect the absorption of energy from the energy source used for thermal processing. The features on the semiconductor wafer may include trenches, which may be filled with various materials. The semiconductor wafer may also include thin-film coatings, which may be patterned into lines or other geometric features that define the device structures.

Figure 7A:
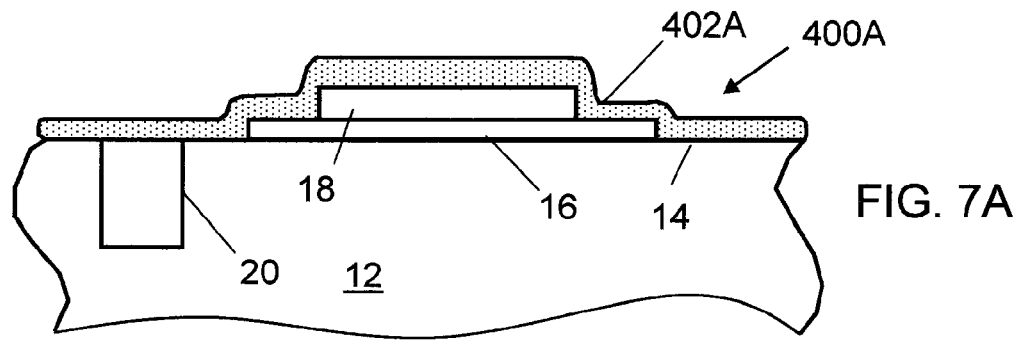
FIGS. 7A-7M are diagrammatic fragmentary illustrations, in partial cut-away view, of a variety of energy transfer layer configurations for use with a semiconductor device, such as that shown in FIG. 1.

FIG. 7A shows one approach for adding a layer that enhances the absorption of energy from the energy source used for thermal processing. To a structure, generally indicated by a reference number A, formed on wafer 12, an energy transfer layer 402A is applied across the whole surface of the area to be thermally processed.

Figure 7B:
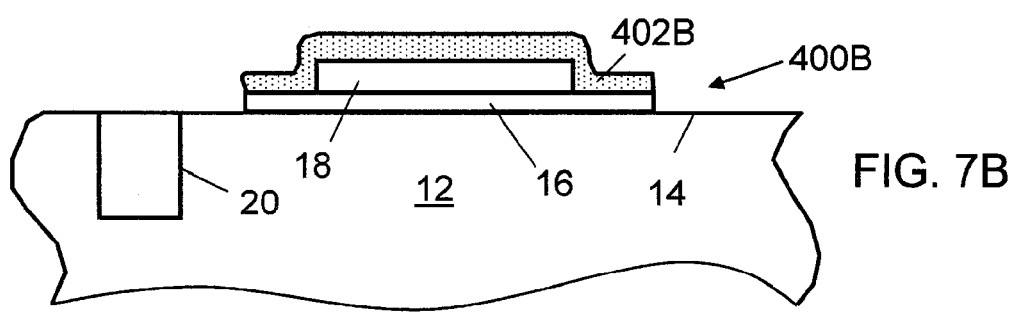

FIG. 7B shows an example where an energy transfer layer 402B is only applied on a selected region of the wafer, such as over device layers 16 and 18 on wafer 12. Such an approach may be use to selectively control the energy absorption at certain regions on the wafer. This approach may be useful, for example, within the device structure itself or for protection of specific areas on the wafer. Additionally, such selective coatings may be applied to certain regions of the wafer that are optically different from the dice on the wafer such as, for example, un-patterned areas near the edge of the wafer, scribe lanes between dice on a wafer or test areas on the wafer. Alternatively, coatings may also be applied to the die and not on the wafer features themselves. The coating may also be applied to regions within a die that have different densities of devices and, consequently, different optical properties. In the embodiment shown in FIG. 7B, energy transfer layer 402B may be patterned using the same masks used to pattern the device structures to be coated.

A patterned absorber or reflector, such as energy transfer layer 402B of FIG. 7B, may be applied near the edges of the wafer, or even on the edges of the wafer itself. This approach may be useful, for instance, if the energy source used for the thermal processing tends to provide an excess amount of energy at regions near the edge of the wafer. For example, such problems of excess energy at the wafer edges may arise in scanned laser processing because heat tends to diffuse in the scan direction in this mode of heating, at least to some extent. Since the wafer edge presents an insulating boundary condition for this lateral heat flow, large temperature rises may occur at the wafer edge as the laser beam approaches, for example, within 1 to 3 mm from the edge. This effect may be compensated by not scanning the energy source all the way to the edge of the wafer, but this approach is inconvenient, particularly if a line-shaped beam is employed. The edge effect may also be reduced by scanning with a relatively high scan velocity (e.g., greater than 10 cm/s or, more preferably, greater than 30 cm/s). However, the laser beam power requirements are greatly increased in this case, thereby typically limiting the size of the region that may be scanned in any one scan and leading to problems with processing throughput and uniformity. It may also be possible to shield the edge of the wafer from the radiation with an external shield imposed between the laser and the wafer, but this shield may be difficult to align and may also be damaged during the thermal processing or through repeated use. The absorber layer concept of the present invention may be applied to patterning the edge area with a reflective or less absorbing coating in order to shield the edge of the wafer without the difficulties encountered by the faster scanning approach or the external shield concept. Moreover, in the laser scanning approach, the region of the wafer at which the scan is commenced may not be heated to a sufficient temperature because the lateral heat diffusion phenomenon has not had time to "preheat" the region where the scanned laser beam initially impinges on the wafer surface. In this case, it may be advantageous to pattern this region of the wafer with a more strongly absorbing coating such that the under-heating effect can be mitigated. In these ways, the deployment of a patterned absorber layer as shown in FIG. 7B may help improve the thermal processing uniformity across the wafer.

Figure 7C:
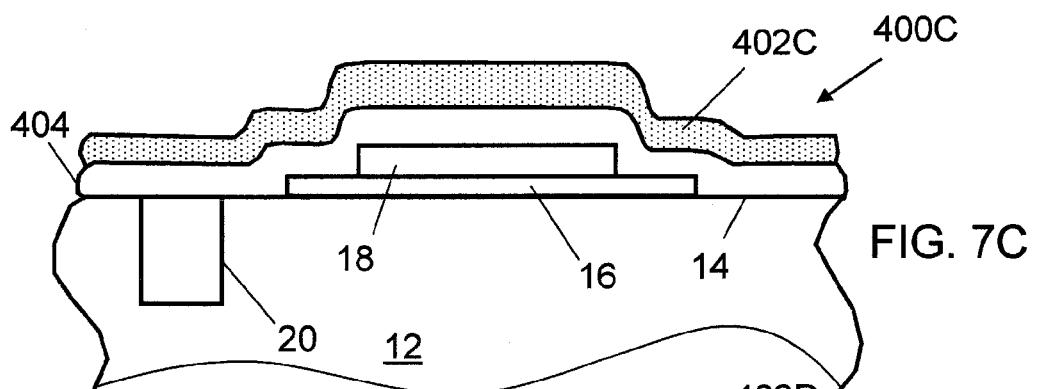

FIG. 7C shows another embodiment in which the energy transfer layer is disposed on top of a barrier film that separates the energy transfer layer from the surface of the device structures. Semiconductor device 400C includes an energy transfer layer 402C disposed on top of a barrier layer 404, which is in turn deposited on device layers 16 and 18 on the wafer.

Barrier layer 404 may serve several purposes. For example, the barrier film may prevent the diffusion of undesirable impurities from the energy transfer layer into the electronic device structures. Such impurities include metal species (e.g., transition metals such as Fe, Cr, Ni and Cu, noble metals such as Au, Ag, or other troublesome species such as Na and K). Other undesirable impurities may also include dopant species such as B, P, As, Sb, In, which may change the doping characteristics of regions contaminated by these impurities. Other non-metallic contaminants may also need to be controlled. Therefore, barrier layer 404 should be made of a material that acts as a good diffusion barrier for such undesirable impurities. For instance, the diffusion coefficient for such impurities should be relatively small in the barrier layer. In particular, the diffusion should be minimized throughout the high-temperature heating cycle used for thermal processing.

The diffusion coefficient of an impurity $D_{imp}(T)$ is usually strongly dependent on the temperature T. For a thermal process performed at a temperature $T_{proc}$, for a time $t_{proc}$, for example, the impurity will typically diffuse through a distance $x_{imp} \sim (D_{imp}(T)t_{proc})^{0.5}$. Hence the barrier film thickness, $x_{barr}$ should be selected to be greater than this distance and, ideally, $x_{barr} > 3x_{imp}$. When the temperature cycle varies throughout the heating cycle, the total diffusion length of impurities may be estimated by integrating the rate of diffusion throughout the complete heating cycle to obtain a total diffusion length.

Various materials may serve as diffusion barriers, and their selection generally depends on a variety of factors such as the process temperature, the processing ambient, the nature of the energy transfer layer and the nature of the electronic device structures. Typically, the barrier layer should be chemically stable at the processing temperature and it should not significantly react with the electronic device structures or with the energy transfer layer. In many cases, the diffusion barrier should not possess a polycrystalline structure containing grain boundaries since diffusion along grain boundaries is often far faster than diffusion through the bulk of a material. Therefore, a material in an amorphous state or in a single crystal state is generally preferred for use as the diffusion barrier. If the material does contain grain boundaries, it may be possible to alleviate the problem of fast diffusion along grain boundaries by "stuffing" the grain boundary areas with a species that may occupy these regions and thereby impede the progress of the undesired impurity through the grain boundary region.

Suitable materials for use as the barrier layer include, but are not limited to, silicon dioxide, silicon nitride, silicon oxynitride, silicon carbide, carbon, carbon nitride, boron nitride, titanium nitride, tantalum nitride, tantalum silicon nitride, zirconium nitride, hafnium nitride and tungsten nitride. Other metal nitrides, carbides, borides, phosphides, oxides and silicides may also be useful. Other metals and alloys such as W, Ti, Ta, TiW, may also be used, depending on the thermal processing requirements. These materials may be used to form the barrier layer by, for instance, conventional deposition approaches. Grain boundary stuffing for polycrystalline materials may be performed by exposing the barrier material to nitrogen or oxygen at elevated temperatures.

Barrier layers should be free of microscopic flaws, cracks, pin-holes or other features that may weaken their barrier qualities. Barrier layers should also adhere well to the substrate such that they maintain their integrity throughout the thermal process. The barrier films should not be so thick that they may impede the transfer of heat from the energy transfer layer to the device structure, although such thermal characteristics may be optimized as necessary. Thick layers may also introduce undesirable stresses in the wafer, although such stresses might be employed to assist in the control of stress distributions during processing. For example, if the thermal processing itself produces stresses in the wafer resulting from a thermal gradient through the thickness of the substrate, the use of thick barrier layers may balance the stresses in the wafer. If the energy transfer layer is not completely opaque to the heating energy, the optical characteristics of the barrier film should be included when optimizing the design of the energy transfer layer structure.

The barrier film may also serve to prevent chemical reaction between components of the energy transfer layer and the device structure. In particular, the barrier (and/or the energy transfer layer itself) should not react with silicon, silicon dioxide or silicon nitride. Since, SiGe alloys or Ge may also be present in advanced device structures, the energy transfer and/or barrier film should not react with these materials. Various materials such as silicon dioxide, silicon nitride, silicon oxynitride and silicon carbide are quite stable on silicon, so they may also serve as "reaction barriers".

Still referring to FIG. 7C, the barrier layer may also aid in simplifying the process used for removing the energy transfer layer from the wafer after processing. This removal process is often necessary if the energy transfer layer is not desired as a part of the structure of the completed electronic device. The energy transfer generally must be removed through an etching process. It is important that the etching process may be performed reasonably quickly but does not damage the device structures. Accordingly, the end-point of the etching process should be carefully controlled. In certain cases, the energy transfer layer may be removed from the device by an etching process that is selective to only the energy transfer layer and does not damage silicon, silicon dioxide or other materials present in the device structure. However, some etching processes will attack these materials in the device structure. In such cases, it may be useful to use the barrier layer as an "etch-stop" layer. The etch-stop, barrier layer is designed such that it is only attacked very slowly by the etching process used to remove the energy transfer layer. In this way, the process of removing the energy transfer layer may be achieved quickly and efficiently while the device structures may remain protected below the barrier layer functioning as the etch-stop layer. The etch-stop, barrier layer thickness may be selected to provide adequate process margin such that the etch-stop, barrier layer is not damaged by the etching process used to remove the layers above the etch-stop. A typical etch-stop, barrier layer is between 1 and 100 nm thick. In order to minimize the required thickness of the etch-stop, barrier layer, the etching process should be designed to attack the etch-stop, barrier layer at a rate that is significantly slower than that for the layers thereon. For example, the rate of attack of the etch-stop, barrier layer may be selected to be less than half of that for the layers on top of the etch-top, barrier layer.

In the present configuration, the etch-stop, barrier layer itself may either be incorporated in the final device structure, or it may be removed in a separate etching process. If the etch-stop, barrier is to be removed in an etching process, the etching process and the etch-stop layer should be configured such that the etch-stop, barrier layer may be removed without causing damage to the device structures. Suitable materials for use as the etch-stop, layer may include, but are not limited to, silicon dioxide, silicon nitride, silicon oxynitride, germanium oxide, hafnium oxide, hafnium silicate, zirconium oxide, zirconium silicate, titanium oxide, titanium nitride, tantalum oxide, tantalum nitride, silicon carbide, silicon, carbon, SiGe alloys and Ge. Although some of these materials may also be present in the device structure, it may still be useful to employ them for an etch-stop approach in certain cases. For example, the materials in the etch-stop, barrier structure may provide extra thickness of material that may be removed in a carefully controlled, etching process known to remove a given amount of that material in a certain amount of time.

The etch-stop, barrier layer may also be designed to have a structure that facilitates its removal. For example, the etch-stop, barrier layer may be doped with impurities that enhance its etch rate relative to the device structure to be preserved, such as when semiconductor materials are used as the etch-stop, barrier layer, they may be doped in a manner that affects the etch rate of the layer. Alternatively the etch-stop, barrier layer may be formed in a less dense form that has a higher etch rate than the device structures on the wafer. For instance, silicon dioxide formed by CVD usually has a higher etch rate than thermally grown silicon dioxide, when etched in a solution that contains HF. The etch-stop, barrier layer may also be designed to possess a microstructure which is more amenable to etching. For example, a silicon film can be deposited in an amorphous or polycrystalline form, which often etches significantly faster than the single crystal silicon used in the device structure. Furthermore, the grain size of polycrystalline silicon may be controlled to optimize the etch rate of the etch-stop, barrier layer through adjustments of the conditions under which the layer is deposited.

Figure 7D:
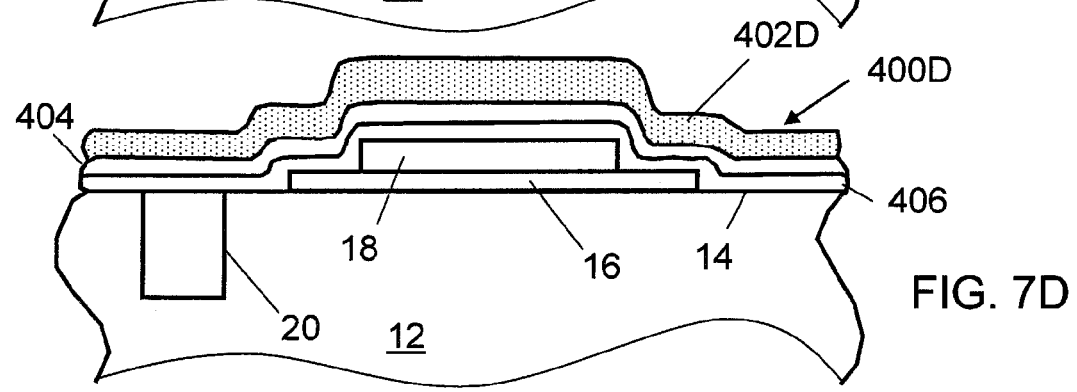

While the barrier layer may perform multiple functions as discussed above, it may be advantageous in certain cases to utilize separate layers for the various functions, as desired. Referring now to FIG. 7D, a configuration featuring separate etch-stop and barrier layers is described. FIG. 7D shows a semiconductor device 400D including a separate, etch-stop layer 406 between device layers 16 and 18 and barrier layer 404 such that two layers are present below energy transfer layer 402D. In this case, the first film in contact with the device structures on the wafer is etch-stop layer 406 that allows selective removal of barrier layer 404 and energy transfer layer 402D through suitable etching processes. Barrier layer 404 may act as a diffusion barrier to prevent contaminants from the energy transfer from reaching the device layers.

Figure 7E:
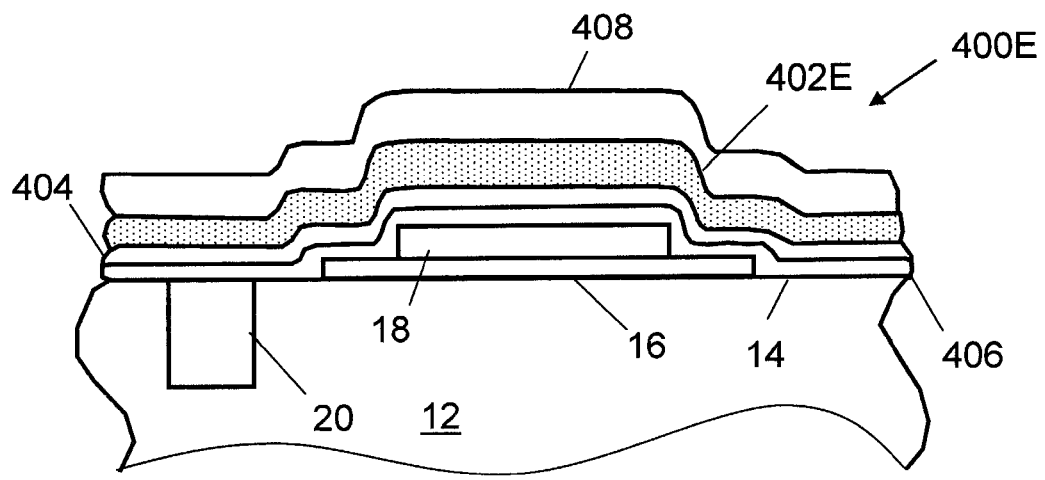

Referring now to FIG. 7E, this figure illustrates a configuration in which an additional layer is formed above the energy transfer layer. Semiconductor device 400E includes the separate, barrier layer and etch stop layer configuration of FIG. 7D, but further includes a capping layer on top of energy transfer layer 402E. This capping layer may serve various purposes in the processing of the structure. For example, capping layer 408 may function as a diffusion barrier for preventing outgassing of contaminant species from the energy transfer layer.

Outgassing of contaminant species from the energy transfer layer may be problematic in certain cases since this effect may contaminate the thermal processing equipment. Particularly, if the impurities have an appreciable vapor pressure at the process temperature, then outgassing is likely to occur. Such contamination may move through the processing ambient and attach itself to other regions of the wafer or to the walls of the processing equipment, and then may later become a contamination source for other wafers being processed in the equipment. The outgassing problem may be minimized by selecting energy transfer layers that do not contain significant concentrations of harmful impurities, but such material selection is not always possible.

A capping layer applied to the surface of the energy transfer layer may help to suppress such contamination problems by preventing the impurities from reaching the process ambient or other regions of the device. Capping layer 408 may share similar characteristics as those discussed for the barrier film above. Capping layer 408 should be designed to be a good diffusion barrier for the impurities so as to prevent the impurities from leaving the energy transfer layer in significant concentrations. However, there is some extra flexibility in selection of materials and thickness for the capping layer in comparison to the barrier layer. For instance, since capping layer 408 is physically separated from device layers 16 and 18, the capping layer does not necessarily have to be chemically inert with respect to those structures. Furthermore, if a material which is transparent to the heating energy is selected for use in the capping layer, the capping layer may be made fairly thick while not impeding the transfer of heat from the energy transfer layer to the device structures. A thicker capping layer may be more effective in suppressing the outgassing problem.

In some cases, capping layer 408 may itself be designed to optimize the absorption of energy. For example, if the capping layer is fairly thick yet transparent to the heating energy, the capping layer itself will tend to introduce the oscillatory pattern of absorptivity that may compensate for variations in absorptivity that may arise from interference effects in thin films used in the device structures on the wafer. The capping layer may also serve as part of an anti-reflection (AR) coating over the absorbing layer. For instance, a 50 nm silicon nitride layer over a silicon energy transfer layer may simultaneously serve as a capping layer and an anti-reflection coating. This phenomenon may be particularly useful, for example, if the silicon is heavily doped with a dopant species such as B, As, P or Sb to enhance its absorption characteristics.

The energy transfer layer, the barrier layer, the etch-stop layer, the capping layer or additional layers may also serve to accommodate stress that may arise either during deposition or processing. For example, if the energy transfer layer is in a stressed state, or if it has a coefficient of thermal expansion (CTE) that does not match those of the layers below it (e.g., the device layers and/or the wafer substrate), then large stresses may arise in that may damage the entire structure. Such damage may arise in the energy transfer layer, for instance, such that it ruptures, peels off or otherwise physically disintegrates. Similar phenomena may arise in the barrier layer or etch stop layer. Damage may also arise in the wafer substrate such that defects may be introduced or the wafer may warp or even crack.

One approach for minimizing the stress effects is to select materials for the various layers that have matched CTE values, but this selection limits the materials that may be utilized in the various layers. Alternatively, the layers between the energy transfer layer and the substrate layer may be designed to provide favorable stress distributions in the energy transfer and/or the device layer or substrate during processing. For example, if a material in the energy transfer layer structures, the device layer or the substrate is known to be stronger in compression than it is in tension, then the materials and film thicknesses of the stack of films associated with the energy transfer layer structures may be chosen to ensure stresses are generally applied in the stronger direction than in the weaker direction. Another approach is to select the CTE of the materials disposed between the energy transfer layer and the substrate to be intermediate between that of the substrate and that of the energy transfer layer. This approach reduces the thermal stress induced by differential expansion in the stack of materials. In some cases, one or more of the various layers may be formed of materials that are elastic and deform easily, such that they may accommodate large strains without becoming excessively stressed. For example, the layers may be designed to deform plastically in order to accommodate the stress. In other cases, the materials forming one or more of the layers may be configured to flow during the process, thereby accommodating potential surface deformation. Materials such as doped silica glasses may be useful in this context. Additionally, it may be advantageous in the aforedescribed situations to preheat the wafer to a temperature that is high enough to allow these materials forming the various layers to deform easily or to flow as required, before applying the higher energy pulsed surface heating.

Figure 7F:
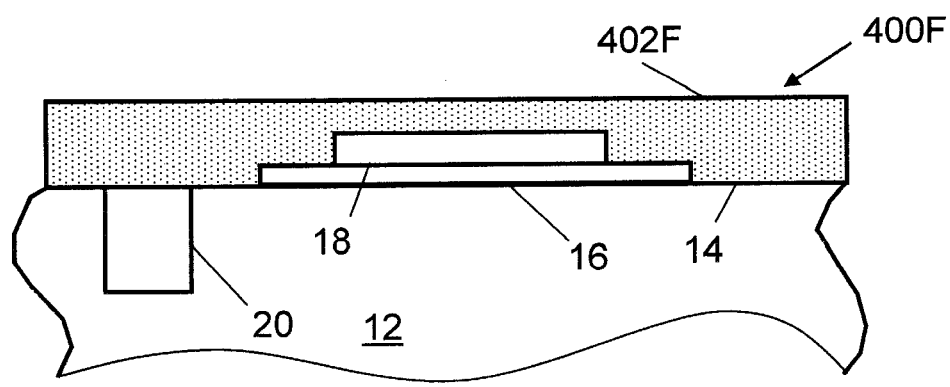

FIG. 7F illustrates an example where the device structure has been topped with an energy transfer layer whose surface has been planarized. A semiconductor device 400F includes a fairly thick energy transfer layer 402F configured such that height variation due to the different device layers and trenches is planarized. The use of a planarized, energy transfer layer as an absorber may present advantages because variations in the surface texture can, in and of themselves, introduce variations in the absorptivity at the wafer due to the influence of the device texture or roughness on the reflectivity and absorptivity of surfaces. Hence, even if the wafer surface consists of only one opaque material, the absorptivity can still vary if the surface texture varies. For example, the energy transfer layer coating shown in FIG. 7A acquires a surface texture because it has been deposited as a conformal layer on top of device layers 16 and 18. A conformal coating displays a substantially uniform film thickness regardless of the nature of the features below it, and hence the resulting coating tends to follow the features and topography of the devices on which the coating is deposited. Although such an energy transfer layer may be opaque and aid in optimizing the uniformity of the energy absorption across the wafer surface, variations in the surface topography will leave some residual variation in absorptivity. Furthermore, if a wafer is covered with patterned geometric features, such as lines in arrays of varying density, the variations in density of the geometric features may cause variations in absorbed power density. The use of an energy transfer layer with a planarized surface, as shown in FIG. 7F, may be advantageous since energy transfer layer 402F remains opaque and presents a smooth surface to the incident energy, thereby helping to make energy absorption uniform across the wafer surface.

Figure 7G:
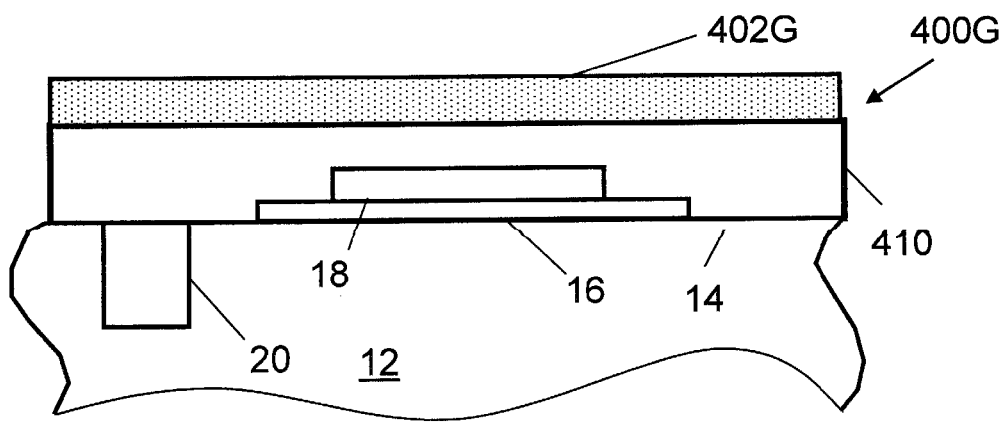

The planarization process may be applied to any layer in the stack of materials used to enhance the energy absorption characteristics shown in FIGS. 7A-7F. In general, it may be particularly advantageous if at least the upper surface of the energy transfer layer is planar in order to prevent any effects of non-planar features from affecting the absorption. This objective may be achieved by planarizing the energy transfer layer, as shown in FIG. 7F, or, alternatively, a layer below the energy transfer layer, such as a barrier layer, may be planarized as illustrated in FIG. 7G in order to achieve a similar effect. In the embodiment shown in FIG. 7G, a semiconductor device 400G includes a planarized barrier layer 410 deposited on top of wafer 12 and device layers 16 and 18. Energy transfer layer 402G is deposited on top of planarized barrier layer 410 such that both the upper and lower surfaces of the energy transfer layer are planar. This approach may be more convenient in some circumstances, because a particular planarization approach might be easier to implement on another material, or it may be very difficult to implement on the energy transfer layer itself due to its physical or chemical properties. If necessary, a separate layer can be specially introduced to facilitate such a planarization step.

Various methods of layer planarization may be used. For example, a polishing process could be used to planarize the surface, such as conventional chemo-mechanical polishing (CMP). Alternatively, the material may be deposited by a method that tends to result in a planar surface. For example, the layer material may be applied through a spin-on process, which typically leaves a planar surface. Particular materials that may be applied with spin-on processing include, but are not limited to, photoresist, polymers and spin-on glasses. The surface of a given layer may also be planarized by a gap-fill method or by a reflow method. For instance, a material that flows when exposed to heat may be deposited, and then a heating process may be applied in a manner that causes the material to flow into a smoother surface. Alternatively, a material may be selectively deposited or etched in a manner that leads to a smoother surface. For example, a layer that is easily formed in a planar form by a spin-on process may be applied to the wafer, and then a polishing or etching step may be used to erode this planar surface. Once the original non-planar surface becomes exposed, this surface will begin to erode as well as the spin-on layer. If the rates of erosion for the spin-on layer and for the original surface are similar, the erosion process will tend to also planarize the original surface. The spin-on layer may then be removed if desired, or it may be left behind to some degree.

Although so far the benefits of a planar surface for the use of an opaque energy transfer layer have been emphasized, there may also be some benefits in planarizing or controlling the texture of a transparent sub-layer included in an overall energy transfer layer structure, for example, including a transparent layer formed above a layer of absorbing material (e.g., a transparent layer used as a capping layer). For instance, if the texture of the upper surface of such a layer is not identical to that of its lower surface, this layer will have a film thickness that varies with position across the wafer. The variable thickness will tend to suppress potential interference effects within this film such that the layer exhibits qualities of a rougher film, thereby smoothing out the reflection spectrum of the wafer and making the absorption of energy less sensitive to the nature of the device structures on the wafer. One approach for making the surface textures of the upper and lower surfaces of a deposited film different is to deposit a film with a planar upper surface or to planarize the film after deposition.

Surface textures, other than planarization, may also be produced in the film. For example, effects such as surface textures that are developed on the upper surface either during or after the deposition process may be advantageous in certain cases, as will be discussed in further detail immediately hereinafter.

Figure 7H:
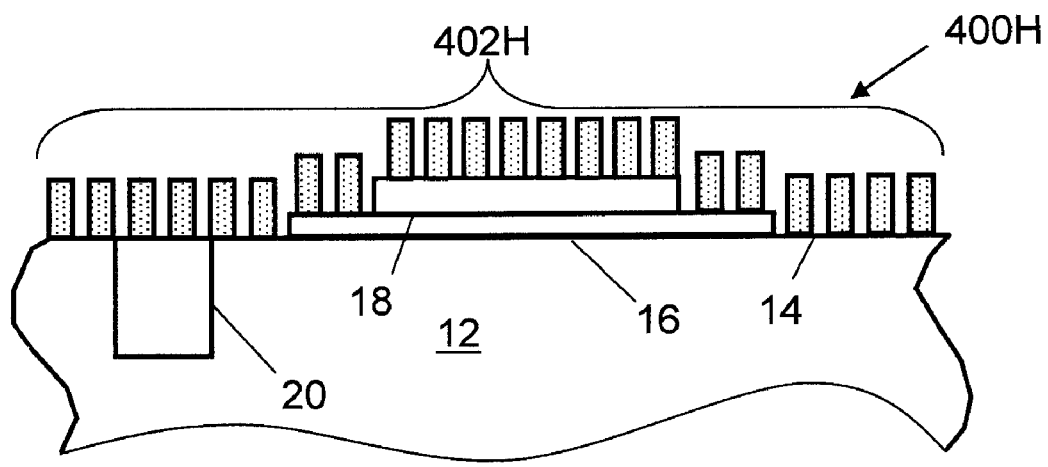

FIG. 7H shows an approach including an energy transfer layer which has been patterned in order to enhance the energy absorption characteristics of the wafer. Semiconductor device 400H includes a patterned energy transfer layer 402H (indicated below a bracket). While performing the aforedescribed function of an energy transfer layer, such patterning of the energy transfer layer may also serve to make the energy absorption less sensitive to the topography of the underlying device structures. Additionally, it may be easier to remove a patterned layer from the wafer surface than it is to remove a continuous film, due to the increased exposed surface area. For example, an etching species can infiltrate between the patterned lines as well as the top surface of the energy transfer layer. Consequently, the etching species may attack the patterned energy transfer layer from several different directions rather than merely etching away the top surface, thereby accelerating the etching process and making the manufacturing process more cost effective. Similar benefits may apply to porous structures, where etchant species can penetrate the pores and accelerate removal of the energy transfer layer.

Patterning may also help to reduce undesired effects of stresses that arise because of mismatch in the physical properties of the layers used in the stack of materials associated with the energy transfer layer (e.g. the absorber layer, diffusion barriers, etch-stop layers, capping layers, etc.) and those of the devices or the substrate. For example, a continuous energy transfer layer that covers the whole of the wafer surface might not be able to accommodate the stress that arises from differential expansion effect because its CTE does not match that of the substrate. However, by etching the film so that it takes the form of a large number of disconnected "islands", the stress induced may be reduced and damage prevented.

Patterning may be in the form of various patterns of regular geometry or a random array of features. Standard methods of lithography may be used to form the patterns. For instance, a resist layer is applied to the wafer and patterned with energy from a photon source or a particle beam. Then, after developing a pattern in the photoresist, the pattern may be transferred to the energy transfer layer by etching. The resist may be removed by a chemical, plasma or thermal treatment. Although the patterning may introduce advantages in energy absorption at the wafer and ease of etching, the cost of adding a lithographic process (including, e.g., lithographic mask and processing steps) should be considered.

One alternative approach in creating patterns is to use an interference pattern formed by combining several laser beams to expose a pattern. The resulting pattern forms, for example, a one-dimensional grating structure or two-dimensional regular pattern. Such an approach may also be used even without a resist layer if the radiation intensity is high enough to directly modify the properties of the energy transfer layer, for instance, by ablation, melting, phase changes or other physical or chemical changes.

Unfortunately, many lithographic approaches require the use of rather expensive and complex equipment. A more straightforward approach is the use of "natural lithography," which does not require a masking step or complex optical exposure apparatus. One such approach relies on the use of a suspension of very small spheres (or other shaped particles) of a material dispersed within a liquid medium. The spheres are typically made from materials such as, but not limited to, polystyrene, polymethylmethacrylate, polymer latexes or silica. The suspension is applied to the surface of the wafer, for example, by dip coating or a spin-on approach. The liquid portion of the suspension may removed by, for example, evaporation, thus leaving behind the spheres on the wafer. Frequently, such spheres will "self-assemble" into a regular array on the surface. The pattern of spheres can then be used as a mask, either to expose a resist layer on the wafer or to deposit a film on the wafer in the regions between the spheres or to etch a pattern in the wafer. Etching or deposition processes that have directional characteristics (anisotropic qualities) may assist in transferring the pattern from the spheres to the wafer. For instance, reactive ion etching or chemically assisted ion-beam etching may be used for directional etching. Deposition by evaporation or sputtering has directional properties that may also assist in forming a patterned film. The spheres may subsequently be removed if necessary, for example, by dissolving them in a suitable solvent. Alternatively, the spheres themselves may be used as an energy transfer layer or they may be converted into a patterned absorber structure. If desired, the shape of the spheres may be modified after deposition, for example, by a reflow or a melting process.

Alternative methods of forming patterns without lithography may include depositing particles on the surface of the wafer from a source that contains many finely divided particles (e.g. "colloidal lithography"). For example, silica colloids or Au or Ag sols may be employed. The finely divided particles may serve directly to enhance absorption, or they may be used as a mask for a subsequent etching or deposition process. Fine particles may also be formed during deposition or evaporation processes, if the processing conditions allow atoms to migrate on the wafer surface and to cluster into small particles during the deposition process. Such aggregation or agglomeration may also be induced in thin films by annealing the films after deposition.

Other approaches to patterning a resist layer or an energy transfer layer are possible. For example, a pattern may be imprinted in the surface of a relatively soft material by a direct stamping approach. The stamp is designed to contain the features of the desired pattern and produce an imprint in a soft layer. The soft layer serves the function of the resist in a conventional lithographic process and, in some cases, the energy transfer layer itself may be sufficiently soft to allow the stamping process. The stamping approach may produce small features in a cost-effective manner. A related approach involves hot embossing, where the soft layer is heated and softened such that it deforms easily during the imprinting step.

Another alternative is a lift-off approach, in which the resist is applied and patterned on the wafer first. The absorber material is then over the resist, and the resist is subsequently removed. As a result, the portion of absorber material, deposited on top of the resist, is removed along with the resist, while the regions where the energy transfer layer is in direct contact with the device layer or barrier film remain intact.

Still another alternative is to pattern the resist layer and then convert the resist layer itself into an energy transfer layer structure. For example, the resist may be a photoresist that is a carbon-containing compound. After patterning, this layer itself may be converted to a carbon-rich form by a thermal, chemical or irradiation process. This approach has the advantage of being a straightforward approach for forming a patterned energy transfer layer.

Figure 7I:
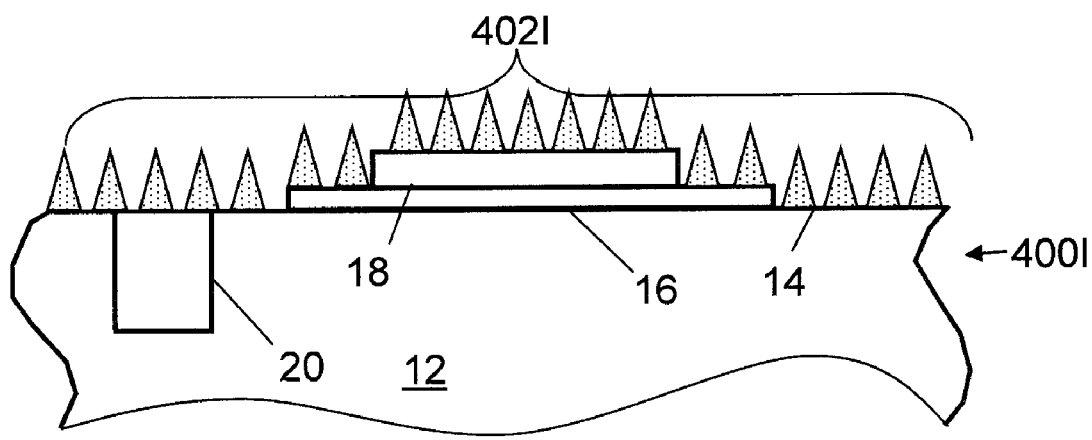

FIG. 7I shows a patterned energy transfer structure including a triangular cross section in the absorber regions. A semiconductor device 400I includes a patterned energy transfer layer (indicated by a bracket 402I) which has been engineered to exhibit triangular cross sections. Such structures may help enhance optical absorption and also may be easier to remove by an etching process. Furthermore, the size of the base of the triangle may be designed cover most of the device structure, thereby assisting in the uniformity of absorption, while the texture further enhances the energy absorption. Such patterns may be formed using a variety of approaches including, for example, lithography, stamping and lift-off methods described above.

Figure 7J:
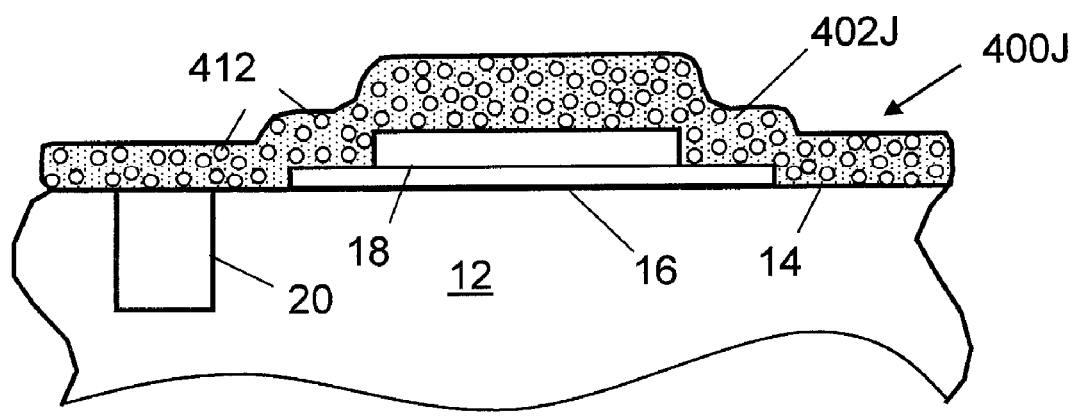

FIG. 7J illustrates a semiconductor device featuring a porous structure which functions as an energy transfer layer.

A semiconductor device 400J includes an energy transfer layer 402J with a plurality of pores 412 defined therein. Such porous layers may be formed, for example, by CVD, etching processes, anodic etching, sol-gel processing or other conventional methods. Pores 412 may be empty or filled with a gas or a second material. The pores may be in the form of micro-bubbles that are not interconnected, or they may be overlapped to form a spongy network that is more open in structure. Such porous structures help to enhance optical absorption, and they may also be easier to remove in an etching process after the thermal processing is complete because more surface area may be exposed to the etchant. Porous materials may also be used to form an anti-reflection coating, since the effective refractive index of a porous material may take a value intermediate between those for the incident medium and the wafer surface when the thickness and optical properties of the porous material are optimized for the purpose. For example, a layer of porous silicon may serve as an antireflection coating for a silicon surface.

Figure 7K:
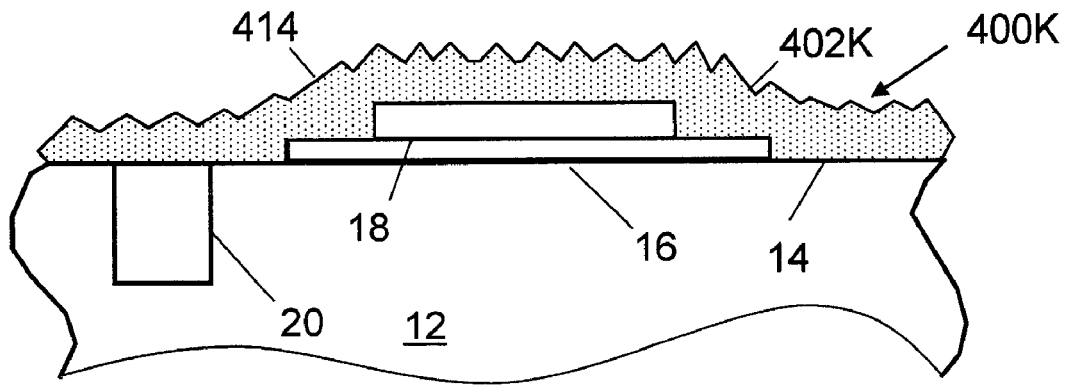

FIG. 7K illustrates a semiconductor device 400K including an energy transfer layer 402K with a textured surface 414. Textured surface 414 enhances energy absorption and also helps to make the absorption less dependent on the device topography under energy transfer layer 402K. The texture may consist of, for example, a plurality of pits, protrusions, trenches, pillars, pyramids, cones, grooves, gratings, facets and other suitable forms of regular or irregular surface roughness. The lateral dimensions of individual features of the textured surface may be optimized to enhance the absorption characteristics. The considerations for the lateral dimensions and the vertical extent of such surface texture are similar to those for the patterned features yet to be discussed.

Continuing to refer to FIG. 7K, the surface of energy transfer layer 402K may be textured by a variety of methods including, but not limited to, chemical etching, which can be applied in either liquid or gas phases, and dry etching approaches such as plasma etching, reactive ion etching, ion-beam etching, sputtering or milling. Both wet chemical and dry etching processes may be either isotropic or anisotropic, and they may be combined with masking approaches to develop specific types of texture. The mask may be formed through a conventional lithographic process or by deposition of an array of mask elements, for instance, by the natural lithography process or other methods that results in at least partially covering the surface with an array of masking elements.

Some etching processes naturally lead to a textured surface, even without a separate masking process. For example, etches that attack defect sites in the surface layer may foster a surface texture by preferential etching that starts at those defect sites. In particular, a polycrystalline silicon film may be etched with an etchant that delineates grain boundaries in the material, thereby resulting in a textured film surface. A suitable etch for this approach is the Secco etch or other defect or grain-boundary delineating etches. Similar approaches may be used on other materials. If necessary, defects may be purposefully introduced into the film in order to facilitate the etching and patterning. One approach for introducing defects is through ion-implantation, which can also be combined with thermal processing to form the desired defect structures.

Certain etches also have the tendency to etch different planes of the crystal lattice of a crystalline material at different rates. Such etches are considered to be anisotropic, and may be used to develop a texture on a surface. For example, the surface can be masked in selected regions, so that when the etch is applied, crystal facets are etched out, thereby leaving a textured surface. Crystalline silicon etched with a KOH etch generally results in such a texturing effect.

Thermal processing can also be used to achieve surface textures, for example, through thermal etching of films. A surface may also acquire a texture as a result of the deposition process used to form them. For instance, films with a rough texture may be formed by controlling nucleation and growth of grains of materials deposited by CVD. As an example, a "black" film of tungsten may be formed by a CVD approach that leads to a textured or dendritic surface when deposition is performed from $WF_6$ at more than 400° C. Films that grow in a three-dimensional manner after nuclei are formed may acquire texture through the growth of crystal facets. Texture may also develop as a result of the mobility of species that have been deposited on a surface. For example, some species tend to clump together or agglomerate when the deposited surface is heated. This effect usually occurs as a result of the tendency of the species to minimize surface energy.

It is noted that texturing and other approaches that result in an energy transfer film of varying thickness across the wafer may be used to reduce interference effects in a thin transparent or semi-transparent film, as was discussed in the above section relating to planarization. This effect may help further reduce the effects of oscillations in the absorption spectrum of the coated wafer.

Figure 7L:
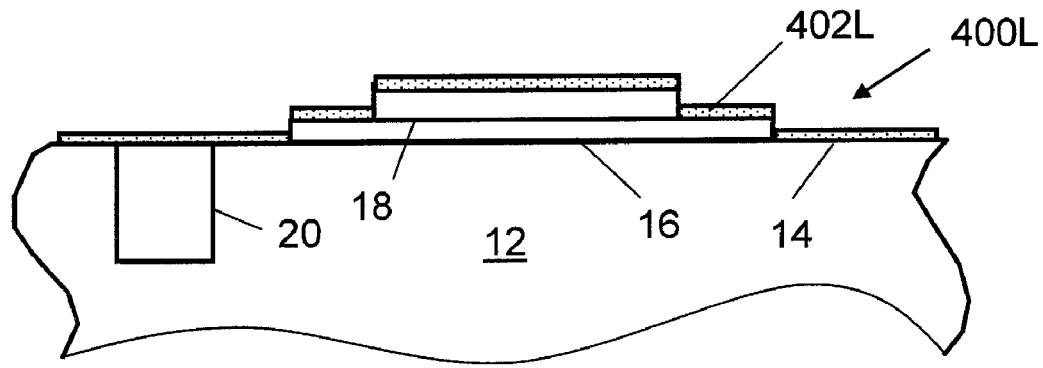

FIG. 7L shows an example of an energy transfer layer that has been applied as a thin film coating that is not conformal. A semiconductor device 400L includes a non-conformal energy transfer layer 402L. As may be seen in the figure, energy transfer layer 402L is formed selectively on surfaces that are approximately parallel to the top surface of the wafer. Such non-conformal films may be formed by deposition approaches that are directional, such as an evaporation or sputtering process. In directional deposition processes, the orientation of the wafer with respect to the stream of species from the deposition source affects the selection of surfaces on which the deposited film grows. In general, the film thickness is reduced on surfaces that are not aligned at right angles to the stream of depositing species. Furthermore, geometrical shadowing effects limit the amount of material deposited in regions that are not directly exposed to this stream. Additionally, etching processes may also exhibit such directional qualities, which may be exploited to selectively remove material from surfaces, depending on their geometric orientation and/or shadowing effects.

Figure 7M:
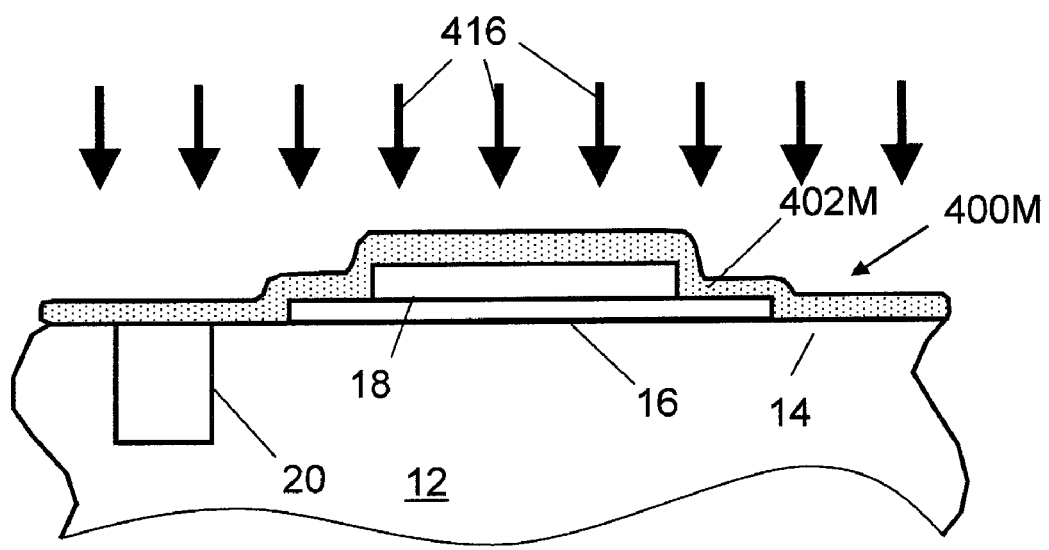

FIG. 7M illustrates the treatment of an energy transfer layer with a stream of energetic species that modify its structure. A semiconductor device 400M includes a conformal energy transfer layer 402M which is bombarded with a stream of energetic species 416 (indicated by a plurality of arrows) intended to modify the structure of energy transfer layer 402M. Such treatment may include, for example, ion-implantation processes.

Ion-implantation of the energy transfer structure may be helpful in several ways. For example, if the energy transfer layer is a semiconductor, the ion-implantation may be used to introduce dopant species into the energy transfer layer. Although dopant species may also be introduced into the energy transfer layer during CVD deposition or from a surface source of dopants, such as a spun-on film containing dopants, ion-implantation can introduce a well-controlled dose of dopants at high concentrations, which may be useful for increasing the absorption of optical radiation.

The energetic species should be introduced with an ion implantation energy that is low enough to prevent the species from reaching the device structures to prevent undesirable alteration of the properties of the electronic devices. In some instances, it may be useful to electrically activate the implanted dopants through an additional annealing process. This annealing process, however, should be performed in a manner that does not introduce excessive diffusion in the device structures themselves or lead to other degradation in their properties. For example, the implantation process may be designed to produce an amorphous layer, since such layers they can re-grow at rather low temperatures and provide high electrical activation of the implanted dopants after such low temperature annealing. The amorphous layer may be formed by through implantation of the dopant species itself or through a second implant of a species that is used to amorphize the semiconductor film. When silicon is the semiconductor used, implants of As, P, Sb, Ga and In, with sufficiently high doses, may create amorphous layers. Implantation of B at room temperature usually does not result in amorphization, but implants of heavier ions that contain B, such as $BF_2$ ions, may amorphize silicon. If B is to be used, then a second implant with an amorphizing species, such as another dopant or with an electrically neutral species such as Si, Ge, Sn, C, Ar, Ne, Kr or Xe, may be utilized. For the dopant as well as electrically neutral amorphizing implants, typical implant energies are between 500 eV and 200 keV, and doses are between ~$10^{13}/cm^2$ and $5 \times 10^{16}/cm^2$.

Although each of the energy transfer layers in FIGS. 7A-7M is shown as a single layer, it should be noted that the energy transfer layer structure may include the multiple layers of materials, patterning features and texture modifications discussed earlier in this disclosure. Most of the thin films described in this disclosure may be formed by conventional methods such as, but not limited to, chemical vapor deposition (CVD), plasma-assisted CVD, metal-organic CVD (MOCVD), ion-assisted CVD, microwave-assisted CVD, laser-assisted CVD, photo-assisted CVD, hot-wire CVD, atomic layer deposition (ALD), molecular beam epitaxy (MBE), evaporation (thermal or electron-beam-assisted), sputtering, magnetron sputtering, reactive sputtering, pulsed laser or electron beam ablation, filtered cathodic vacuum arcs, pulsed vacuum arc discharge, glow discharge, plasma immersion processing, ion plating, ion beam deposition, ion implantation, cluster beam deposition, physical vapor deposition (PVD), electrochemical plating, dip coating, spin-on coating, plasma spray processing, spray coating, sol-gel synthesis, and Langmuir-Blodgett film deposition.

General Characteristics of Energy Transfer Layers of the Present Invention

Despite the advantages that the energy transfer layer concept provides, conventional approaches for forming, using and removing structures suitable for use as energy transfer layers may be problematic since these approaches generally introduce undesirable extra process steps which add to processing costs and may reduce the yield of working devices. Certain energy transfer designs may also introduce undesirable materials that may not be sufficiently thermally stable or may cause contamination of the wafer. Certain approaches described herein simplify the use of energy transfer layers, provide new alternatives for processing with energy beams, and provide for performing advanced thermal processing, as will be described in further detail immediately hereinafter.

One approach for optimizing energy absorption is to use an energy transfer layer that has a high absorptivity for the incident energy. Such an energy transfer layer should exhibit a relatively low surface reflectivity, so that most of the incident energy is absorbed. For incident radiation from a laser, for instance, the reflectivity of the energy transfer layer depends on the laser wavelength. For radiation from a lamp, the reflectivity is the averaged value that is weighted with respect to the spectrum of radiation from the lamp. If the heating energy comes from a non-thermal energy source, such as a particle beam, the reflectivity is considered as the fraction of heating energy that is not absorbed by the wafer. For example, for an incident electron beam, some of the incident electrons are backscattered from the surface, and the energy carried away by these backscattered electrons may be viewed as contributing to the reflected energy.

A relatively thin coating of the energy transfer layer capable of providing sufficient energy absorption while allowing repeatable processing, regardless of the nature of the device structures beneath the energy transfer, is desirable. One way to achieve such a thin energy transfer layer is through the use of a thin film which is nearly opaque to the incident radiation.

For absorption of electromagnetic radiation, such as light or infra-red radiation, the degree of opacity of the energy transfer layer may be assessed by considering the optical absorption coefficient of the energy transfer layer material $\alpha(\lambda)$ for the wavelength $\lambda$ of the incident radiation. The optical absorption coefficient defines the length scale over which energy is absorbed as it propagates into the energy transfer layer. For example, if the power absorbed at the surface is $I_A$, then resulting power after the energy has propagated a distance d into the energy transfer layer has been reduced to a level of $I_A \exp[-\alpha(\lambda)d]$. From this expression, it is evident that power will be reduced to a level of less than 10% of its initial value when the quantity $\alpha(\lambda)d$ is greater than ~2.3.

The energy transfer layer thickness should be such that radiation traveling therethrough, and subsequently reflected from the device structures, is absorbed within the energy transfer layer itself before it can return to the ambient and be lost. In this regard, it is convenient to choose an energy transfer layer thickness $d_{abs}$ which ensures that the quantity $\exp[-2\alpha(\lambda)d_{abs}]$ is less than ~0.1. In other words, $\alpha(\lambda)d_{abs}$ should be greater than one to fulfill this condition. In demanding applications, where reflectivity variations must be greatly suppressed, $\exp[-2\alpha(\lambda)d_{abs}]$ should be less than 0.01. In this case, $\alpha(\lambda)d_{abs}$ should be greater than two and, ideally, greater than three.

When assessing the choice of the material to function as an energy transfer layer, the behavior of $\alpha(\lambda)$ over the emission spectrum $S(\lambda)$ of the heating radiation should be carefully considered. The absorption coefficient $\alpha(\lambda)$ should be appropriately large over the incident spectrum of radiation. If the radiation source is a laser, which emits radiation over a very narrow band of wavelengths near $\lambda_{laser}$, then the value of $\alpha(\lambda_{laser})$ should be optimized. For broadband radiation sources, such as arc-lamps, it is necessary to consider that part of the spectrum which contains a significant fraction of the incident radiation.

Although a thicker energy transfer film may provide greater opacity, a thicker film may take longer to deposit of the wafer and it may take longer to remove after processing. Hence, for improved wafer throughput and cost-effectiveness, the energy transfer film thickness may need to be limited. The film thickness can be limited to a smaller value by using a film with a relatively high absorption coefficient. For example, if an absorbing film is required to be less than 1000 nm thick, then the criterion that $\alpha(\lambda)d_{abs}$ should be greater than one necessitates that the value of $\alpha(\lambda)$ must be greater than 10,000 $cm^{-1}$. Similarly, in order to limit the energy transfer film thickness to less than 100 nm, for instance, $\alpha(\lambda)$ should be greater than 100,000 $cm^{-1}$.

The absorption characteristic of materials is sometimes characterized through the extinction coefficient $k(\lambda)$ of the absorber material of the energy transfer layer. The extinction coefficient is the imaginary part of the complex refractive index of the material, and it is related to the absorption coefficient by the equation $k(\lambda)=\lambda\alpha(\lambda)/(4\pi)$. The value of $k(\lambda)$ that is appropriate for a material used as an energy transfer layer depends on the wavelength of the incident energy. For example, if the energy lies at wavelengths between 0.1 and 20 µm, then the condition that $\alpha(\lambda) > 10,000$ cm$^{-1}$ may be met by $k(\lambda)$ values ranging from 0.008 to 1.6. For most energy transfer layer applications, the $k(\lambda)$ value should be greater than 0.001. For lasers operating at wavelengths between 300 nm and 1200 nm, and for arc-lamp energy sources or flash-lamps, the $k(\lambda)$ value should be greater than 0.1, and, preferably, at least 0.2 for at least part of the emission spectrum of the energy source considered. For carbon dioxide lasers operating at wavelengths between 9 and 12 µm, it is preferable for $k(\lambda)$ to be at least 0.5.

It is also possible to assist in the coupling of electromagnetic radiation to a substrate by using coatings that are substantially transparent to the heating radiation. For instance, a thin film may be used as an anti-reflection (AR) coating. Such films decrease the reflectivity of the wafer, thereby increasing the absorptivity and power coupling onto the wafer. Thin films may be designed for optimal performance at a given wavelength of heating radiation. For example, for radiation with wavelength λ that is incident on a substrate with a refractive index $n_s$ from within a medium with refractive index $n_0$, a quarterwave anti-reflection coating may be used to minimize the reflectivity at the given wavelength λ. Such a quarterwave anti-reflection coating may consist of a layer of a material having a thickness given by the expression:

$$t_{anti-reflection} = \frac{m\lambda}{4n_{anti-reflection}}, \qquad (8)$$

where $n_{anti-reflection}=(n_0 n_s)^{0.5}$ is the effective anti-reflection coating refractive index and the quantity m is an odd-number integer. The quarterwave anti-reflection coating is merely one example of an anti-reflection coating design, and more complex stacks of thin films may be used to similar effect. The performance of such anti-reflection coatings may be optimized with respect to a range of wavelengths, angles of incidence and planes of polarization of the incident radiation. A variety of designs may be created with the aid of conventional thin-film coating design approaches.

Referring again to FIGS. 5 and 6, graph 320 of FIG. 5 may be interpreted as illustrating the effects of an anti-reflection coating on the spectral absorptivity of a substrate for a variety of anti-reflection coating thickness values. As discussed earlier, in the calculations used in creating graph 320, the substrate is assumed to have a refractive index $n_s=3.6$, which is similar to the refractive index of silicon in the near IR. The anti-reflection coating is assumed to have a refractive index, $n_{anti-reflection}=2.0$, and the he incident medium is air, with $n_0=1.0$. Spectra 322-328 of graph 320 show that the absorptivity comes very close to 1.0 at wavelengths where the film thickness meets the quarterwave anti-reflection coating definition given above. This effect occurs even though the film refractive index is not exactly equal to $(3.6\times1)^{1/2}=1.9$, which would be the ideal value for an anti-reflection coating design.

Another example where a transparent film can assist in management of energy coupling is the case where the energy source delivers energy to the substrate over a range of wavelengths or angles of incidence. In this case, the conditions for thin film interference effects such as constructive or destructive interference are different for each wavelength or angle of incidence present in the incident beam of energy. Therefore, when the total energy coupling, or integrated absorptivity, is calculated by appropriate averaging over the range of wavelengths emitted, angles of incidence and planes of polarization that describe the incident radiation, the variations in reflectivity that may be observed at any single wavelength and angle of incidence have a smaller effect over the averaged result. Such an effect is shown in FIG. 6, where the variations in integrated absorptivity are smaller than those seen at any single wavelength in FIG. 5 for the same materials used in the substrate and anti-reflection coating.

In some circumstances, it may be advantageous to apply a fairly thick film of a transparent or semi-transparent material to a surface in order to homogenize the energy absorption at the surface, especially if the film has a fairly high refractive index. In this way, the spacing in wavelength between a maximum and a minimum in the reflectivity is reduced and, for an energy source with a finite range of wavelength, the averaging of energy absorption may be improved. This concept is illustrated in FIG. 6, in which it may be observed that the integrated absorptivity does not depend on film thickness once the film thickness exceeds ~100 nm.

The desired film thickness and refractive index may be defined in terms of a condition that the interval between the wavelengths corresponding to the extrema of absorptivity in the absorption spectrum is small compared to the range of wavelengths in the incident energy spectrum. Typically, such transparent films should be thicker than a value of $\sim\lambda_A^2/(4n_F\Delta\lambda_{spect})$, where $\lambda_A$ is a wavelength that is representative of the incident energy spectrum, $n_F$ is the refractive index of the film at wavelength $\lambda_A$, and $\Delta\lambda_{spect}$ is the magnitude of a wavelength interval that contains a substantial fraction of the energy of the spectrum.

Wavelength $\lambda_A$ may be defined through a weighted average of the energy spectrum. One suitable definition is given by the equation:

$$\lambda_A = \frac{\int_0^\infty \lambda S(\lambda) d\lambda}{\int_0^\infty S(\lambda) d\lambda}. \qquad (9)$$

$\lambda_A$ may be defined in other ways. For example, $\lambda_A$ may be defined as the wavelength at which emission spectrum $S(\lambda)$ reaches a maximum or by another approach for estimating the spectral region where the energy source delivers the most significant part of its total energy.

The quantity $\Delta\lambda_{spect}$ may be defined as the wavelength range around $\lambda_A$ that includes at least half of the energy of the incident radiation. For example, this wavelength interval may be defined through the equation:

$$\frac{\int_{\lambda_A - \frac{\Delta\lambda_{spect}}{2}}^{\lambda_A + \frac{\Delta\lambda_{spect}}{2}} S(\lambda) d\lambda}{\int_0^\infty S(\lambda) d\lambda} = 0.5. \qquad (10)$$

Although other definitions for this quantity are possible, Equation (10) has the merit of ensuring that the majority of the radiation in the incident spectrum is considered in the definition of $\Delta\lambda_{spect}$.

Referring now to FIGS. 8-13 in conjunction with FIG. 4, the efficacy of such energy transfer layer approaches may be analyzed by calculating the absorption spectra of various coating structures, both with and without an energy transfer layer, in order to tailor the absorption characteristics. In this regard, aforedescribed FIG. 4 may be interpreted as illustrating the spectra of three regions of a wafer with different structures and, therefore, different absorption spectra. Spectra A-C of graph 300 in FIG. 4 may be used to calculate the integrated absorptivity in accordance with Equation (7) described above. Limiting the calculation for radiation in the wavelength range between 200 and 1000 nm incident at normal incidence from a black-body source at a temperature of 8000 K, the integrated absorptivity for a bare silicon surface (corresponding to spectrum 302 in FIG. 4) is approximately 0.547, that for the 100 nm oxide film (corresponding to spectrum 304 in FIG. 4) is approximately 0.708, and that for a coating of 100 nm of silicon over 100 nm of oxide (corresponding to spectrum 306 in FIG. 4) is calculated to be 0.421. These calculated numbers indicate that there exists a significant degree of variation in energy coupling at different regions of the wafer.

Figure 8:
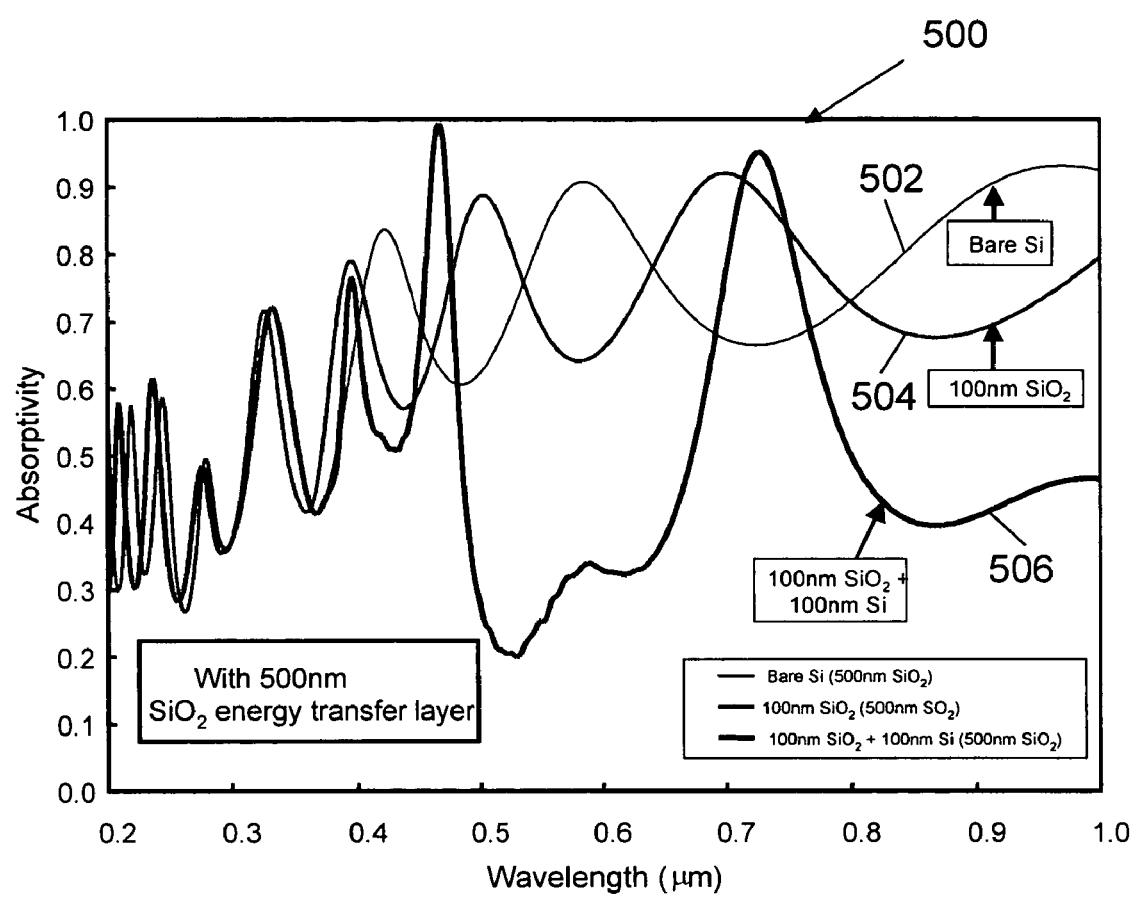
FIGS. 8-18 are graphs showing the calculated absorptivity spectra and integrated absorptivity for a variety of coating configurations on a silicon wafer.

FIG. 8 shows the absorptivity spectra for the same three types of film as those considered in FIG. 4 with an energy transfer layer of 500 nm of silicon dioxide, as earlier described in reference to FIG. 7E. FIG. 8 shows a graph 500 including calculated spectra A, B and C, which are generally indicated by reference numerals 502, 504 and 506, respectively. Spectrum A corresponds to the absorptivity spectrum for a bare silicon wafer with a 500 nm silicon dioxide energy transfer layer deposited thereon. Spectrum B corresponds to the absorptivity spectrum for a silicon wafer topped with a 100 nm silicon dioxide layer and a 500 nm silicon dioxide energy transfer layer deposited on the first silicon dioxide layer. Spectrum C corresponds to the absorptivity spectrum for a silicon wafer with a 100 nm silicon dioxide layer, a 100 nm silicon layer, and a 500 nm silicon dioxide energy transfer layer deposited thereon.

Figure 9:
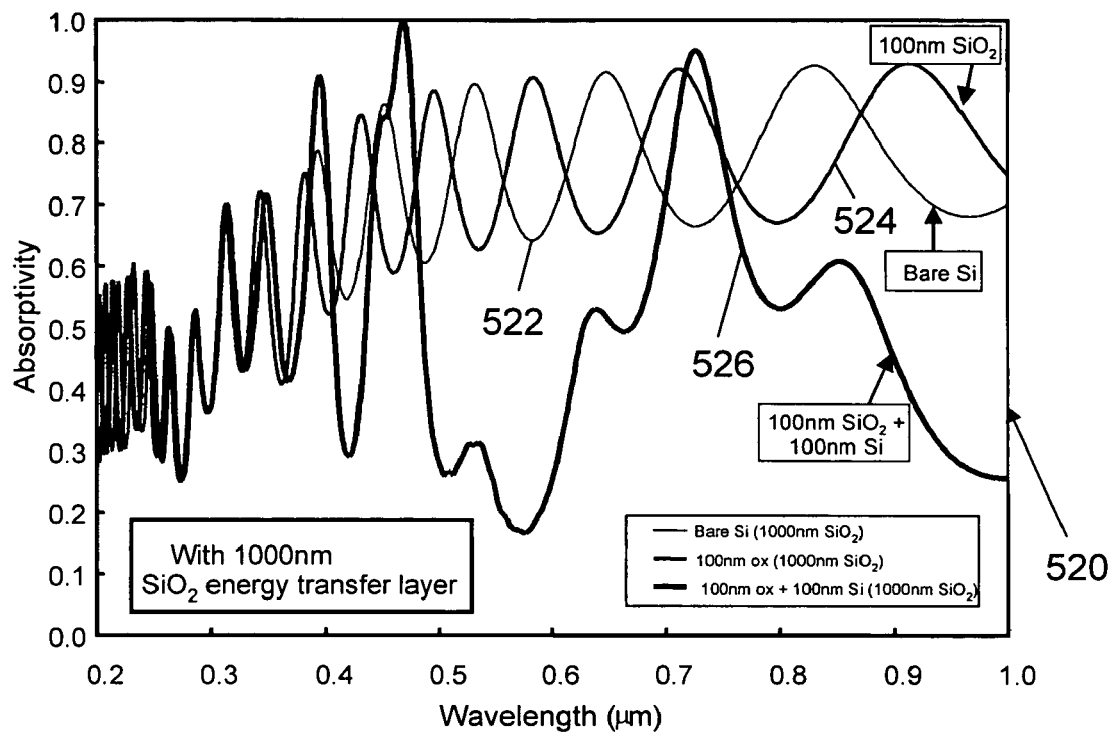

Similarly, FIG. 9 illustrates the absorptivity spectra for the same three conditions as FIG. 8 but with an energy transfer layer of 1000 nm of silicon dioxide. FIG. 9 shows a graph 520 with spectra A, B and C, generally indicated by reference numerals 522, 524 and 526, respectively. As in FIG. 8, spectra A, B and C of graph 520 correspond to the absorptivity spectra for a bare silicon wafer, a silicon wafer with a 100 nm silicon dioxide layer, and a silicon wafer with a 100 nm silicon dioxide layer and a 100 nm silicon dioxide layer and a 100 nm silicon layer, respectively. In the calculated spectra shown in FIG. 9, however, a thicker energy transfer layer of a 1000 nm film of silicon dioxide is deposited on each of the wafer configurations.

By comparing FIG. 4 with 8 and 9, it may be seen that the silicon dioxide energy transfer layer introduces an oscillatory pattern into the absorption spectrum since silicon dioxide is transparent in the wavelength range considered (i.e., 200 to 1000 mm). The energy transfer layer also tends to increase the absorptivity of a silicon surface by acting as an anti-reflection coating to at least a limited extent. These two effects lead to reduction in the relative differences between the power coupling in the three different configurations considered in each of FIGS. 8 and 9.

Figure 10:
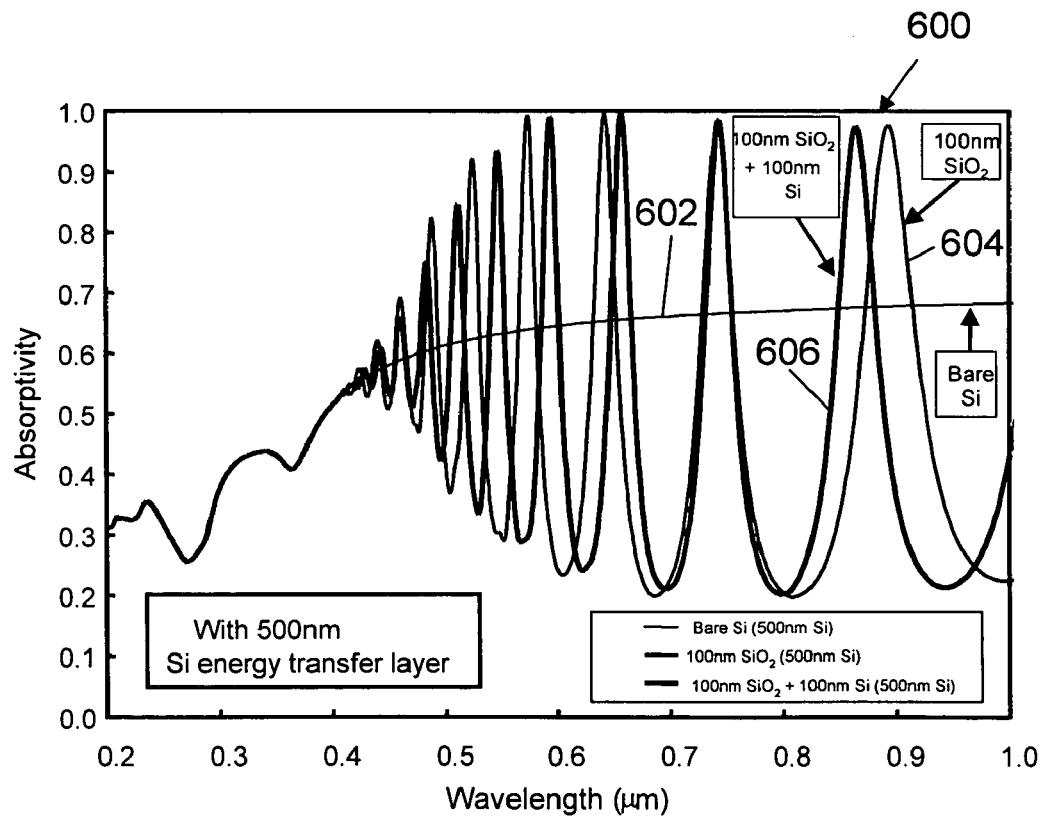
Figure 11:
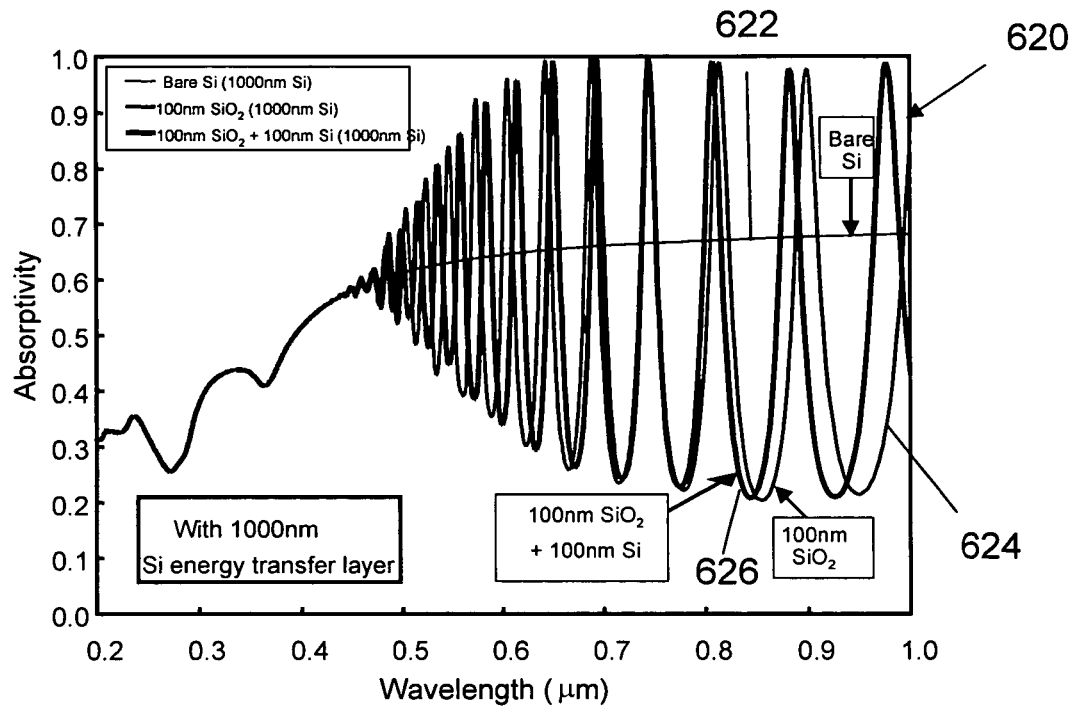

Turning now to FIGS. 10 and 11, these figures illustrate the absorptivity spectra for the same three configurations as used in FIGS. 8 and 9 but with an energy transfer layer formed of a silicon film with a thickness of 500 nm and 1000 nm, respectively. FIG. 10 shows a graph 600 including calculated spectra A, B and C, which are generally indicated by reference numerals 602, 604 and 606, respectively. Spectrum A corresponds to the absorptivity spectrum for a bare silicon wafer with a 500 nm silicon energy transfer layer deposited thereon. Spectrum B corresponds to the absorptivity spectrum for a silicon wafer topped with a 100 nm silicon dioxide layer and a 500 nm silicon energy transfer layer deposited on the first silicon dioxide layer. Spectrum C corresponds to the absorptivity spectrum for a silicon wafer with a 100 nm silicon dioxide layer, a 100 nm silicon layer and an additional 500 nm silicon energy transfer layer deposited thereon. Similarly, FIG. 11 shows a graph 620 with spectra A, B and C, generally indicated by reference numerals 622, 624 and 626, respectively. As in FIG. 10, spectra A, B and C correspond to the absorptivity spectra for a bare silicon wafer, a silicon wafer with a 100 nm silicon dioxide layer, and a silicon wafer with a 100 nm silicon dioxide layer and a 100 nm silicon layer, respectively, but with a thicker energy transfer layer of a 1000 nm film of silicon dioxide is deposited on each of the wafer configurations.

In comparing FIGS. 10 and 11 with FIGS. 8 and 9, respectively, it may be observed that the silicon energy transfer layer serves to reduce the variations in the absorptivity between the three types of coating configurations. This reduction in absorptivity variation occurs through two mechanisms, which arise because the absorption coefficient of silicon is a strong function of wavelength. At relatively short wavelengths (e.g. <~0.4 μm), the silicon energy transfer layer is essentially opaque because of the high absorption coefficient of silicon at these wavelengths. In this short wavelength range, the silicon film acts as a traditional absorber layer and, consequently, the surface absorptivity of the coated wafer is defined by that of the silicon film such that the nature of the device structures beneath the energy transfer layer do not influence the energy absorption. At longer wavelengths (i.e., >~0.4 μm), the silicon energy transfer layers are semitransparent, and large oscillations in the absorptivity occur with variation in wavelength. In this part of the spectrum, the averaging effect discussed above with respect to FIGS. 8 and 9 applies, and the energy transfer films tend to reduce the variation in the absorptivity spectra, particularly between spectra B and C.

Figure 12:
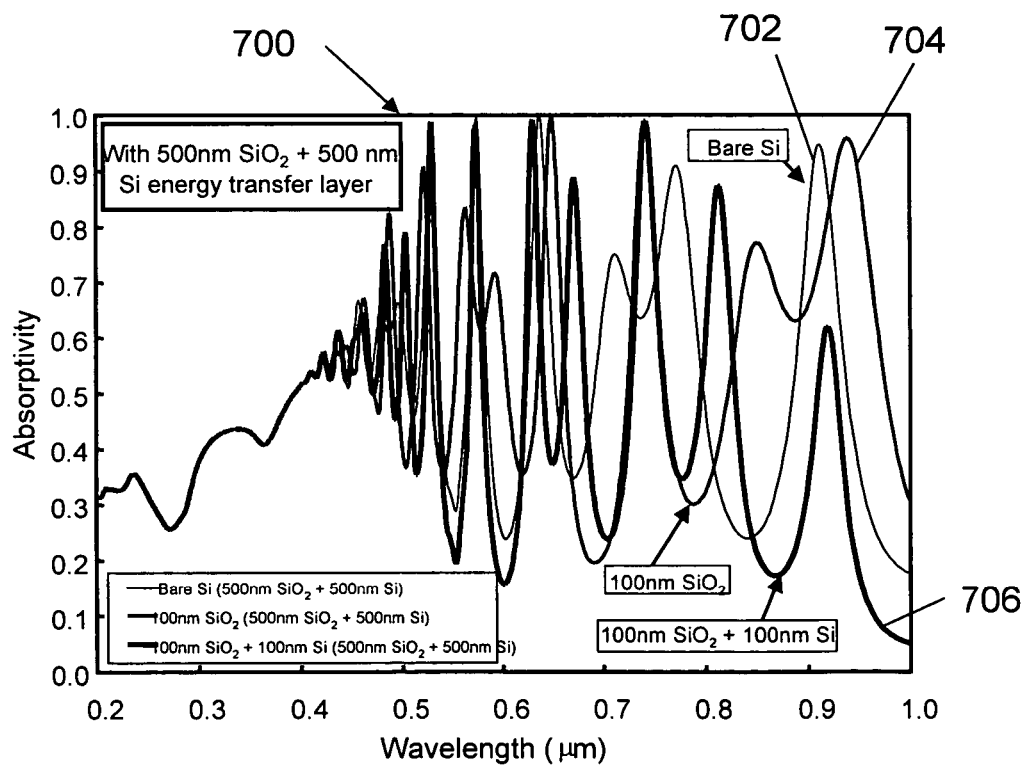
Figure 13:
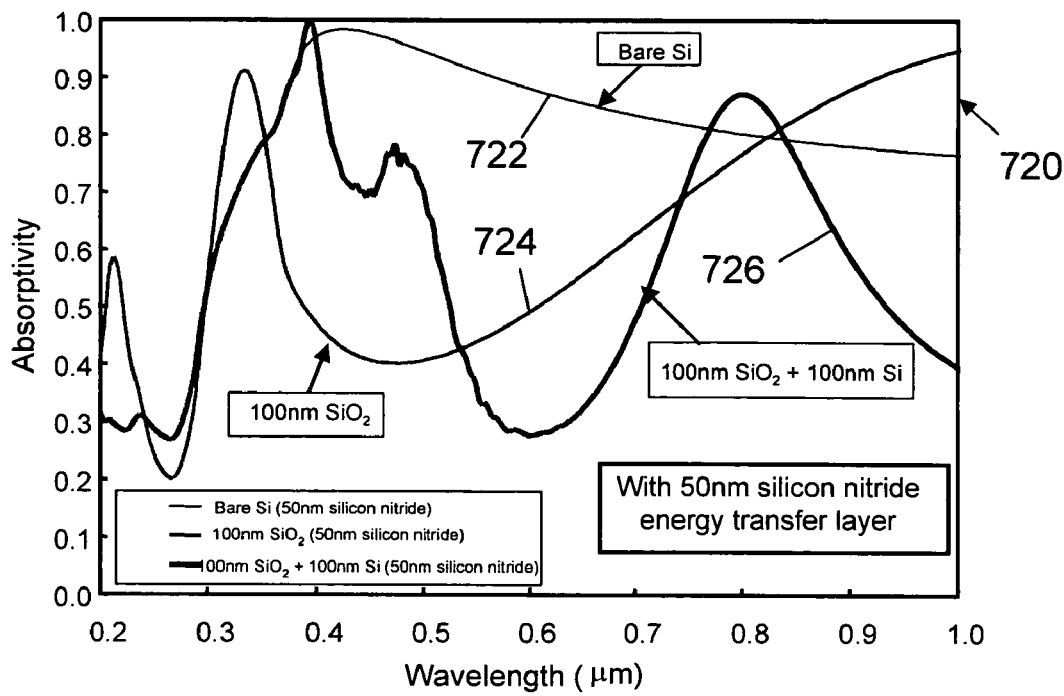

FIGS. 12 and 13 illustrate the effects of using two other energy transfer layer materials. FIG. 12 shows the spectra for the cases where a bare silicon wafer, a silicon wafer with a 100 nm silicon dioxide layer deposited thereon and a silicon wafer with a 100 nm layer of silicon dioxide and a 100 nm layer of silicon are additionally coated with a two-layer energy transfer structure of 500 nm silicon dioxide and 500 nm silicon films in combination. This two-layer energy transfer layer structure combines the interference effects in the silicon dioxide and silicon layers as shown in FIGS. 8 and 9, and also reduces the variations in integrated properties, as discussed in reference to FIGS. 10 and 11. Additionally, FIG. 13 shows the effect of a 50 nm thick film of silicon nitride used as a energy transfer layer on the absorption spectrum on the three coating configurations discussed in FIGS. 8-12. It may be seen that, on the bare silicon wafer, the silicon nitride film acts rather like an anti-reflection coating for the radiation from the 8000 K blackbody.

Applicant recognizes that a simple anti-reflection coating, such as the 50 nm thick nitride film discussed in reference to FIG. 13, does not necessarily reduce the variations in spectral absorption between the different coating configurations in a substantial manner. This lack of effect on absorption variation is due to the fact that the interference effects in the films under the nitride film may overcome the anti-reflection coating effect. However, anti-reflection coatings may be useful, for example, when they are applied over a film of silicon or another absorbing layer that is thick enough to be substantially opaque at the wavelength where the anti-reflection coating is optimized. Such an anti-reflection coating may be especially useful in situations where the absorbing film is rather reflective. The anti-reflection coating may be a simple single layer film or a more complex multi-layer design. For silicon energy transfer layers, coatings of silicon dioxide or silicon nitride may be used in this capacity as an anti-reflection coating. While a full thin film simulation may be used to optimize the characteristics of the anti-reflection coating, a simple approach to analyze the characteristics of the anti-reflection coating is to calculate the average wavelength $\lambda_A$, discussed above, and to minimize the reflectivity of the surface at the average wavelength through the quarter-wave criterion discussed above (see Equation (8)) based on the refractive index of the film at $\lambda_A$. For the spectrum of a typical flash-lamp, $\lambda_A$ is ~0.5 µm. For silicon nitride, this simple analysis suggests the use of a film that is ~60 nm thick, based on a refractive index of 2.0. Similarly, for silicon dioxide, which has a refractive index of ~1.5 at $\lambda_A$, the film should be ~80 nm thick to function as an appropriate anti-reflection coating. It should be noted that the integer m in Equation (8) is set to one for these calculations because this assumption yields the broadest wavelength range for the anti-reflecting behavior. Silicon nitride films are somewhat more effective than silicon dioxide on silicon because of the higher refractive index of silicon nitride. However, the inclusion of a thin layer of silicon dioxide under the silicon nitride may be useful in some cases because silicon nitride films are often highly stressed, and an oxide underlayer may help to relieve the stress. If a silicon dioxide layer is to be used as a stress-relieving underlayer, the oxide film should be included in the optimization calculation of the thickness of the nitride anti-reflection film. The silicon dioxide layer will generally be quite thin (e.g. less than 20 nm thick).

Figure 14:
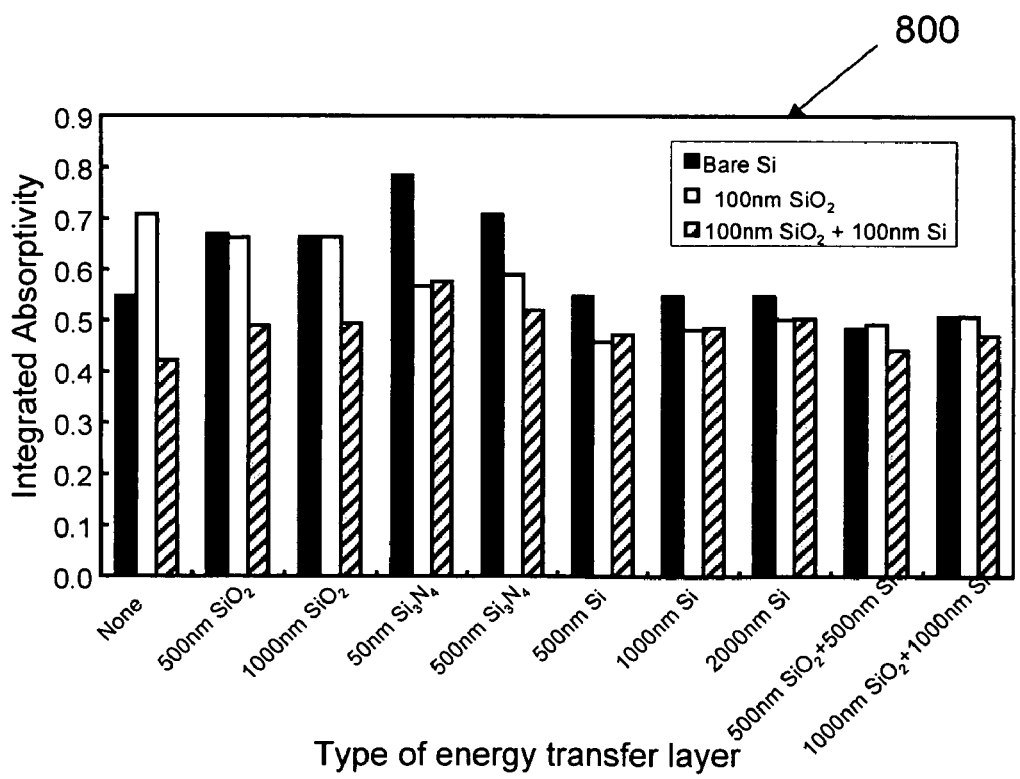
Figure 15:
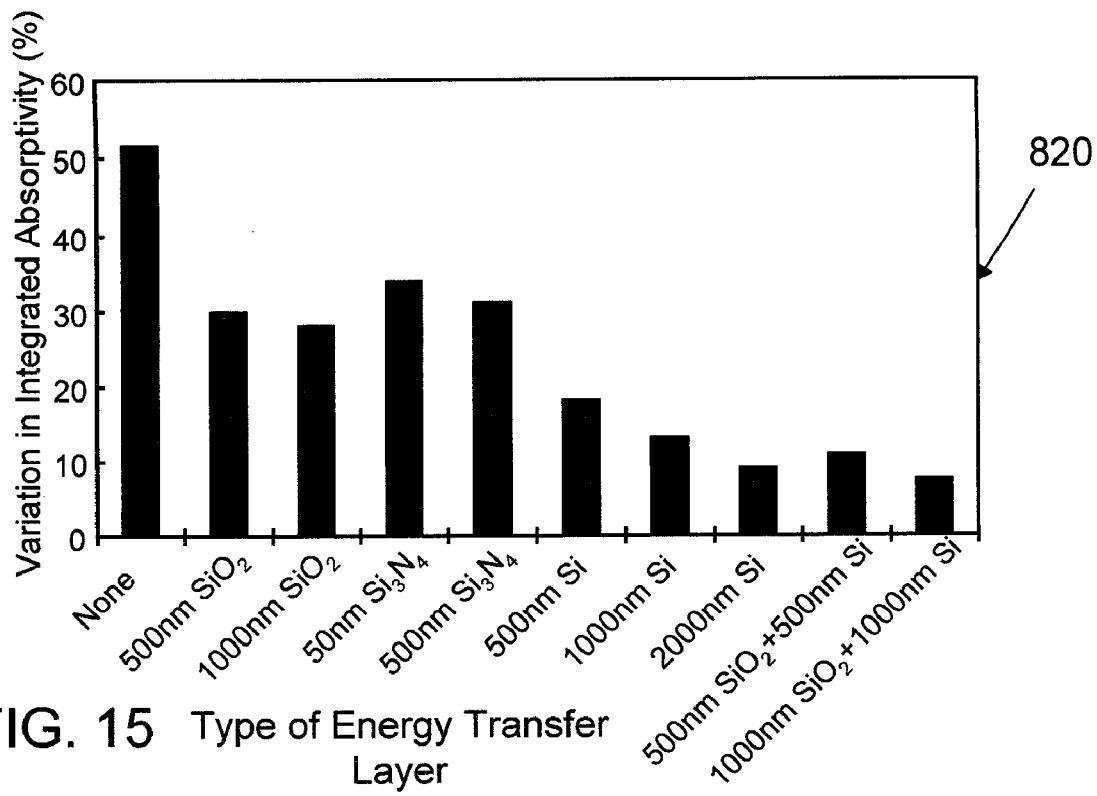

FIG. 14 shows the net effect of various energy transfer layer schemes on the absorptivity variations in the three structures considered. FIG. 14 is a bar graph 800 showing the calculated, integrated absorptivity values for the three coating configurations (namely bare silicon wafer, silicon wafer with a 100 nm thick layer of silicon dioxide deposited thereon, and a silicon wafer with a 100 nm thick layer of silicon dioxide and a 100 nm thick layer of silicon deposited thereon, as indicated in the legend) with a variety of energy transfer layers. Furthermore, FIG. 15 is a bar graph 820 illustrating the calculated degree of variation of absorptivity within each set of three coatings configurations for each type of energy transfer layer. The variation in integrated absorptivity (as indicated in the vertical axis) is shown as a fractional deviation from the average value for the set of three. In comparing the results with different energy transfer layers, it may be seen in bar graphs 800 and 820 that certain energy transfer layers, such as those cases shown in the right half of bar graphs 800 and 820, are quite effective in reducing the variation in absorptivity. In particular, the energy transfer layers that include silicon appear to be more effective in reducing variations. This effect is partly a result of the energy absorption at relatively short wavelengths, and also the fact that their large refractive index tends to introduce many oscillations in reflectivity for any given wavelength interval. Energy transfer layer structures including a combination of silicon dioxide and silicon films appear to be even more effective in suppressing the variation in integrated absorptivity. The actual efficacy of such energy transfer structures is expected to be even greater than that suggested by the calculations presented in FIGS. 14 and 15 since, for most wavelengths in the spectrum considered here, the absorption coefficient of silicon rises rapidly with temperature, thus making the silicon films more opaque across a larger range of wavelengths particularly at high temperatures. Furthermore, if the wafer is preheated to a base temperature before pulsed heating is applied, it is submitted that the results of the pulse heating will be more reproducible because the energy absorption will be more reproducible throughout the pulsed heating cycle. For example, the wafer may be preheated to a temperature of at least 350° C., or even at least 600° C., before starting the pulsed heating.

Figure 16:
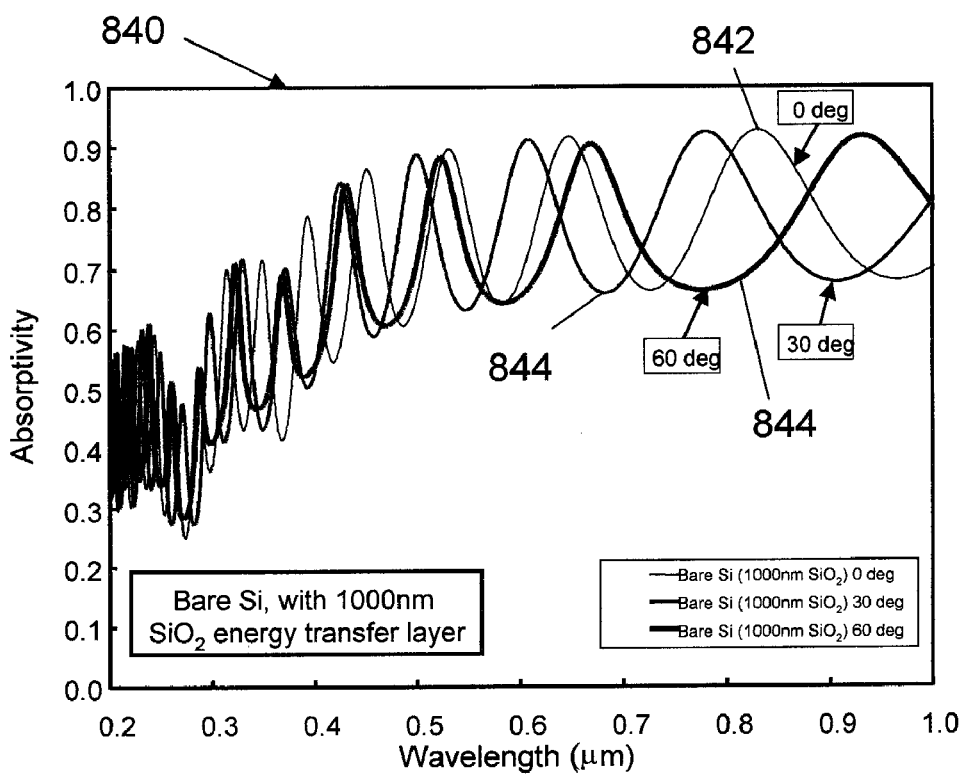
Figure 17:
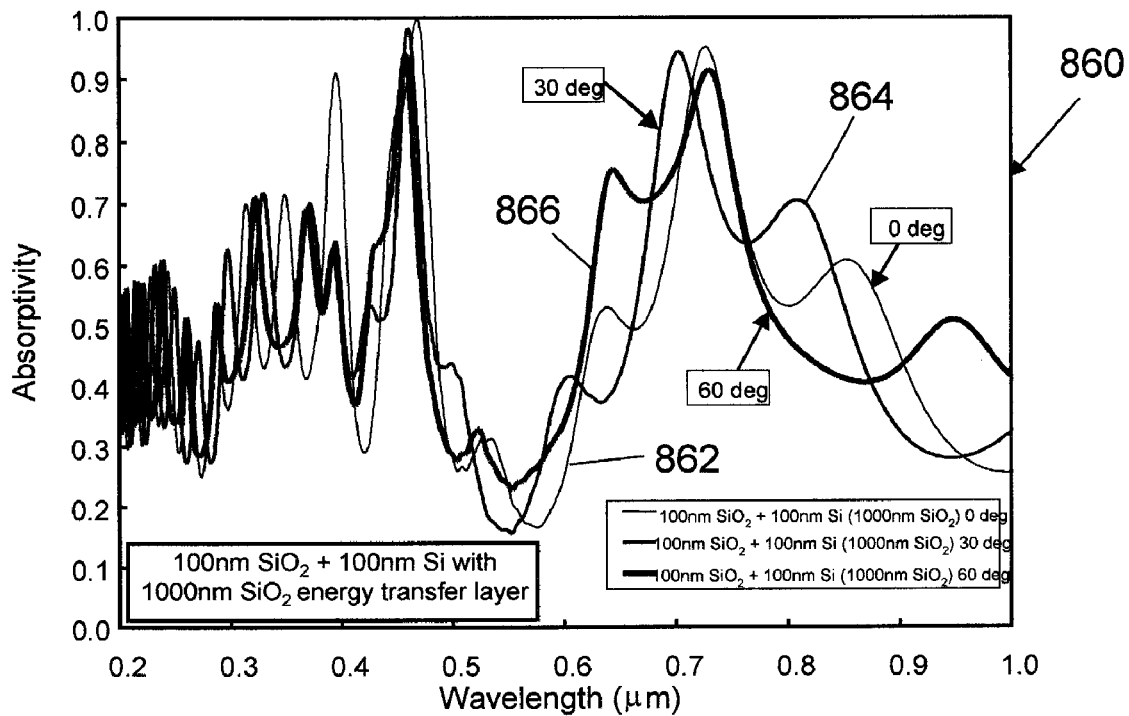
Figure 18:
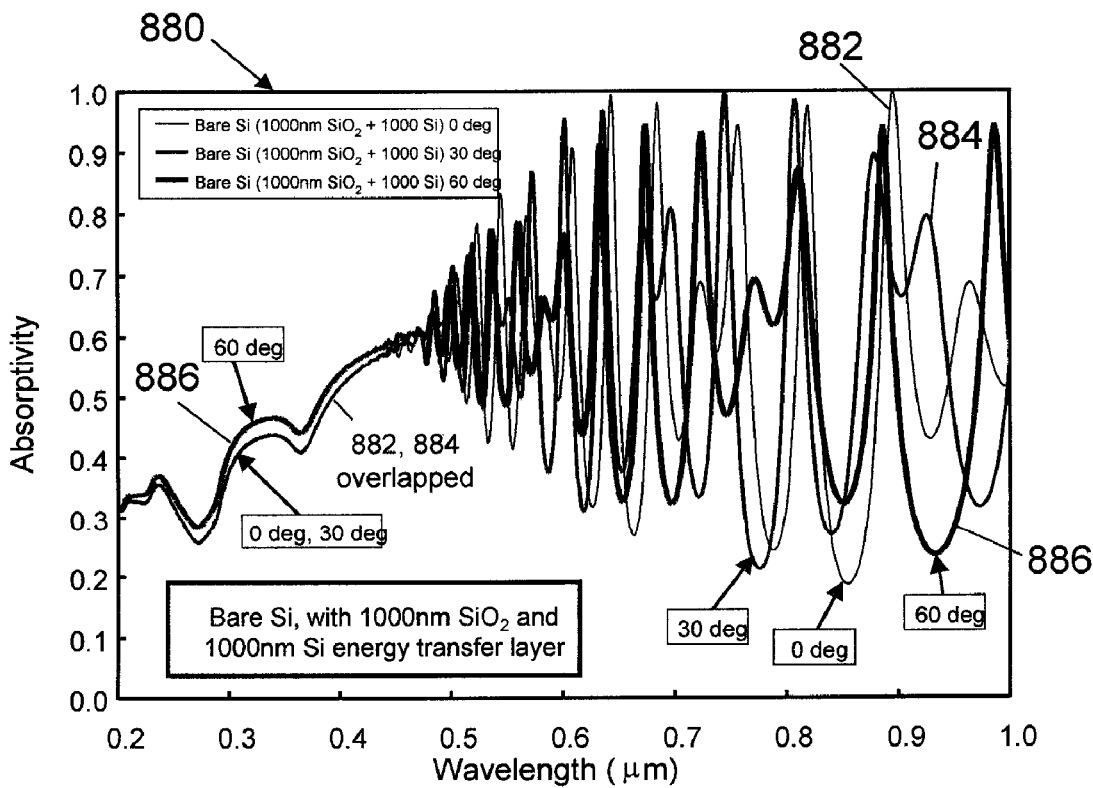

Applicant also recognizes that a similar averaging effect may be obtained by averaging over a range of angles of incidence of the incident energy. Since the optical path length of radiation in the thin film depends on the angle of propagation through a given thin film, the conditions for constructive and destructive interference will be different for radiation traveling at different propagation angles through the film. The coating film thickness and refractive index may be chosen such that the variation in the interference conditions is maximized and, consequently, the greatest averaging effect may be obtained. FIGS. 16-18 illustrate the effect on the absorption spectra for different coating configurations and energy transfer layers for unpolarized radiation incident at 0, 30 and 60 degrees angle of incidence. FIG. 16 includes a graph 840 with spectra 842, 844 and 846 of the calculated absorptivity of a silicon surface coated with 1000 nm of silicon dioxide, for the case of unpolarized radiation incident at normal incidence (0 degrees), 30 and 60 degrees angles of incidence, respectively. FIG. 17 includes a graph 860 showing analogous calculated spectra 862, 864 and 866 for a silicon surface with a 100 nm layer of silicon dioxide and a 100 nm layer of silicon capped with a 1000 nm energy transfer layer of silicon dioxide. Similarly, FIG. 18 includes a graph 880 showing the analogous calculated spectra 882, 884 and 886 for a silicon surface coated with 1000 nm of silicon dioxide and 1000 nm of silicon. In all three FIGS. 16-18, it may be seen that the angle of incidence has a strong influence on the wavelengths at which the absorptivity exhibits maxima or minima. Therefore, it is beneficial to arrange the illumination to include a wide range of angles of incidence.

The use of angle-of-incidence averaging as a way to reduce the variation in averaged absorptivity of different regions on a wafer is of special interest if the incident radiation contains only a very small range of wavelengths, such as the radiation from a laser. In this case, there may also be a benefit in increasing the range of angles of incidence in the incident radiation (see, for instance the above incorporated '272 and '950 applications, respectively). One way of achieving such an increase in the range of angles of incidence is through the use of multiple beams of radiation incident at various angles of incidence on the wafer. Alternatively, an incident beam that includes many angles of incidence may be used. For example, the latter condition may be achieved by forming a focused beam at the wafer surface by illumination through optics having a small f-number (i.e., a high numerical aperture). Such optical components form a conical beam that contains a large distribution of angles of incidence. For example, the cone of the beam may have a half-angle of at least 20° or even 30°.

The discussion so far has focused on the application of continuous layers that may enhance energy absorption. It is further recognized herein that it is possible to form patterned films that function as absorbers. This patterned film concept is to be distinguished from the case where an energy transfer film is selectively formed in particular regions of the device for spatially tailoring the distribution of energy absorption. By the patterned film concept, the patterning itself is used to further improve the operation of the energy transfer layer. Patterning may include, but is not limited to, lithographic patterning, modification of the film texture or surface topography, and formation of a film that contains inclusions, voids, pores and/or particles. The size, length scales, periodicity, regularity and symmetry of patterns or other spatial features may be selected for optimal performance. Likewise, the nature and size of inclusions or voids may be controlled. These patterning approaches may be useful both for absorbing films and for transparent films, as will be discussed in further detail immediately hereinafter.

Figure 19:
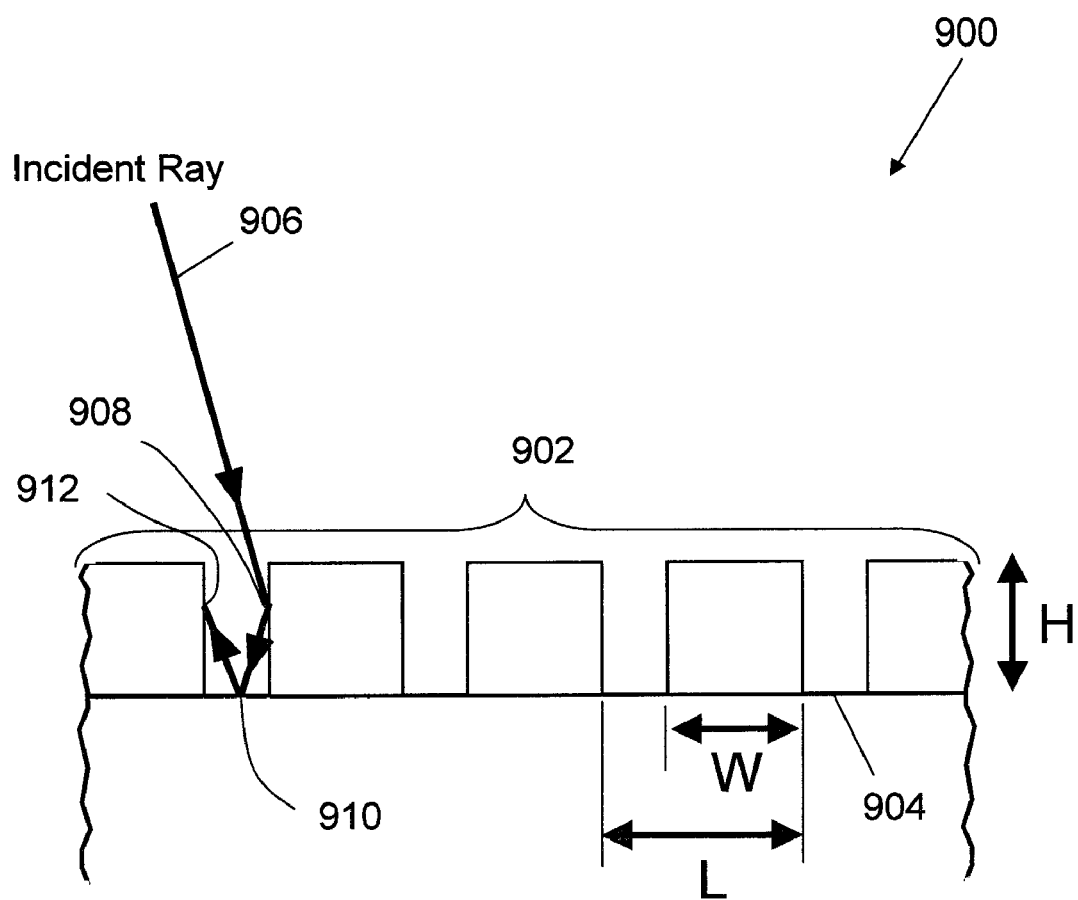
FIG. 19 is a diagrammatic fragmentary illustration, in partial cut-away view, of a device on which a patterned energy transfer layer has been deposited, shown here to illustrate a light trapping effect by which the patterned energy transfer layer may increase absorption of incident radiation.

A film may be spatially patterned so that the reflectivity of the wafer is reduced, thereby increasing the absorptivity of the surface. For example, if the film is discontinuous and has regions therein that are empty or have different refractive indices, the absorption of radiant energy that does not fall directly on the top surface of the film may still be enhanced because the adjacent regions (such as a side wall) of the patterned film may increase absorption by, for instance, a light trapping effect. FIG. 19 illustrates such a light trapping effect in a device 900, in cross section, including a patterned energy transfer layer 902 (generally enclosed in a bracket) deposited on a surface 904. Surface 904 may be the top surface of, for instance, a semiconductor wafer itself or a plurality of layers deposited on a substrate, such as the three different layer configurations discussed above with respect to FIGS. 8-18. Energy transfer layer 902 has a thickness H, and has been patterned into an array of lines of width W with a period (or pitch) of L. The gaps L−W in energy transfer layer 902 are shown to be small relative to the thickness H of energy transfer layer 902. These physical dimensions together define an aspect ratio AR, which is expressed as the quantity:

$$AR = \frac{H}{(L-W)}. \tag{11}$$

Applicant has found that gaps with a high aspect ratio tend to enhance the absorption of radiation by mechanisms such as, for example, the effect of multiple reflections of an incoming ray 906 within the gaps (i.e., light trapping), as illustrated in FIG. 19. That is, incoming ray 906 has several chances of being absorbed including, for instance, at a point of initial contact 908 with energy transfer layer 902, at a contact 910 with surface 904, and a second point of contact 912 with energy transfer layer 902.

Although enhanced absorption may be obtained with values of AR as low as 0.1, further improvement in absorptivity tends to result from the use of patterns with values of AR higher than 0.5, and especially for AR values greater than 1. The components of the patterned film may be one-dimensional, such as in an array of lines or a grating, or they may be 2-dimensional, such as an array of cubes, parallelepipeds or discs. Such structures may be formed in a variety of configurations, as will be described immediately hereinafter.

Figure 20A:
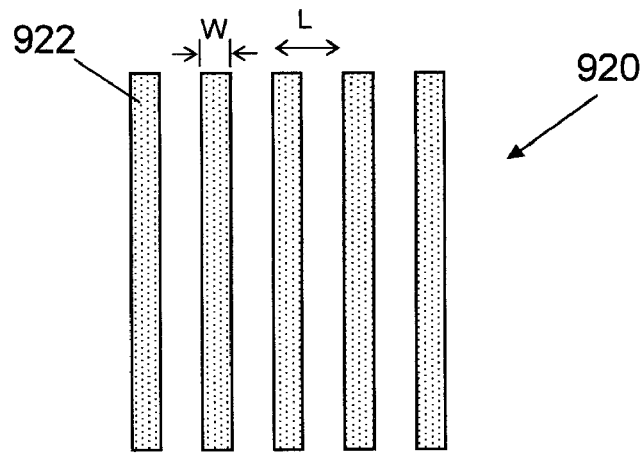
FIGS. 20(A)-(H) and 21 are diagrammatic illustrations of possible configurations for 1-D and 2-D patterns suitable for use with the patterned energy transfer layer concept.

FIGS. 20(A)-20(H) illustrate a number of possible configurations of 1-D and 2-D patterns suitable for use with the patterned energy transfer layer concept. FIG. 20(A) shows a top view of a portion of an array 920 of lines 922, such as that exemplified by patterned energy transfer layer 902 of FIG. 19. Each of lines 922 has a width W and array 920 has a pitch L. In general, enhanced absorption may be achieved with a variety of shapes that exhibit a high aspect ratio, such as arrays of pillars with high aspect ratio. Likewise, arrays of pyramids, cones or V-shaped grooves can also produce high absorption. The lateral dimensions or length scale of the patterning may refer to any of the size of an element of patterned region, the gaps between elements of the patterned regions, or the pitch or period of elements within a patterned region. In typical applications, L will be between 1.1 W and 10 W.

Figure 20B:
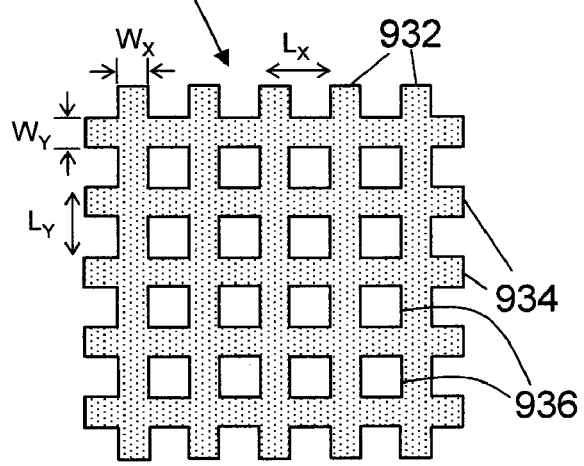
Figure 20C:
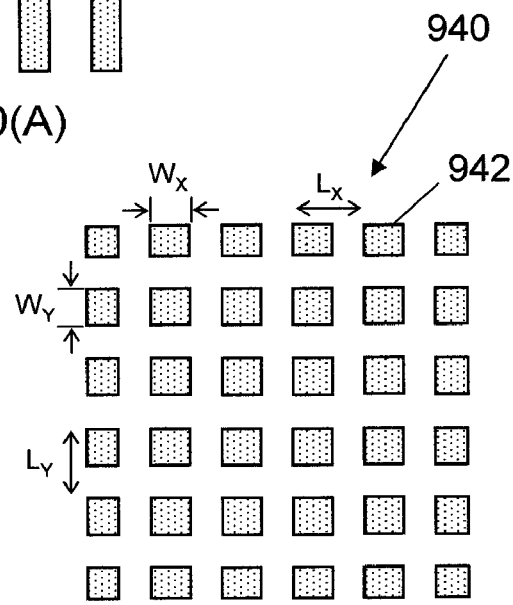
Figure 20D:
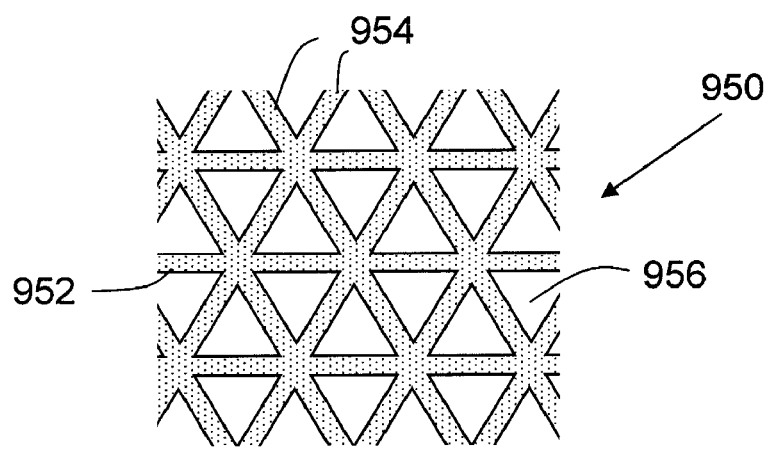
Figure 20E:
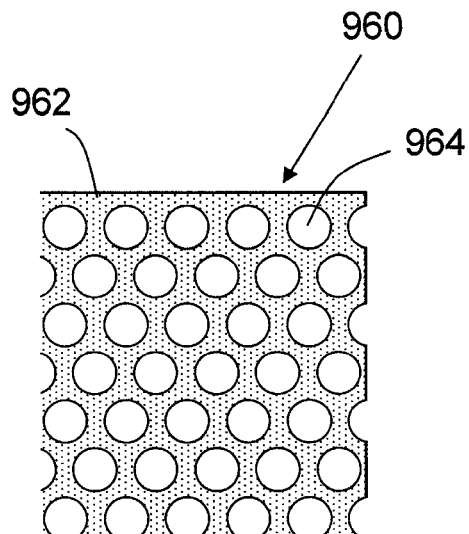
Figure 20F:
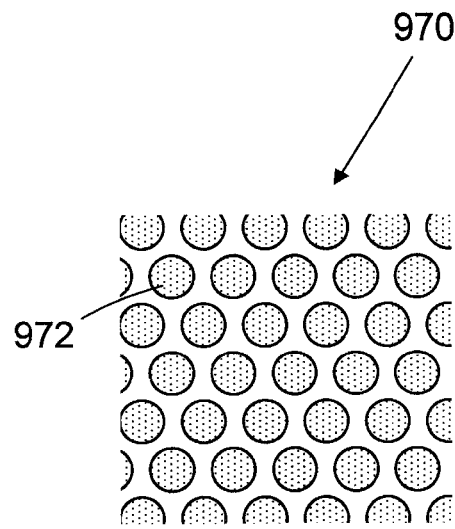
Figure 20G:
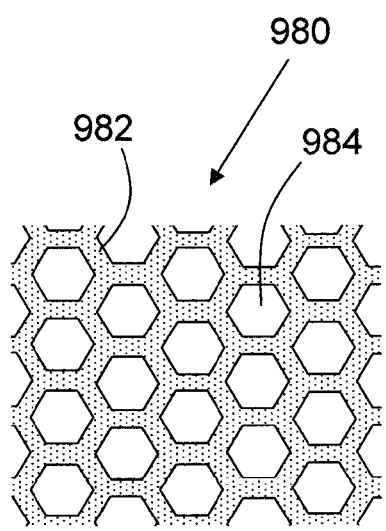
Figure 20H:
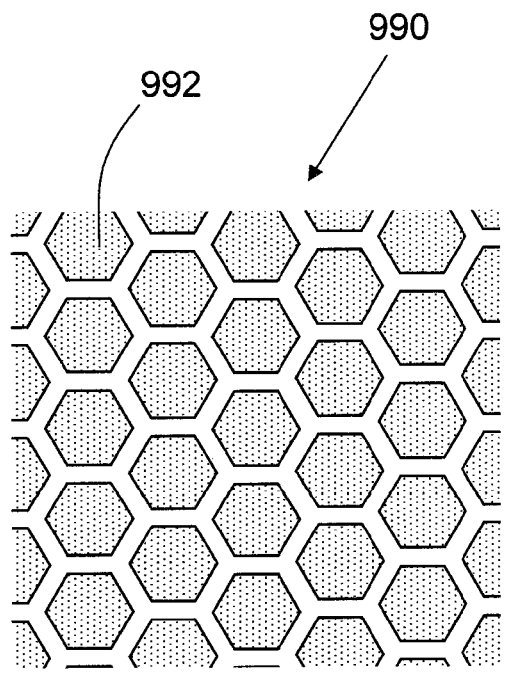
Figure 21:
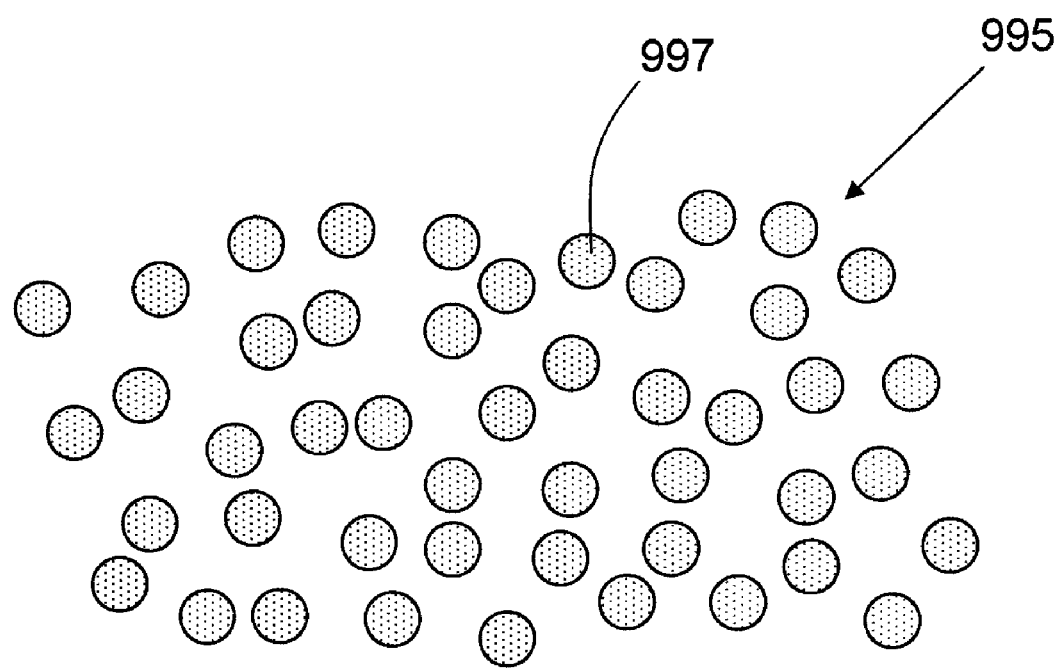

For 2-D arrays, there may be different periods $L_X$ and $L_Y$ describing the repeat length in different directions, and there may be more than one dimension such as W describing the shape of the energy transfer region. For instance, FIG. 20(B) illustrates a pattern 930 of vertical lines 932 (with line width $W_X$ and period $L_X$) and horizontal lines 934 (with line width $W_Y$ and period $L_Y$) forming a plurality of rectangles 936. As a variation, FIG. 20(C) shows a pattern 940 formed of a plurality of rectangles 942 (with horizontal width $W_X$ and vertical width $W_Y$ as well as horizontal period $L_X$ and vertical period $L_Y$). FIG. 20(D) shows a pattern 950 including a plurality of horizontal lines 952 and a plurality of angled lines 954, which cross horizontal lines 952 at acute angles so as to form a plurality of triangular void regions 956. Similarly, FIG. 20(E) shows a pattern 960 including an energy transfer layer 962 with a plurality of circular void regions 964. A pattern 970 shown in FIG. 20(F) is essentially a negative complement of pattern 960 of FIG. 20(E), where pattern 970 includes a plurality of circular regions 972 of absorber material. Likewise, FIGS. 20(G) and 20(H) illustrate energy transfer layers formed with a honeycomb pattern. In FIG. 20(G), a pattern 980 includes an energy transfer layer 982 with a plurality of hexagonal void regions. FIG. 20(H) shows a pattern 990, which is complementary to pattern 980 of FIG. 20(G) and includes a plurality of hexagonal regions 992 of absorber material. Patterning may also be performed in a random fashion, as illustrated in FIG. 21, which shows a pattern 995 including a plurality of circularly shaped regions of absorber material arranged in a random layout.

In many cases, optimization of absorption characteristics must consider the wavelength spectrum of the energy source heating the wafer. Although FIG. 19 suggests an approach that enhances absorption through a mechanism based on considerations of geometric optics, such patterning may still be effective even when the wavelength of the incident radiation is comparable to, or even larger than the length scale of the patterning of the film. This effect is a result of the fact that such patterning may alter diffraction effects and may also create a layer with modified optical properties. Usually, it is useful for the length scale of the patterning to be in a range between $0.01\lambda_A$ and $100\lambda_A$, where $\lambda_A$ is a wavelength that characterizes the incident energy spectrum. For example, $\lambda_A$ may be defined through Equation (9) above, or in the case of heating with a laser, it can be the laser wavelength. For example, when the heating energy is emitted by an arc lamp, the lateral patterning for an effective energy transfer layer pattern may exhibit a length scale in a range between 0.01 µm and 10 µm.

In general, whenever patterning is used to enhance the performance of an energy transfer layer structure, the pattern should have lateral dimensions that are small compared to the length scale for thermal diffusion in the substrate during the time period in which the high-energy radiation is incident on the surface. This dimensional condition ensures the patterning itself does not introduce significant thermal non-uniformity in the heating of the wafer substrate. For example, if the high energy radiation is applied for a pulse length $\tau_p$, and the thermal diffusivity of the wafer substrate material is $D_W$, then the thermal diffusion length $L_d$ is $\sim(D_W\tau_p)^{1/2}$. If the heating processing is performed with a radiation pulse of ~1 ms in duration, then, for a silicon substrate at ~800° C., a typical value of $L_d$ is ~100 μm. It is desirable that the lateral features of the patterning are less than ~$L_d/4$ or, even better, much smaller (e.g. <~$L_d/10$). For typical applications, this condition will require that the lateral dimensions of the patterning will be <10 μm. In random patterns, such as pattern 995 of FIG. 21, the patterning may vary in density over short length scales. However, for uniform coupling of energy, the fraction of the area filled by the absorber material should remain approximately constant over the wafer surface for length scales greater than $L_d$. Hence, if the filled fraction in a given area of $L_d^2$ is measured at two different locations of the wafer (e.g. at the centre of the wafer and at an edge of the wafer), then the filled fraction should be similar at the two locations. This principle of filled fraction also applies to regular patterns, although this condition is automatically fulfilled if the pattern is truly regular across the wafer surface.

Patterning may also help to create an energy transfer layer having effective optical properties that differ from those of the absorber material itself. Therefore, patterning may be used to enhance optical absorption, for example, by tailoring the optical properties of a patterned film to additionally serve as an anti-reflection coating. In such applications, the length scale of the patterning should be relatively small (e.g., less than $2\lambda_A$ or even less than $\lambda_A$). This approach to forming an anti-reflection coating is sometimes called the "moth-eye" effect. Additionally, the shapes and orientation of the inclusions, pores or patterns can play a part in the net optical response of the layer. The effects of different inclusions, pores, patterning, surface texture and other spatial variations on optical properties may be assessed through electromagnetic field modeling or through simplified approaches such as the Brugemann effective medium approximation or the Maxwell-Garnet effective medium theory.

Several other feature size-related phenomena, such as antenna effects, resonant plasmon excitation and quantum confinement effects, may be used to enhance absorption in patterned structures. Some of these phenomena may selectively increase energy absorption at a specific wavelength. For example, selection of feature size may allow tuning of the wavelength at which absorption is to be maximized by, for instance, a resonant condition or an antenna effect, which is dependent on the relationship between the feature size to the wavelength of the incident radiation.

Patterning of a transparent energy transfer layer may also be beneficial by, for example, making the transparent film less susceptible to strong interference effects that produce large modulations of reflectivity depending on the film thickness and the incident wavelength. Optimization of the design of such transparent energy transfer layers may be performed, for instance, by electromagnetic field modeling. Properties of patterned structures may also be evaluated through calculations based on Mie scattering theory or other approaches of scalar or vector electromagnetic scattering theory that may be used to assess the optical responses of grating structures.

Approaches for tuning absorption across the wafer surface based on patterning of a deposited film structure have the advantage that the local nature of the patterning may determine the absorptivity in a localized area without the need for deposition of multiple materials or structures. This advantage enables the formation of regions of different absorbing conditions across a wafer and, furthermore, may simplify the selection and optimization of absorption conditions on different wafers.

Use of Surface Layers to Simplify Temperature Measurements

It is known that variations in optical properties of an object that arise from the presence of surface films and patterns are problematic for the absorption of the heating energy, and such variations also make the interpretation of pyrometric temperature measurements difficult. Pyrometers function by interpreting the magnitude of the thermal radiation emitted by the object in a specified wavelength range (often referred to the as the pyrometer wavelength $\lambda_{pyro}$) as an indicator of the temperature of the object. For a blackbody, which is defined to be a perfect radiator and exhibits an emissivity of unity, the emission spectrum is given by the Planck radiation function. However, the emissivity of real materials is usually not unity and, therefore, real materials emit less radiation than a blackbody. For opaque objects, the emissivity at the pyrometer wavelength, for a given angle of incidence and state of polarization, is given by the equation:

$$\epsilon(\lambda_{pyro}) = [1 - R(\lambda_{pyro})]. \qquad (12)$$

where $R(\lambda_{pyro})$ is the reflectivity of the object's surface at the pyrometer wavelength and the same given angle of incidence and state of polarization. Without prior knowledge of the emissivity of the object and appropriate correction, interpretation of pyrometer measurements may be erroneous for the object. For semiconductor wafers, the variations in emissivity due to variations in optical properties may be large, thereby giving rise to large temperature measurement errors.

Various approaches have been developed to overcome this problem of temperature measurement error. For example, in situ measurements of the emissivity of a particular object may be made.

Applicant has recognized that the concept of energy transfer layers may be used to aid in the measurement of the temperature of the wafer during processing. For example, coating the wafer with an energy transfer film that provides a known emissivity may be useful in temperature measurement. In this case, the emissivity of the coated wafer at the operating wavelength of the pyrometer used for temperature measurement becomes an important parameter in the design of the energy transfer layer. This emissivity value at the pyrometer wavelength should not be too low because a low emissivity leads to a reduced magnitude of thermally emitted radiation at that wavelength. For example, it is desirable if the emissivity of the coated wafer at the pyrometer wavelength is at least greater than 0.2 and, even better, greater than ~0.7 and approaching unity. In this regard, an AR coating that reduces the reflectivity of the coated wafer to close to zero at the pyrometer wavelength increases the wafer's emissivity to near unity. An energy transfer layer that is highly absorbing and also exhibits a low reflectivity at the pyrometer wavelength makes a good coating for improving the performance of the pyrometer system.

The selection of the pyrometer wavelength is usually made on the basis of the strength of the thermally emitted signal, the temperature range that needs to be covered, the accuracy and resolution needed in the measurement, the nature of stray (interfering) light or radiation sources that may be present, and choices relating to the optics, radiation sensors and electronic systems that are to be used in the pyrometer system. The use of an energy transfer layer may also allow flexibility in the selection of the pyrometer wavelength, for instance, if the energy transfer layer is designed to provide a high emissivity at a wavelength at which the wafer itself does not exhibit a high emissivity. In this way, the pyrometer wavelength selection may be decoupled from issues related to the optical properties of the wafer itself. An energy transfer layer with a high emissivity may also help the pyrometer measurement by increasing the strength of the thermally emitted radiation, thereby making the radiation emission more consistent when different wafers are processed or when different regions of the same wafer are measured and reducing the stray light reflected from the wafer surface at the pyrometer wavelength.

The energy transfer layer may also help ensure that the thermally emitted radiation that is sensed by the pyrometer originates from near the surface of the wafer and, therefore, is representative of the surface temperature. This feature is important, for example, if the wafer is otherwise transparent or semi-transparent at the pyrometer wavelength. In such a case, thermal radiation from below the surface of the wafer may be transmitted and, if there is a significant temperature gradient through the thickness of the wafer, then the interpretation of the emitted radiation signal in terms of temperature becomes complex. This situation may be remedied by providing an energy transfer layer with a fairly large absorption coefficient at the pyrometer wavelength used to sense the surface temperature.

As an example of such a use of the energy transfer layer, it is known that, during a pulsed heating process used for annealing ion implantation damage on a millisecond time scale, the temperature gradient in the substrate is very large. Consequently, it is desirable to ensured that the thermal radiation sensed by the pyrometer emanates from a region of no more than ~10 µm in depth below the wafer surface. For the radiation sensed by the pyrometer to mainly come from a depth of less than $d_{pyro}$, the absorption coefficient at the pyrometer wavelength $\alpha(\lambda_{pyro})$ should be such that $\exp[-\alpha(\lambda_{pyro})d_{pyro}]$ is <~0.3. That is, in order to meet the ~10 µm requirement suggested above, $\alpha(\lambda_{pyro})$ should be at least 1000 cm$^{-1}$. If the measured temperature is even more specific to the surface (e.g., the temperature measurement must be representative of the temperature within 1 µm of the surface), then an even higher value of absorption coefficient at the pyrometer wavelength should be selected (e.g. 10,000 cm$^{-1}$ in this case).

It is recognized that a selected one of the absorption coefficient criteria, as discussed above, may generally be applied to the problem of temperature measurement in processes that heat wafers in a manner which produces a significant gradient in temperature through their thickness, regardless of whether an energy transfer layer is used. For example, if the wafer surface is plain silicon, the wavelength used for temperature sensing may be selected to ensure that the absorption coefficient at the selected wavelength is high enough to meet the abovementioned requirement that the measured temperature is the temperature at or at least within a specified depth below the wafer surface. This wavelength selection may also depend on the range of temperatures being measured because the absorption coefficient of silicon varies significantly with temperature.

Such aspects of wavelength and temperature dependence of the absorption coefficient should also be considered in the design of energy transfer layers. The optical properties of the energy transfer layer at the pyrometer wavelength may be optimized by optical design approaches commonly used in the development of thin film coatings. The energy transfer properties may also be optimized and tested through optical measurements performed at the pyrometer wavelength or within the spectral region in which the pyrometer system is configured to function. These optical measurements may be, for instance, direct measurements of the spectral emissivity or the reflectivity at the pyrometer wavelength. The absorption coefficient of the energy transfer layer may be evaluated by measuring the optical constants of the absorbing film by, for example, ellipsometry. Transmission and reflection measurements of energy transfer films may also be used to obtain information about the absorption spectrum of the absorbing film.

Non-Optical Properties of Coatings for Enhanced Absorption

If the incident energy for heating is absorbed in an energy transfer layer, heat must diffuse through the energy transfer layer and to the device structures. A thick energy transfer layer may give rise to a large temperature gradient within the energy transfer layer and, consequently, the device structures may not be heated efficiently. This problem may be alleviated by using a relatively thin energy transfer layer and/or by using an energy transfer layer with a high thermal conductivity, $k_{abs}$.

An assessment of the vertical temperature gradient through the energy transfer layer may be made by considering the incident power density, P. A rough estimate of the temperature drop across an energy transfer layer of a thickness $d_{abs}$ may be obtained by the quantity $P \cdot d_{abs}/k_{abs}$. While this simple analysis is strictly only valid for a steady-state condition, it may provide guidance in the selection of materials for use as the energy transfer layer. Typically, the temperature drop through the energy transfer layer should be relatively small compared to the temperature rise that is being induced in the device structures. This condition makes the heating process less sensitive to fluctuations in the energy transfer layer thickness or thermal properties.

Although conduction of heat is usually the dominant heat transfer mechanism within energy transfer layers, heat transfer by radiation or by conduction/convection in a gaseous medium may also play a part in the heat transfer for certain types of structures. For example, heat transfer by radiation is greater through a medium in comparison to through free space because radiant power density increases by the square of the refractive index of the medium. Furthermore, the flow of heat between objects disposed very close together is enhanced by electromagnetic wave phenomena. Namely, evanescent waves of the electromagnetic fields within objects disposed with small separations may allow energy transfer therebetween that are far larger than would be expected from the Stefan-Boltzmann law for thermal radiation. Such alternative heat transfer mechanisms alter the heat flow within patterned structures or porous materials. They also enable the use of an energy transfer structure that is not directly in physical contact with the wafer, so long as its separation from the wafer is small enough to allow strong heat coupling through the mechanism of evanescent fields. The criterion for efficacy of heat transfer by evanescent fields is that the separation of the energy transfer structure from the wafer is less than ~2300/$T_Z$ in units of µm, where $T_Z$ is the temperature of the energy transfer layer in K. Such considerations may also be used to optimize the temperature homogeneity within patterned structures used for energy absorption. For example, at a processing temperature of 1200K, heat transfer through gaps of <~2 µm will be affected by this type of radiative heat transfer effect.

Several other physical characteristics of the energy transfer layer must also be considered. For example, the energy transfer layer should maintain its physical integrity for at least the duration of the incident energy. Furthermore, the energy transfer layer should not melt, boil or flake off in an uncontrolled manner during processing. In particular, for most thermal processing, the energy transfer layer should not melt at temperatures below 1400° C., although this limit may be lower (e.g., 1350° C. or 1300° C.) for some annealing applications. Similarly, the energy transfer film should be strong enough to withstand the stresses induced by heating, and it should have good adhesion to the layers on which it is deposited.

The energy transfer layer structure also should not introduce undesirable metal contamination to the wafer. In this regard, it may be necessary to incorporate diffusion barriers in the structure, especially between the sub-layer of absorber material in the energy transfer layer structure and the sensitive device structures below it. A capping sub-layer above the sub-layer of absorber material in the energy transfer layer structure may also be useful in preventing outgas of impurities. Diffusion barriers and/or capping sub-layers may also be included on the back of the wafer if there is a risk that impurities may be transferred to the wafer via through the wafer backside. Such additional layers, however, should not compromise the heating process or the action of the energy transfer layer by, for example, altering the optical or thermal properties of the energy transfer layer or the wafer in an undesirable manner. In any of the designs described in this disclosure, the collective response of the elements of the design should be analyzed to ensure overall performance.

In some cases, it may be useful to configure the energy transfer layer to undergo transformations as a result of heating application. For example, structures on the wafer may assist processing by acting in effect as "switches" that regulate the absorption of energy through changes in their reflectivity or through a material phase change, as taught in the art. Although such approaches have not been generally accepted in manufacturing as a result of their perceived complexity and additional costs, there may be some value to such approaches in certain specialized applications. A layer of an alloy of silicon and germanium, for instance, may be used to provide a phase switch that melts at a predetermined temperature below the melting point of silicon. Such a phase switch layer may be grown in either a crystalline, polycrystalline or amorphous form, depending on the application. The phase switch layer will absorb latent heat when it melts so as to reduce the tendency of a particular region of the wafer to overheat. The melting point may be selected by controlling the composition of the alloy and/or by including additional elements, such as Sn or C or dopant species such as B, As or P, if so desired. The thickness of the phase switch layer may be varied to provide customized thermal control over the temperature rise. Such an energy transfer film may also be used to affect optical coupling by virtue of the fact that its reflectivity rises abruptly when it melts. This reflectivity change may be used to provide a type of feedback to an optical energy source, such as by reducing the power coupled to the wafer when such a change is detected.

There are also practical considerations to take into account in the selection of energy transfer layers. Energy transfer layers should be formable in a reasonably fast and cost-effective manner, and they should be removable after processing, if necessary. The processes used for deposition and removal also should not decrease the yield of working devices or cause undesired changes in the device structure.

Candidate Materials for Energy Transfer Layers Functioning as Absorber Layers

While the choice of absorber materials has thus far been discussed incidentally, a more systematic analysis illustrates the optimization process and introduces new possibilities. The following section relates specifically to the application of non-transparent energy transfer layers to improvements in coupling of energy from lamps and lasers.

The first issue of interest in energy transfer layer design is the consideration of radiation absorption. As earlier discussed with reference to FIGS. 10 and 11, it is recognized that many materials may only absorb radiation over a limited range of wavelengths, and, consequently, some materials may function as an energy transfer layer for one source of radiation while acting as a transparent film for a second wavelength range or a second source of radiation. However, while Applicant recognizes the utility of transparent films as discussed above, the present section focuses on the absorptive qualities of candidate materials for illustrative purposes.

First considering absorption of radiation from energy sources with a spectral component at wavelengths greater than 4 μm, layers of silicon oxides, in particular silicon dioxide, are useful as an energy transfer layer because this material becomes absorbing at those wavelengths. These materials may be especially useful when the irradiation source is a $CO_2$ laser that emits radiation at a wavelength of 10.6 μm or, more generally in the wavelength range between 9 and 12 μm. Other dielectric materials such as, for example, doped-glass layers, may also be useful as energy transfer layers. These materials may also be based on $SiO_2$ but other elements are additionally included therein in order to modify the properties. Such dopant elements may include, for instance, B, As or P. The presence of these dopant elements introduces additional absorption features in the absorption spectrum of doped glass and, therefore, these materials may serve as useful additions for an energy transfer layer design. In general, the absorption spectrum of any energy transfer layer material may be altered by doping with any element that introduces additional absorption features. Dielectric materials may include oxides other than silicon oxide. Other suitable materials include, but are not limited to, germanium oxide, tin oxide, aluminum oxide, boron oxide, hafnium oxide, zirconium oxide and ytterbium oxide. Mixtures of oxides may also be useful in an energy transfer layer, and such mixtures may also be incorporated in glass layers applied to the surface of the wafer. Furthermore, dielectrics may also be other types of compounds such as nitrides. For example, silicon nitride may also be useful as a component in an energy transfer layer structure, particularly if the energy source delivers radiation at wavelengths greater than 5 μm. Other nitrides, such as boron nitride or carbon nitride may also be useful in certain applications.

For radiation at shorter wavelengths in the ultraviolet (i.e., 1 nm to 0.39 μm), visible (i.e., 0.39 μm to 0.78 μm) and near infra-red (i.e., 0.78 μm to 4 μm) wavelength ranges, a variety of other absorber materials may be useful. In fact, semiconductor materials may themselves be useful energy transfer layers for certain wavelength ranges. It is known that semiconductor materials typically exhibit high optical absorption coefficients at wavelengths for which the corresponding photon energy is larger than the band-gap of the semiconductor material. However, semiconductors may be useful at longer wavelengths, especially if they are doped. For instance, doping a semiconductor material with electrically active donors or acceptors introduces free charge carriers that may absorb radiation through the phenomenon of free carrier absorption, which allows semiconductors to absorb radiation in the infra-red, millimeter wave and microwave regions of the electromagnetic spectrum. The doping may be optimized by the selection of appropriate resistivity, dopant carrier concentration and species. For example, the absorption of infra-red radiation by a semiconductor may be significantly increased by including more than $3 \times 10^{17}/cm^3$ of B, As, P, Ga, Sb or In atoms in the semiconductor. Also, if the radiation source is a carbon-dioxide laser emitting radiation at a wavelength near 10.6 μm, then a dopant concentration of at least $10^{18}/cm^3$ should be used, although the exact value of suitable dopant concentration depends on the thickness of the energy transfer layer. In general, the strength of absorption may be enhanced by increasing the dopant concentration. For radiation in the spectral range between 0.7 and 20 μm, improved performance may be attained through dopant concentrations above $5\times10^{18}/cm^3$, and even above $10^{19}/cm^3$. In some cases, even higher concentrations of dopants may be required, e.g. $>10^{20}/cm^3$ in order to achieve increased absorptivity at a given wavelength. Dopants may be introduced, for example, during deposition of the semiconductor by processes such as, but not limited to, ion-implantation and diffusion from a gaseous source or a solid source applied to the surface of the semiconductor.

Some semiconductor materials also exhibit strong absorption features as a result of lattice absorption, a mechanism by which the incident energy induces lattice vibrations that are associated with energy absorption. Based on this mechanism, different semiconductors are likely to be useful for different types of energy sources, depending on the wavelength or spectral distribution of the selected energy source.

Generally, energy transfer layers may be formed from any semiconductor material such as, but not limited to, silicon, germanium, silicon carbide, gallium arsenide, indium phosphide, aluminum arsenide, gallium phosphide, gallium nitride and indium nitride and alloys thereof. For example, use of alloys of silicon and germanium allows tailoring of the absorption spectrum by tuning the band gap of the alloy semiconductor and, consequently, tuning the onset of strong optical absorption. Alloying approaches may also be used in mixtures of Al, As, Ga, In and P to create a range of materials with various band gaps. Similar principles can be used in other semiconductor mixtures such as various mixtures of Ga, In, Al and N.

Semiconductor materials may be applied in various structural forms. The optical absorption of semiconductors is usually affected by the microstructure as well as by the chemical composition of the semiconductor. For example, semiconductor energy transfer layers may be amorphous, such that there is no long-range order in the atomic microstructure, or in a single crystal form, in which the atoms are located on a regular crystalline lattice. The semiconductor material may also be polycrystalline in form, such that it consists of many small grains of crystal but the crystals are not all perfectly aligned in orientation. If the crystals are very small, the semiconductors may be described as microcrystalline or even nanocrystalline. The optical absorption is also affected by the presence of defects in the crystal structure or by impurities, including the various dopant species mentioned above. In some materials, the effects from defects can be strongly affected by the presence of other species. For example, the incorporation of hydrogen atoms in amorphous silicon is believed to tie up dangling bonds, leading to significant changes in the electrical and optical properties. Such modifications may be useful in optimizing physical characteristics of the energy transfer layer.

Energy transfer layers may also be formed from metals, metal alloys and other electrically conducting materials. These metallic materials often exhibit very high absorption coefficients over a wide range of wavelengths from the UV to the far infra-red and even millimeter-wave and microwave regions of the electromagnetic spectrum. Metallic compounds such as nitrides, phosphides, borides, silicides, germanides, carbides and nitrides may also exhibit similar properties. Typical metals may include Ti, W, Mo, Pt, Rh, Ni and Ta, and typical metal compounds include nitrides or carbides of Ta, Ti, W, Nb, Zr, Hf and tungsten silicide, molybdenum silicide and tantalum silicide. These materials exhibit high melting points, which may be useful for thermal processing. Many metals are also generally good reflectors of radiation, so reflectivity of the energy transfer layer must be carefully tailored, for example, through selection of the metal, alloying, anodization or coating of the metal. Surface texture may also be customized by, for instance, patterning as illustrated in FIGS. 20 and 21. The use of metals is somewhat complicated by the possibility of metallic contamination entering the substrate, although the use of diffusion barriers can alleviate this potential problem.

Carbon Based Energy Transfer Layers

The use of films that incorporate carbon as energy transfer layers provides some special opportunities for integrating energy transfer layers into the device manufacturing process. Carbon is of special interest in the realm of semiconductor processing because of its ability to withstand high temperatures combined with the wide range of ways it may be formed on a wafer. Furthermore, a carbon layer may be removed from a wafer surface by an oxidation process that may be conveniently combined with the thermal processing step. It is also possible to use the heat released from the exothermic oxidation of the carbon as an energy source that can assist the thermal processing step, as discussed above with regard to the energy transfer layer processing concept.

Carbon layers may be formed with various structures including crystalline forms, such as graphite or diamond, as well as amorphous and polycrystalline forms. Carbon may be deposited on a wafer by a variety of approaches. For example, pyrolytic carbon may be formed on a heated substrate by a CVD process. Conventional evaporation and sputtering approaches may also be used to deposit films of carbon. Carbon films may also be formed by conversion from other organic materials by thermal and/or chemical processing. They may be formed in porous forms, foams, aerogels and as carbon black or soot. Various terms are used in the literature to describe different carbon films including the terms vitreous carbon (or glassy carbon), pyrolytic carbon and synthetic carbon. The amorphous form of carbon is sometimes called diamond-like carbon (DLC), and it is also sometimes referred to as a-C. One category of amorphous carbon is sometimes referred to as a-C:H, with the H signifying that the film has been formed by processes which yield an amorphous carbon film with a large amount of hydrogen within it. There are also existing approaches for forming a-C that do not incorporate large amounts of hydrogen. Carbon may also take the form of fullerenes, nanotubes and other atomic arrangements. It may also be formed in mixed forms, in which various structures are intermingled in a single film.

The diamond and diamond-like forms of carbon exhibit some characteristics of semiconductors, such as a band gap. The electrical and optical properties of diamond and diamond-like carbon may be altered by doping and through the introduction of defects and impurities, in a manner similar to the behavior for silicon and amorphous silicon. For example, diamond and diamond-like carbon may be doped with boron, phosphorus, fluorine or nitrogen. However, diamond has a much larger band gap than silicon and, hence, it tends to be highly transparent at wavelengths greater than 0.22 μm. Diamond does, however, have the advantage of having a very high thermal conductivity. The optical properties of diamond and DLC may be modified by doping, by introduction of defects and other structural modifications such as inclusions of other types of carbon.

Diamond films are usually formed by chemical vapor deposition processes, but the formation of diamond usually requires rather high process temperatures (i.e., in excess of 700° C.) so this approach imposes an extra thermal budget that may not be desirable in a semiconductor device fabrication process. Furthermore, although diamond has good thermal, mechanical, diffusion barrier and chemical qualities, it is a poor absorber of most optical and infra-red radiation and, therefore, is usually not the ideal choice for an absorber material, unless it is structurally modified by, for instance, doping or defect introduction. Such defects may be introduced by processes such as ion-implantation. Although the transparent form of diamond and DLC would not serve well as a traditional absorber material, it is still useful in the applications presently considered if applied with sufficient thickness to introduce many interference fringes in the reflection spectrum for a broad-band energy source. Furthermore, the high-thermal conductivity tends to smooth out the non-uniformity in the surface temperature because heat diffuses very rapidly sideways through the diamond film.

DLC and amorphous carbon are advantageous because they can be deposited at low temperature. Such films are often formed by depositing carbon in combination with energetic bombardment. The optical properties of these materials depend greatly on the deposition conditions and subsequent heat treatment. The carbon atoms may exhibit a variety of interatomic bonds, including a mixture of $sp^3$ (diamond-like, tetrahedral bonding) and $sp^2$ (graphitic, trigonal bonding) types of bonding. The $sp^3$ bonding is the type of interatomic bonding usually found in diamond, whereas the $sp^2$ bonding is a type of interatomic bonding found in graphite within the sheets of carbon atoms that make up the graphite lattice. The $sp^2$ bonding in graphite tends to be associated with higher optical absorption, and graphite is highly absorbing for most optical and infra-red radiation. Hence graphite-like a-C films may be advantageous for higher absorption. Processing conditions may be optimized to provide a more graphite-like film, which is more highly absorbing.

The degree of the different types of bonding in DLC or a-C films is determined by the deposition approach and post-deposition processing. Furthermore, the presence of hydrogen in the carbon film has a strong effect on its optical absorption behavior. The optical properties of carbon films may be tuned by tailoring the bonding type and the amount of hydrogen in the film through suitable adjustments of deposition conditions and through post-deposition processing. For example, deposition at higher temperatures tends to lead to a more absorbing film, and post deposition annealing at high temperatures can also yield the same effect. These effects may be advantageous in forming an energy transfer layer. Furthermore, deposition or annealing at temperatures greater than 350° C. may be advantageous, and films with even higher absorptivity may be formed through deposition or annealing at temperatures greater than 450° C. In general, the higher the processing temperature, the more absorbing the film will be, so process temperatures up to ~800° C. may be of value. However, significantly hotter processing might degrade the semiconductor devices unless the thermal budget is reduced through a fast ramp heating approach. Some of the benefits of higher temperature processing may also be achieved through more energetic bombardment of the films with energetic species, either during deposition or post-deposition. The species may include ions, atoms, radicals, electrons and high-energy photons, all of which may change the bonding arrangement in the carbon film. More energetic conditions may be provided by, for instance, using higher power density in the deposition apparatus, a higher species energy, a larger dose, a larger current or a combination of these factors. Processing may involve exposure to an ion-implantation process, a plasma process, a sputtering process, an electron irradiation process, a high-energy photon irradiation process or any other step that introduces bond rearrangements in the film.

Any of the deposition approaches described above may be useful in forming the carbon film, but the processes of plasma-enhanced CVD and sputtering are especially effective. Carbon deposition may be performed by employing various gases to supply the carbon atoms. For example, alkanes such as methane, ethane, propane, butane or other molecules with the formula $C_rH_{2r+2}$, where r is an integer, may be used. Alternatively, alkenes such as ethene or propene, or other molecules with the formula $C_rH_{2r}$, may be used. Moreover, alkynes such as ethyne (acetylene) or other molecules with the formula $C_rH_{2r-2}$, may be used. More complex carbon-containing species may also be used, such as camphor or aromatic compounds such as phenol. Exposure of the wafer to such species, especially in combination with irradiation with energetic species and/or heating will lead to deposition of a carbon-containing film. CVD may also be performed with mixtures of carbon-containing gases together with other gases such as hydrogen, nitrogen, carbon dioxide or argon as required.

The efficacy of any given approach can be assessed by characterization of the deposited energy transfer layers using physical and chemical analysis tools. For example, the reflectance or transmittance may be measured using a spectrophotometer. The optical constants may be measured using an ellipsometer. The nature of the chemical bonding can be assessed by electron energy loss spectroscopy, photoelectron spectroscopy, Auger spectroscopy, Raman spectroscopy, infra-red spectroscopy, near-edge X-ray absorption fine structure measurements. These approaches may be used to assess the degree $sp^3$ and $sp^2$ bonding present in the film.

Carbon films may also be formed on the wafer in a number of other ways. One approach involves the formation of a layer of a compound containing carbon (i.e., an organic compound) on the wafer surface and then converting this layer to carbon through a second process. The organic material may be, for instance, a polymer, a hydrocarbon, a plastic or a resin. One convenient material is a photoresist or another organic compound that is already commonly used in semiconductor manufacturing. Such materials may be conveniently applied to the wafer surface, for example, from a solution in a solvent that is spun-on to the wafer surface to form a uniform thin film. The film may then be converted to carbon by a suitable process such as, for example, a thermal process or any process that exposes the wafer to high-energy radiation. When a thermal process is used to convert a carbon-containing compound to carbon, the process is often called pyrolysis. The thermal process may involve, for instance, heating the wafer to a temperature high enough to convert the organic film to carbon. Many organic materials undergo such transformations when heated to temperatures >300° C., and especially if heated above 400° C. The heating may be conducted in a vacuum or under an inert gas (e.g. He or Ar) environment to suppress oxidation if necessary. Other reactive gas species such as hydrogen or oxygen may be introduced to assist the process if so desired. Typically, if an oxidizing gas is used, the oxygen concentration is kept low enough to prevent extensive oxidation of the carbon formed during the pyrolysis. High-energy radiation may be provided by, for instance, photons, ions, atoms or electrons where the wafer is exposed to an ion-implantation process, a plasma, a high-energy photon source or an electron beam. The high-energy photon source may provide, for instance, ultra-violet radiation. A combination of heating and exposure to high-energy radiation may be used for an even more effective treatment.

For applications in which the carbon film is to be opaque, the carbon films should be at least 100 nm thick, or, even better, at least 300 nm thick. If the films are highly stressed, thereby causing adhesion problems during processing, the carbon film may be co-doped with an element such as Ti to reduce its stress. In other cases, it may be useful to add layers between the carbon film and the substrate, in order to accommodate the stress. Suitable films for this purpose may include, for instance, Ti, TiN, TiCN and TiC. Deposition conditions may also be optimized to provide less stressed carbon films.

Below are additional reactive RTP approach notes regarding methods for removing carbon films (when such films are used as absorber layers or reactive layers). It is noted that one having ordinary skill in the art will associate the following notes with the appropriate discussions above in view of this overall disclosure.

C removal: Consider oxygen containing gases including $O_2$, $CO_2$, CO, $N_2O$, NO, $NO_2$.

Figure 22:
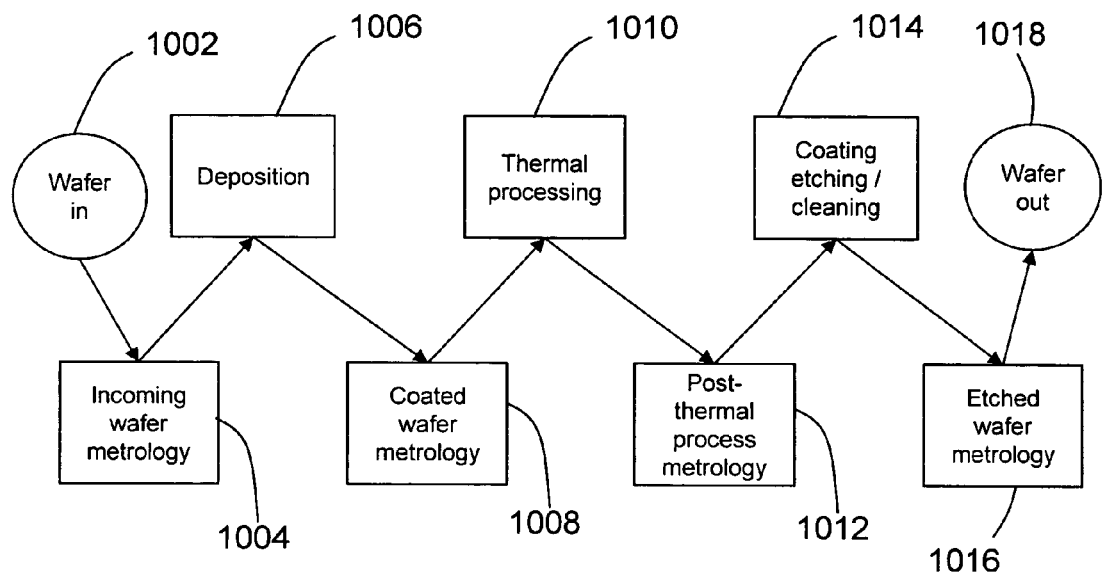
FIG. 22 is a flow diagram illustrating one approach for employing an energy transfer structure in a semiconductor wafer processing work flow.

C-removal: halogen containing gases: $Cl_2$, $Br_2$, $BCl_3$, $I_2$, $BF_3$, $NF_3$ C-removal: Wet etches: RCA etch $NH_4OH/H_2O_2$ then $HCl/H_2O_2$; $H_2O_2$; $H_2SO_4/H_2O_2$ C-removal: $NF_3$ thermal and/or plasma C-removal: Gaseous $SO_3$ C-removal oxidizing etches: $HNO_3$, $KMnO_4$, $ClO_4$ species Approaches for Deployment, Processing and Removal of Energy Transfer Layers FIG. 22 shows a flow diagram illustrating one approach for employing an energy transfer structure in a semiconductor wafer processing work flow. A process flow 1000 begins with the input of a wafer into the processing system in a step 1002. Characteristics of the wafer may be measured in an incoming wafer metrology step 1004. The wafer is then subjected to a deposition step 1006 for coating with the desired materials. The results of deposition step 1006 may be measured in a coated wafer metrology step 1008. A thermal processing step 1010 is then performed, and the results of the thermal processing may be assessed in a post-thermal process metrology step 1012. The coating on the wafer is then etched and/or cleaned in a step 1014, then the etched wafer is analyzed in an etched wafer metrology step 1016 before being removed from the process flow in a step 1018.

Continuing to refer to FIG. 22, in process flow 1000, the input wafer is coated in one process, then thermal processing is performed and, after thermal processing, the coating is removed by etching and the wafer surface is cleaned as necessary. Each processing step may be performed in different processing equipment, if so desired or it is convenient.

Process flow 1000 also includes steps of performing metrology on the wafer between each processing step which alters the wafer properties. These metrology steps allow characterization of the wafer properties so as to ensure that the wafer has been processed correctly in the step immediately preceding that metrology step and that the wafer is in a condition ready for the next processing step. The metrology steps may also be used for measuring characteristics of the wafer for providing information to be used in a later processing step so as to improve the process control in that later step. Metrology approaches may include any of the schemes mentioned so far in the present disclosure including, but not limited to, optical measurements that probe the interaction of the wafer with electromagnetic radiation in a variety of spectral ranges. Other metrology schemes may include electrical measurements, measurements of sound or ultrasonic wave propagation properties, thermal wave propagation measurement, stress measurements, surface analysis of chemical composition or bonding structure and other physical measurements.

For example, incoming wafer metrology step 1004 may measure the optical properties of the incoming wafer and provide that information to deposition step 1006, in which an optimal film thickness to deposit on the wafer may be selected in order to achieve a desired absorptivity for the wafer. Furthermore, it may be possible to bypass deposition step 1006 if the optical properties of the incoming wafer can be measured and that information is provided directly to the thermal processing unit, although such shortcuts may not be adequate to ensure uniform processing of the wafer since an energy transfer layer may still need to be applied to the wafer. Coated wafer metrology step 1008 may measure the optical properties of the wafer in order to ensure that the absorptivity of the film is as desired for the thermal processing operation. Alternatively, the absorptivity characteristics of the coated wafer may be assessed in an indirect manner, for example, through measurement of a film thickness, particularly if the relationship between the film thickness and absorptivity is known. In this way, coated wafer metrology step 1008 may be used to ensure that the absorptivity meets a specified value and that the absorptivity is uniform across the wafer. Coated wafer metrology step 1008 may also ensure that the energy transfer layer thickness is as desired and uniform. Other physical characteristics, such as thermal conductivity and surface texture, may be measured in this step. Another wafer property of interest may be the emissivity of the wafer surface. This property may be analyzed through measurements, for example, of optical properties at a wavelength corresponding to the wavelength of the pyrometer system used for measurement of temperature in the thermal processing tool. For example, the reflectivity at the pyrometer wavelength may be measured and then used to derive the emissivity. Information about the optical and/or physical characteristics of the coated wafer may then be provided to the thermal processing step, to ensure proper performance of the thermal processing cycle.

Post-thermal process metrology step 1012 may assess whether the thermal process achieved a desired objective. This step may also assess the condition of the surface layers such as the energy transfer layer. For instance, the wafer processing objective may include the production of a shallow junction of a specified depth and electrical characteristics. Such wafer qualities may be assessed by direct measurements or by correlation with another parameter that is more easily measured, for example, with a non-contact probe such as an optical probe. As an example, the junction depth can be assessed by measurement of the optical properties of the wafer surface. For such measurements to be performed, the energy transfer layer should either be transparent at the probe wavelength, be removed prior to measurement or be patterned in a manner which allows access to a test area. Although post-thermal processing metrology step 1012 is shown to occur prior to coating etching/cleaning step 1014 in FIG. 22, some or all of the aforedescribed measurements may be included in the etched wafer metrology step instead if, for instance, energy transfer layer removal is necessary. The post-thermal processing metrology step may also assess the condition of the energy transfer layer in order to optimize coating etching/cleaning step 1014. For example, if a part or all of the energy transfer layer was removed during thermal processing step 1010 and the degree of removal may be measured in post-thermal process metrology step 1012, then coating etching/cleaning step 1014 may be deemed superfluous.

Etched wafer metrology step 1016 may assess, for instance, whether any coating to be removed has been removed completely and the wafer is sufficiently clean for subsequent processing.

The aforedescribed metrology steps may be performed at separate locations or within each processing unit, if the appropriate sensors are included within each processing chamber or the associated wafer handling apparatus. For example, if deposition step 1006 is performed in a deposition chamber, the deposition chamber may include a film thickness monitoring system that monitors the deposition process in real time such that the film thickness is to the user's specification. A more direct measurement of the wafer absorptivity may also be performed in situ, and such information may even be used for real-time feedback control of the deposition process. If thermal processing step 1010 is performed in a thermal processing chamber, the thermal processing chamber may include temperature monitoring equipment to ensure that the heating cycle is applied correctly and to provide closed-loop control of the heating process. The film etching equipment for coating etching/cleaning step 1014 may contain in situ film-thickness monitoring equipment to ensure that the film is etched correctly without excessive etching, which may damage delicate device structures beneath an energy transfer layer. For example, if a plasma process is used to etch the film, spectroscopic measurements of the optical emission from the plasma glow may be used to deduce the species that are being etched. The disappearance of a spectroscopic signal corresponding to a particular element within the energy transfer structure may signal complete removal of the energy transfer film and indicate that the etching process should be stopped at that point. Likewise, the appearance of a spectral feature that corresponds to an element in the device structure or an etch-stop or marker layer below the energy transfer layer may signal the etching of the device layers or the etch-stop or marker layer, and hence indicate that the etching process should be stopped.

Figure 23:
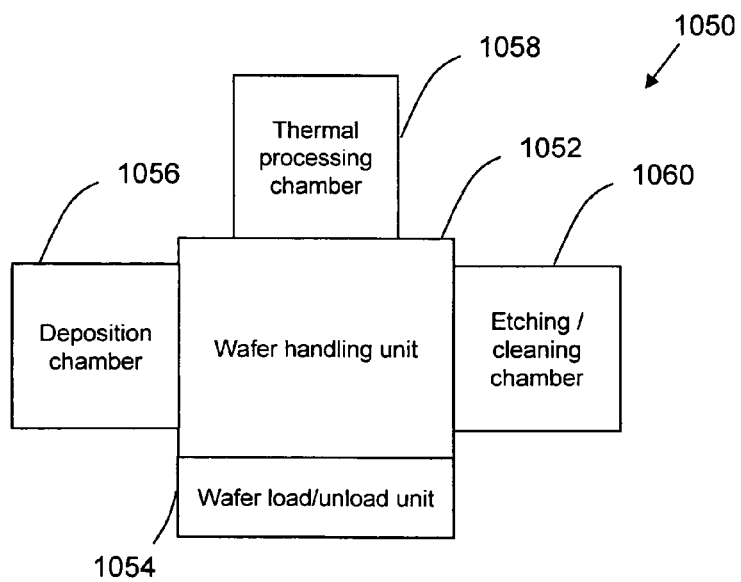
FIG. 23 is a diagrammatic illustration of an integrated processing system in which the deposition, thermal processing and etching/cleaning steps are performed in three separate chambers connected with a central wafer handling unit that passes the wafer between the chambers.

Each step in process flow 1000 may be performed in separate units or within an integrated processing system in which the deposition, thermal processing and etching/cleaning steps are performed in three separate chambers connected with a central wafer handling unit that passes the wafer between the chambers, as illustrated in FIG. 23. As shown in FIG. 23, an integrated processing system 1050 includes a wafer handling unit 1052 which transfers a wafer between a wafer load/unload unit 1054, a deposition chamber 1056, a thermal processing chamber 1058, and an etching/cleaning chamber 1060. The transfer times between processing steps may be closely controlled in integrated processing system 1050 such that the consistency of processing may be improved and queuing of wafers in the production environment may be simplified since all of the processing is contained within an enclosed system. The metrology steps of process flow 1000 may be performed in situ in each appropriate process chamber through conventional optical methods such as by using reflectometers, ellipsometers and spectrophotometers. Alternatively, the metrology steps may be performed during the transfer of the wafer between chambers through the use of metrology equipment incorporated within wafer handling unit 1052. While one or more of the metrology steps may be performed at metrology tools that are not integrated with integrated processing system 1050, an external metrology step can require transfer of the wafer outside the integrated system. In some cases, it may be possible to use a single processing chamber for more than one of the process steps. One possibility is to perform the deposition, thermal processing and coating etching/cleaning steps in a single chamber.

Examples of Energy Transfer Layer Processing Approaches

Figure 24:
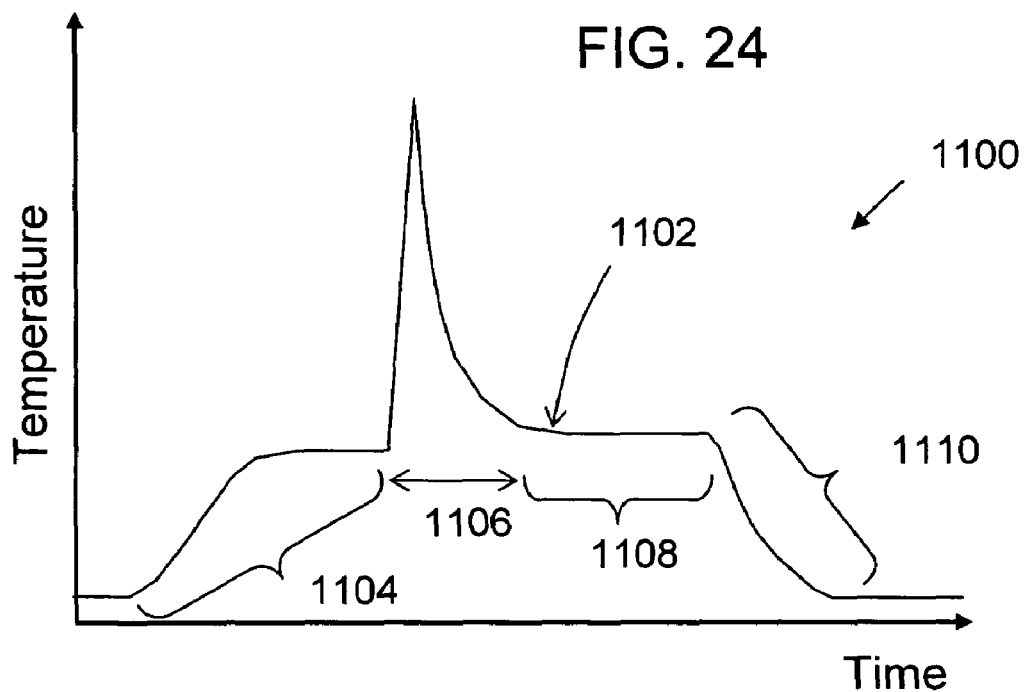
FIGS. 24-28 are graphs showing the thermal cycle schemes for a variety of thermal processing work flows.

FIG. 24 shows an example of a typical heating cycle of the wafer surface used in semiconductor processing. A graph 1100 of FIG. 24 includes a thermal cycle 1102 showing a typical relationship between temperature and time for a semiconductor process flow, such as process flow 1000 shown in FIG. 22.

Thermal cycle 1102 may include a preheating period 1104 (indicated by a bracket). The preheating period may also serve a valuable function with respect to the energy transfer layer, for example, by stabilizing its properties. A high temperature process 1106 (such as a pulse anneal 1106 and/or a prolonged high temperature process period 1108 indicated using a bracket) may impose a large stress on the energy transfer film, and the high temperature may cause the energy transfer film to rupture or flake off. For example, if the energy transfer film incorporates a significant amount of a volatile species, these volatile species may evolve during the heating process and, furthermore, the rapid heating of such species may cause the volatile species to form a highly pressurized gas, thus potentially leading to the formation of bubbles or cracks in the energy transfer film. A relatively prolonged low temperature process, or preheating period 1104, allows such volatile species to diffuse out of the film and further stabilize the energy transfer film properties. This step could be carried out in the tool used to deposit the energy transfer film, within the thermal processing chamber itself or in a separate preheating apparatus. The preheating process should be at a temperature low enough to avoid degrading the device structures while still high enough to stabilize the properties of the energy transfer film, such as at a temperature below 700° C. Thermal cycle 1102 is also shown to include a cool-down period 1110, indicated using a bracket.

Various alternative heating cycle schemes may be used to provide the repeatable and uniform processing enabled by the approaches of the present invention. The main use of the energy transfer layer concept of present invention is expected to be in the improvement of performance in millisecond annealing processes, in which intense pulses of energy are applied to the wafer surface for heating. The present invention provides repeatable and uniform thermal processing in a relatively simple scheme that is cost effective and exhibits a high yield of working devices. The exemplary approaches described immediately hereinafter focus on the three stages of (i) forming an energy transfer layer on the wafer surface; (ii) thermally processing the wafer; then (iii) removing the energy transfer layer.

1) Coat Wafer with an Energy Transfer Layer; Millisecond Anneal; Remove Energy Transfer Layer by Separate Etch Step In this approach, the energy transfer layer structure is formed on the wafer in a deposition chamber by one of the various processing approaches described above. The coated wafer is then loaded into a separate thermal processing apparatus, and the desired thermal process is performed, for example, by use of a thermal cycle as shown in FIG. 24. After the thermal process is completed, the wafer is removed and transferred to yet another chamber where the energy transfer layer structure is removed. This approach may be carried out, for instance, using an integrated processing system shown in FIG. 23 or some variation thereof.

Figure 25:
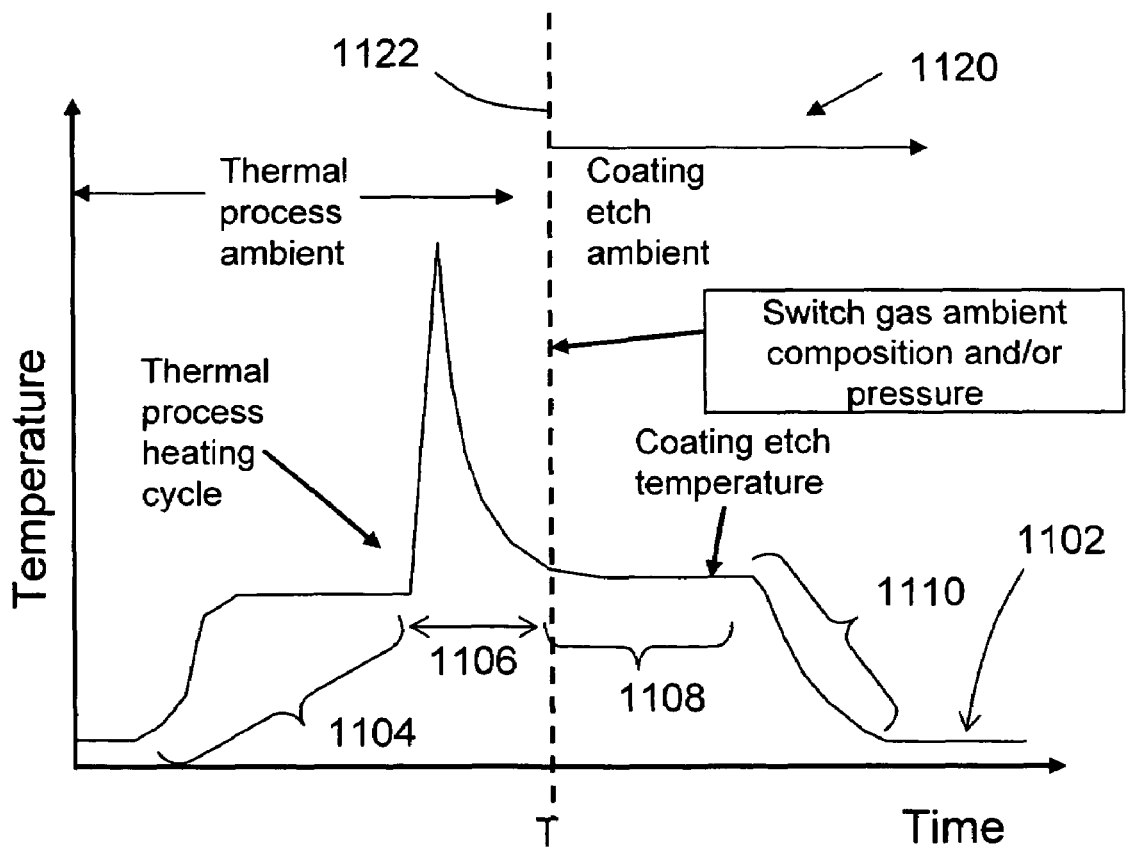

2) Coat the Wafer with an Energy Transfer Layer; Millisecond-anneal and Remove Energy Transfer Layer in situ In this approach, the energy transfer layer is formed in one set of equipment, and then the wafer is transferred to the thermal processing environment. The thermal process and the removal of the energy transfer layer is performed, at least to some extent, in another process chamber. The energy transfer layer removal may be performed, for example, by one of the etching processes described above or by using the aforedescribed energy transfer layer RTP concept of the present invention. For instance, if the energy transfer layer is a film containing carbon, the film may be removed by an oxidation process. FIG. 25 shows a graph 1120 of an annotated heating cycle example where the etching process is performed after the thermal process has been completed. It is recognized that the etching process may alternatively be initiated at any convenient point in the heating cycle.

Continuing to refer to FIG. 25, graph 1120 illustrates the combined timing of temperature changes and gas ambient transitions required for the present example. The temperature increases and decreases still follow the same scheme as thermal cycle 1102 shown in FIG. 24. At a time T, indicated in graph 1120 by a dotted line 1122, following the spike anneal, the gas ambient in the process chamber is changed from a thermal process ambient (present at time less than T) to a coating etch ambient (after time T). The coating etch ambient may differ from the thermal process ambient, for instance, in gas ambient composition and/or pressure such that a single processing chamber may be used for both the thermal processing and coating etch/cleaning process with the gas ambient change.

Still referring to FIG. 25, the ambient change itself may be used to initiate the etching process. For example, the gas ambient may be changed from an inert environment, such as an $N_2$ or Ar ambient, to a reactive gas ambient, such as a gas containing oxygen or halogen atoms, thus initiating the etching processes. Also, the chamber pressure may be increased such that a larger amount of reactive gas species impinges on the wafer surface. Alternatively, the etching process may also be initiated by any of the aforedescribed energy transfer layer RTP approaches. For instance, the etching process may be initiated by exposing the wafer to an energy source such as, but not limited to, high energy photons from a light source, a plasma, or a beam of atoms, ions or radicals. The etching conditions may be monitored by various types of aforedescribed sensor and metrology equipment. Furthermore, the end-point of the etching process may be monitored in situ through the use of such sensors, thus providing closer control of the etching process.

In the example shown in FIG. 25, the etching process is generally shown to take place during the prolonged high temperature period 1108, during which the wafer temperature is held constant. However, the etching process may also occur during cool-down time 1110 of the thermal cycle, if the etch rate is sufficient while the temperature decreases. Otherwise, although FIG. 25 shows the etching process occurring within the same temperature-time cycle as the thermal process, the etching process may also be carried out following thermal cycle 1102 in a separate temperature-time cycle (not shown).

The wafer may be removed from the thermal processing chamber after the thermal processing has been completed. If the energy transfer layer has been completely removed by this point, then the wafer may be transferred to the next step in the manufacturing process. However, in some cases, the thermal processing and the subsequent processing of the energy transfer layer may still leave residual deposits on the wafer surface that may need to be removed by further processing. For example, if the energy transfer layer structure cannot be completely removed by the etching process discussed above, further etching in an additional processing step may be needed. Also, if the energy transfer structure contains several parts such as diffusion barrier or etch-stop layers discussed above, some of these films may not be completely removed by the in situ etching process, thereby requiring further etching processes. Furthermore, in some cases, treatment of the energy transfer structure in the thermal processing chamber may serve to convert the energy transfer structure into a form that is more easily removed by a separate etching process, rather than attempting to etch it away within the thermal processing chamber. For example, an oxide layer may be converted to a metal by reducing the layer with hydrogen gas, and the resulting metal layer may be easier to remove by etching in a separate process. Conversely, a layer of a metal compound may be oxidized to form an oxide, exposed to halogen-bearing species to form a halide, or converted into another form that is more easily removed by subsequent etching processing. The choice of etching steps depends on the materials selected for the energy transfer structure.

Figure 26:
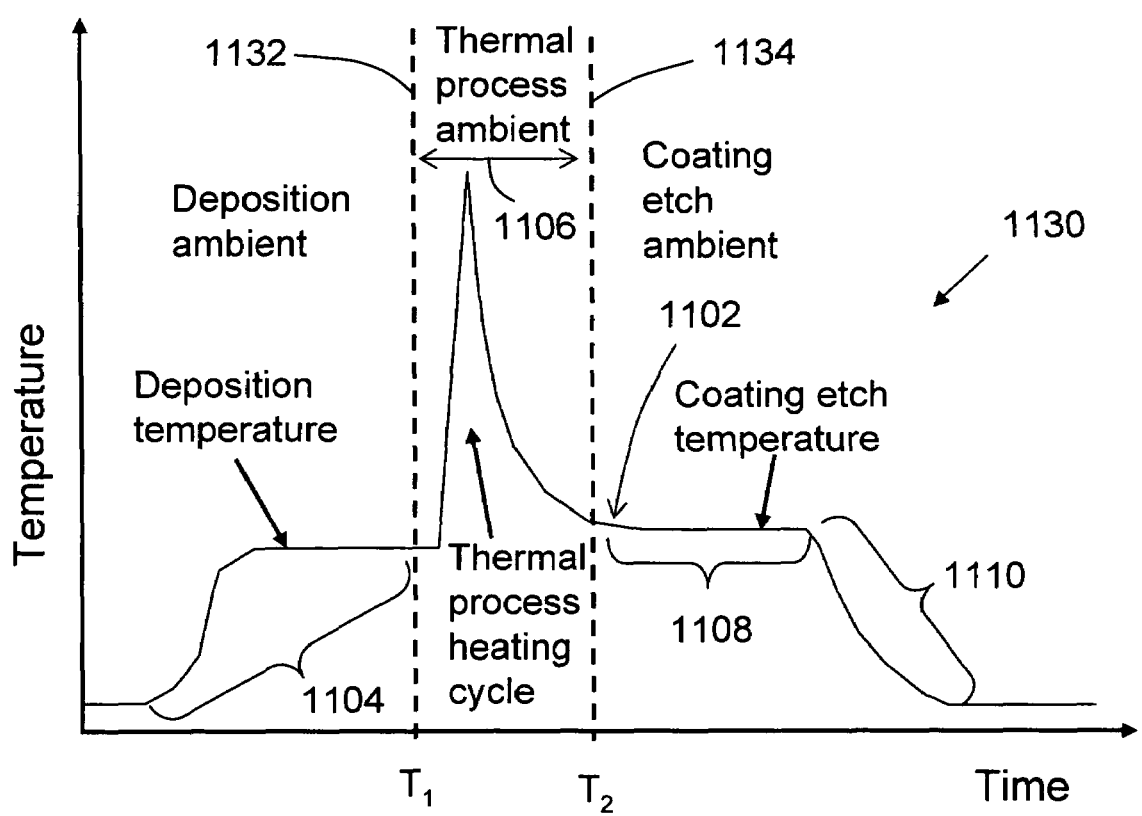

3) Coat Wafer with Absorber Material, Millisecond Anneal, and Remove in Chamber by Oxidation, All in situ This processing approach is similar to 2) above, but it is even more integrated in that the energy transfer structure is at least partly formed by a process performed in the same processing chamber. FIG. 26 shows a graph 1130 illustrating this processing approach in which the ambient may be changed over at two different points in thermal cycle 1102.

In the example illustrated in FIG. 26, the ambient within the processing chamber is initially set to a deposition ambient for performing a deposition process within the chamber to form an energy transfer layer on the wafer. The coating process may be, for example, a CVD process for forming an energy transfer layer containing carbon. The deposition process may be enhanced by exposure to a plasma or other aforedescribed excited species. The deposition process may be monitored using the sensors in the processing chamber, for example, to ensure that a desired film thickness or a given absorptivity value has been obtained. In graph 1130, the deposition is shown to occur during preheating period 1104 before spike anneal 1106. Alternatively, the energy transfer layer deposition may be performed in a separate temperature-time cycle (not shown) preceding thermal cycle 1102, for example, with the wafer being allowed to cool before the start of thermal cycle 1102.

Continuing to refer to FIG. 26, the gas ambient around the wafer is switched at a time $T_1$ (indicated by a dashed line 1132) from the deposition ambient to a thermal process ambient. For example, during the deposition process, the ambient may contain a gas that contains carbon atoms for the purpose of forming a layer of carbon-containing compound on the wafer surface. The presence of this gas may not be desired during the thermal process itself, so the carbon-containing gas may be removed before the thermal processing step. Also, the deposition ambient may be at a given process pressure, which is different from the thermal process ambient, and additional excited species or exciting radiation may be provided at the wafer in order to assist the deposition of the energy transfer structure. Additionally, the gas ambient in the processing chamber may be switched following spike anneal 1106 to a coating etch ambient at a time $T_2$ (indicated by a dashed line 1134). Performing the energy transfer layer deposition, thermal processing and coating etch steps within one thermal cycle within a single processing chamber, without requiring wafer movements between processing chambers, as illustrated in FIG. 26, is very attractive for providing cost-effective wafer processing while reducing the risks of processing errors.

Variations to the scheme shown in FIG. 26 are also possible. For example, the energy transfer layer may be deposited in the chamber, the thermal process is performed in the same chamber, then the wafer may be removed for etching in other equipment. Additional processes may take place prior to the illustrated thermal cycle 1102 while preheating period 1104 may be used as part of the energy transfer layer formation process. For instance, the preheat period may be used to allow out-diffusion of impurities form a pre-deposited energy transfer layer. As another example, the energy transfer layer may be annealed during preheating period 1104. As still another example, preheating period 1104 may be used to form a carbon layer by converting a pre-deposited, carbon-containing layer on the wafer surface into a layer that exhibits higher optical absorption. In this case, the carbon-containing layer may be, for instance, a film of an organic compound that has been formed on the wafer by an earlier coating process, which organic film is convertible during preheating period 1104 into a form that contains mainly carbon. The resulting carbon film then serves as the energy transfer layer during spike anneal 1106.

4) Energy Transfer Layer Concepts

Figure 27:
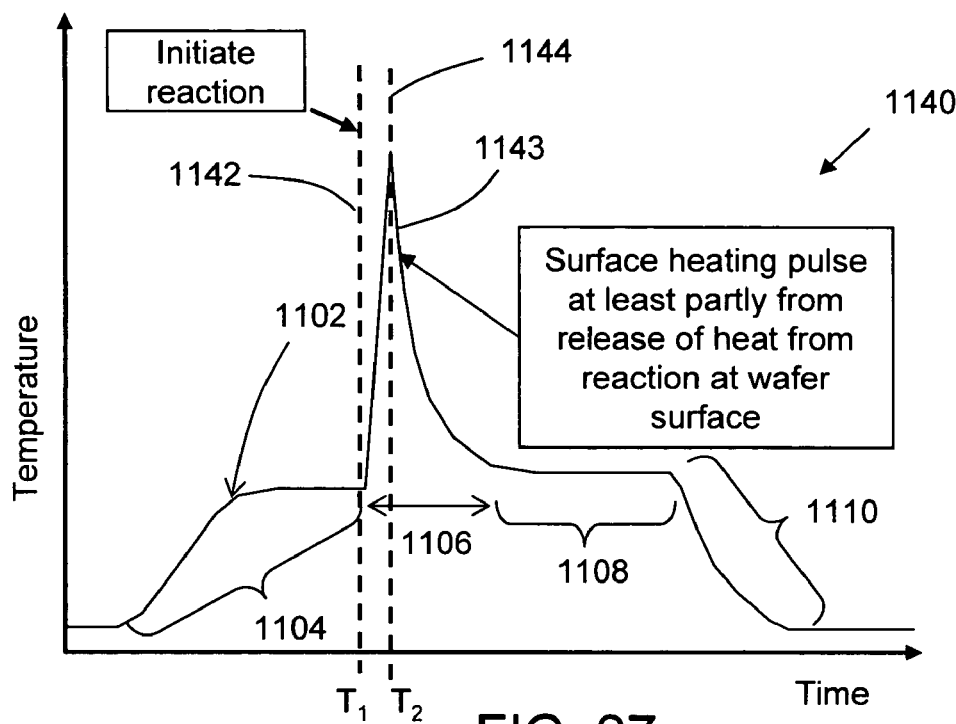
Figure 28:
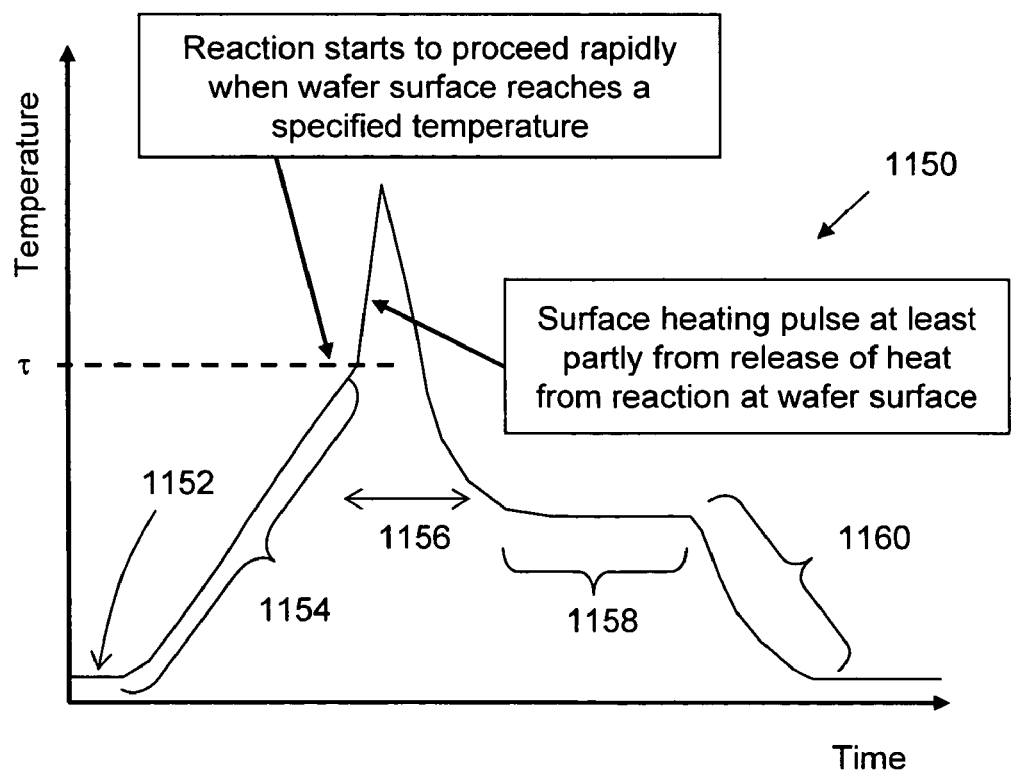

FIGS. 27 and 28 show two examples of the earlier described energy transfer layer RTP concept of the present invention. In both of the examples shown in FIGS. 27 and 28, an energy transfer layer is deposited on the wafer either prior to the thermal cycle shown or during a preheating period within the thermal cycle. As described in detail earlier, the energy transfer layer is capable of emitting thermal energy for heating the surface of the wafer. In some cases, the energy transfer layer may additionally function as an energy transfer layer for radiation used to assist the thermal processing.

Referring to FIG. 27, a graph 1140 shows a process in which a reaction of the energy transfer layer is initiated at a time $T_1$ during thermal cycle 1102, and this reaction provides a surface heating pulse 1143 leading to a temperature rise at the wafer surface. This reaction may be initiated by any of the aforedescribed methods related to the reactive RTP concept, and the reaction initiation may also be accompanied by a separate pulse of heat from an external energy source. Examples of ways to initiate the reaction include, but are not limited to, changing the composition or pressure of the gas ambient in the process chamber, introducing excited species from a plasma or other source of ions, atoms or radicals, exposure to high energy photons and pulsed surface heating. The relative timing of the initiation of the reaction at $T_1$ and the peak of heat pulse 1143 at $T_2$ may be varied as desired.

FIG. 28 shows an alternative approach 1150 based on a modified thermal cycle 1152, in which, during a preheating period 1154, the wafer temperature is ramped gradually rather than abruptly, as in previously described thermal cycle 1102 of FIGS. 24-27. In alternative approach 1150, the reaction in the energy transfer layer is initiated at a temperature $\tau$. In this way, the energy transfer layer starts to react and emit heat when temperature $\tau$ is reached during the temperature ramp up in preheating period 1154, thus leading to pulsed heating of the wafer surface in contact with the reactive layer. The pulsed heating may be assisted, for instance, by an additional pulse of energy from an external energy source, and, once again, the energy transfer layer structure may also function as an energy transfer layer structure depending on the choice of materials and energy wavelength.

Figure 29:
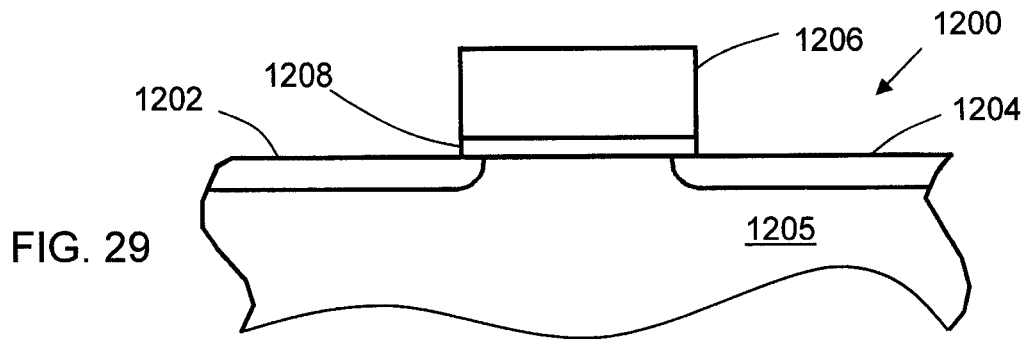
FIGS. 29-31 are diagrammatic fragmentary illustrations, in partial cut-away view, of a MOS transistor and its processing thereof in accordance with the present invention.
Figure 30:
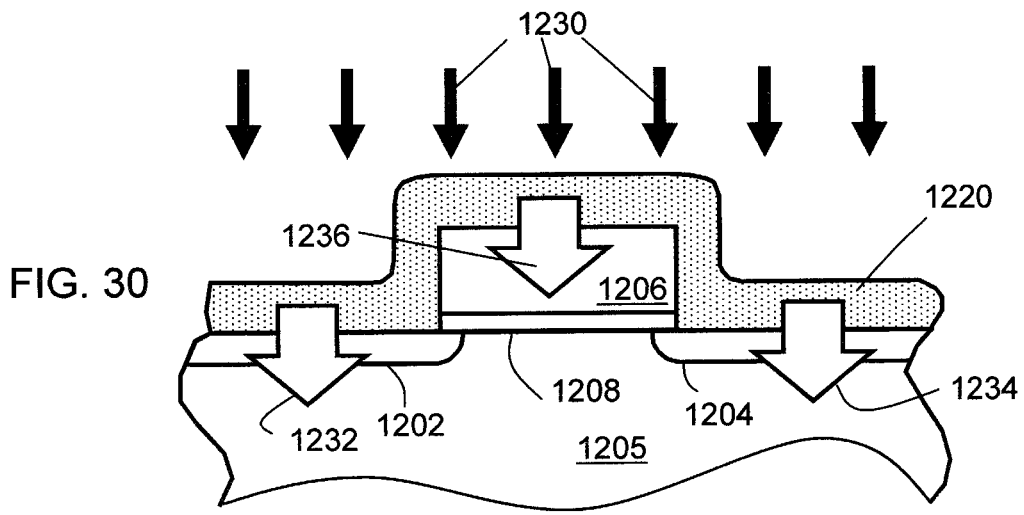
Figure 31:
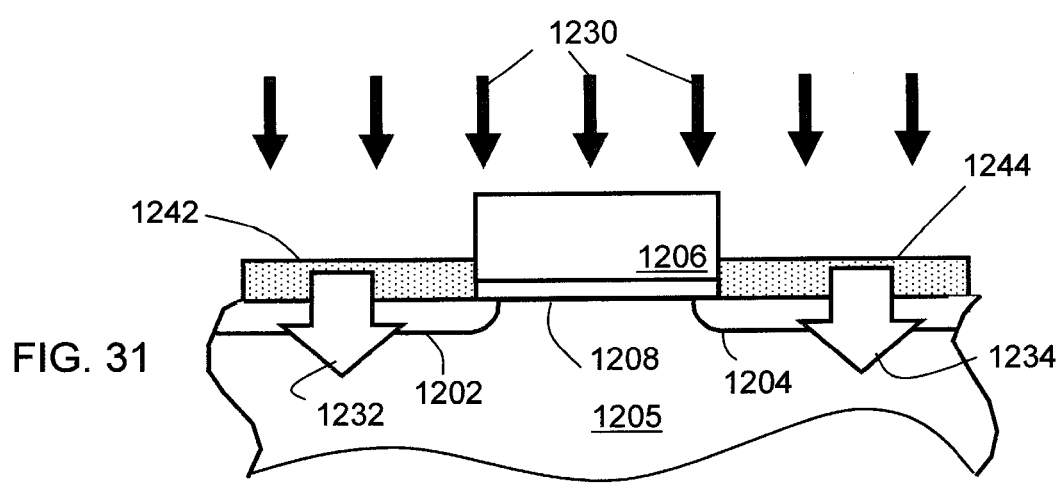

FIGS. 29-31 are representative examples of processing a semiconductor device structure in accordance with the present invention. FIG. 29 shows a MOS transistor 1200 including a source region 1202 and a drain region 1204 formed on a wafer 1205. Source and drain regions 1202 and 1204, respectively, may be formed, for instance, by a doping process such as ion-implantation. Source region 1202 and drain region 1204 must be thermally processed in order to achieve the desired electrical characteristics for a MOS transistor. MOS transistor 1200 further includes a gate electrode 1206 and a gate dielectric 1208. Gate electrode 1206 may also be formed of a material that requires additional thermal processing, such as electrical activation of implanted dopant species.

FIG. 30 shows an energy transfer layer 1220 applied to MOS transistor 1200 of FIG. 29. In FIG. 30, energy transfer layer 1220 is disposed on top of all of source region 1202, drain region 1204 and gate electrode 1206. A reaction in energy transfer layer 1220 may be initiated, for example, by external energy 1230 (indicated by arrows) such as those discussed above. The reaction releases heat 1232, 1234 and 1236 from energy transfer layer 1220 into various parts of MOS transistor 1200, as indicated by arrows. Energy transfer layer 1220 may additionally function as an energy transfer layer for external energy 1230.

Alternatively, it may be desirable to only release heat into specific areas of the device, in which case the approach illustrated in FIG. 31 may be taken. In FIG. 31, MOS transistor 1200 is only selectively coated with a reactive material such that source region 1202 is coated with a first energy transfer layer 1242 and drain region 1204 is coated with a second energy transfer layer 1244, while the top of gate electrode 1206 remains uncoated. As a result, when external energy 1230 initiates a reaction in first and second reactive layers 1242 and 1244, respectively, heat (1232 and 1234) is released generally only in the directions indicated by arrows while gate electrode 1206 and gate dielectric 1208 are not exposed to the same amount of heat as the source and drain regions.

Figure 32:
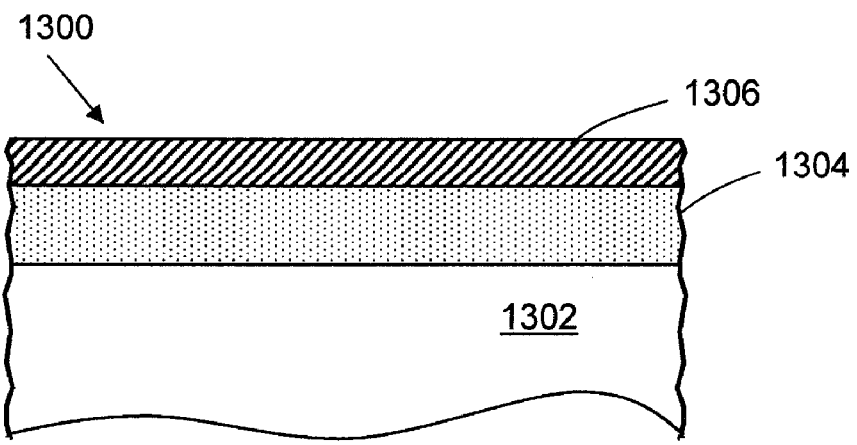
FIGS. 32-35 and 36(A)-(E) are diagrammatic illustrations of possible patterning approaches suitable for use with the energy transfer layer concept when two different materials are used in the reactive layer.
Figure 33:
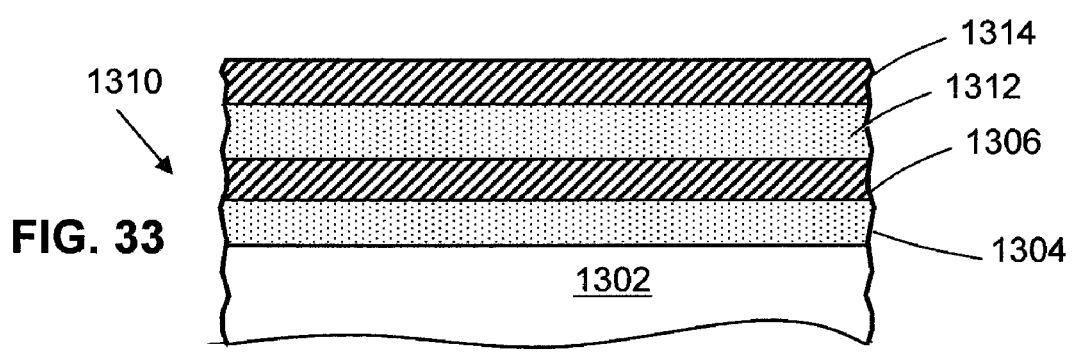
Figure 34:
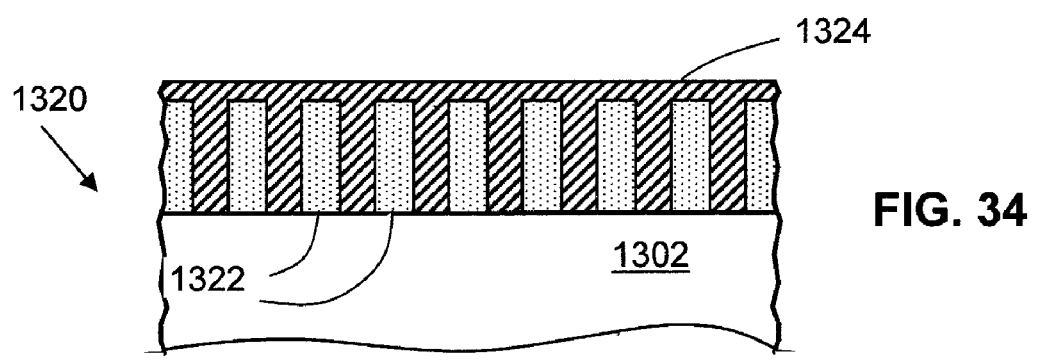
Figure 35:
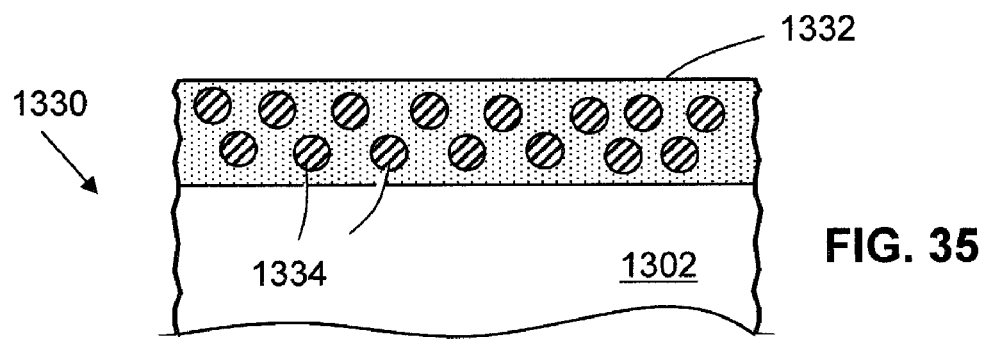

FIGS. 32-35 show end views of various vertical configurations of the energy transfer layer approach for cases where the energy transfer layer includes two types of material (shown as the black and the grey regions in the figures). FIG. 32 shows a configuration 1300, in which a wafer 1302 is coated with a stack of a first layer 1304 of a first material and a second layer 1306 of a second material. FIG. 33 shows a configuration 1310, in which wafer 1302 is coated with first layer 1304 and second layer 1306, as well as a third layer 1312 of the first material and a fourth layer 1314 of the second material. FIG. 34 shows a configuration 1320, in which wafer 1302 is coated with a series of vertical stripes 1322 of the first material, which is in turn coated with a layer 1324 of the second material, thus forming a comb pattern. FIG. 35 shows a configuration 1330, in which wafer 1302 is coated with a layer 1332 of the first material, wherein layer 1332 is interspersed with a plurality of pores 1334 containing the second material. As may be seen in FIGS. 32-35, different designs exhibit varying the degrees of contact between the two different materials. In fact, any of the patterning or texture control approaches discussed above in the context of energy transfer layers may be applied to the energy transfer layer concept in order to enhance the ability of the energy transfer layer to generate heat efficiently, rapidly and controllably.

Figure 36A:
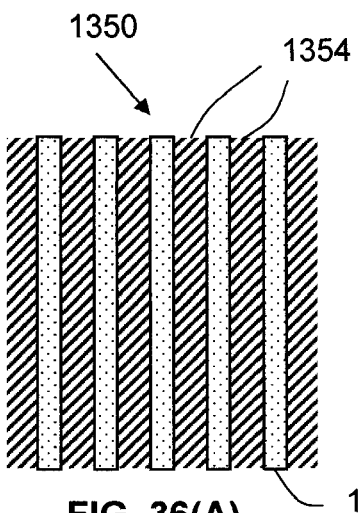
Figure 36B:
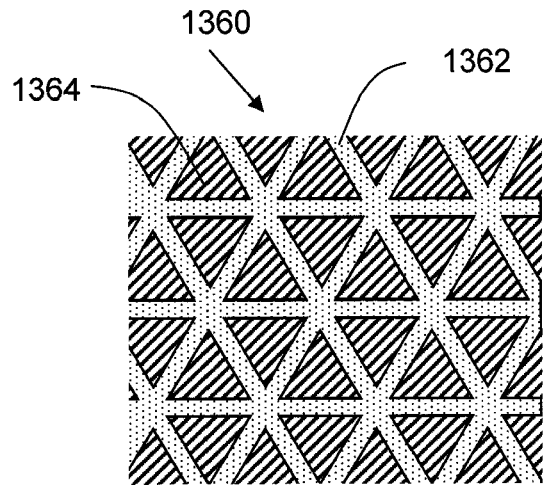
Figure 36C:
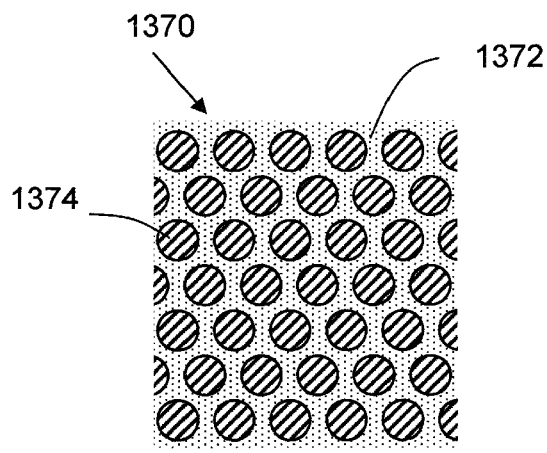
Figure 36D:
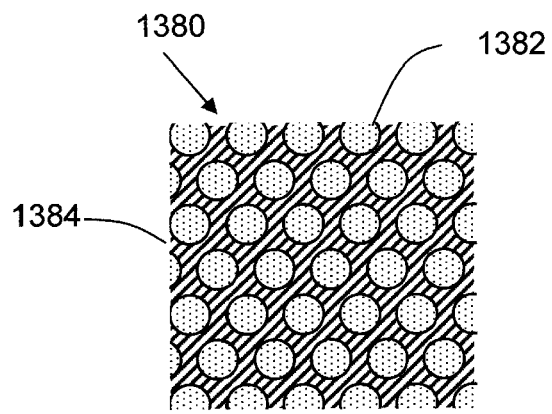
Figure 36E:
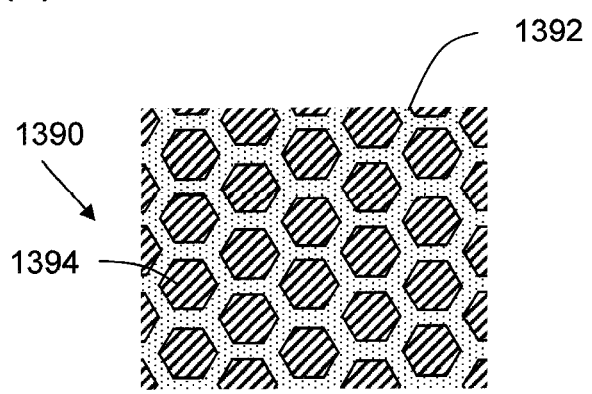

FIG. 36(A)-(E) show plan views of various lateral patterning approaches that may be applied to the energy transfer layer concept. FIG. 36(A) shows a pattern 1350, in which alternating rows of the first material (1352) and the second material (1554) together form a stripe configuration. FIG. 36(B) shows a pattern 1360, in which the first material is configured to form a series of crossing lines (1362) with the second material forming a plurality of triangular regions (1364). FIG. 36(C) shows a pattern 1370, in which a layer 1372 of the first material includes a plurality of circular regions 1374 filled with the second material. FIG. 36(D)

shows a complementary pattern 1380, in which a plurality of circular regions 1382 are formed within or atop a layer 1384 of the second material. Similarly, FIG. 36(E) shows a pattern 1390, in which a plurality of lines 1392 of the first material are interspersed with a plurality of hexagons 1394 of the second material, thus forming a honeycomb pattern. Applicant notes that any pattern, including the layouts shown in FIGS. 20 and 21, may be used.

All of these approaches of patterning and texture control may also be used even if the energy transfer layer only involves one material or if the energy transfer layer functions through interaction of one material and a gaseous species. Such approaches may greatly enhance the surface area exposed for chemical reaction and, consequently, promote the rapid and efficient liberation of heat from the reactive layer(s).

Additional Variations

While bearing in mind that the present application is focused on methods for improving processing of semiconductor devices, it should be noted that the approaches described herein may also be used in material processing in other fields requiring the use of energy beam processing for forming devices with closely controlled characteristics. Examples of such devices include, but are not limited to, optical components, magnetic components, display devices, solar cells and micro-electromechanical devices.

Although each of the aforedescribed physical embodiments have been illustrated with various components having particular respective orientations, it should be understood that the present invention may take on a variety of specific configurations with the various components being located in a wide variety of positions and mutual orientations. Furthermore, the methods described herein may be modified in an unlimited number of ways, for example, by reordering, modifying and recombining the various steps. Accordingly, it should be apparent that the arrangements and associated methods disclosed herein may be provided in a variety of different configurations and modified in an unlimited number of different ways, and that the present invention may be embodied in many other specific forms without departing from the spirit or scope of the invention. For example, energy transfer layers may be used with alternative energy sources, in which case the energy transfer layers may exhibit different qualities than those already discussed above. As a particular example, when an energy transfer layer is used for absorption of electron beam energy, the energy transfer layer may serve to help make the energy absorption more homogeneous across the wafer. This effect is due to the fact that the energy transfer layer makes the electron back-scattering uniform across the wafer. The energy transfer layer may also serve to prevent high energy electrons from penetrating to the device layer and causing radiation damage to delicate devices disposed on the wafer. The energy transfer layer may also be used to control the state of charge build-up on the wafer during processing. Such benefits of the energy transfer layer may also apply for use with other high energy beams of particles, such as plasmas or ion beams. Therefore, the present examples and methods are to be considered as illustrative and not restrictive, and the invention is not to be limited to the details given herein.

What is claimed is:

1. In an overall multi-step technique for processing a semiconductor wafer, a method that is performed for annealing said wafer in a process chamber as an intermediate part of the overall multi-step technique, said method comprising:

applying an energy transfer layer to at least a portion of said wafer;

exposing said wafer to an energy source in said process chamber through the energy transfer layer to anneal the wafer in order to change at least one characteristic of the wafer to a modified characteristic, and where said exposing subjects the wafer to a thermal profile having at least a first elevated temperature event and such that said energy transfer layer influences at least one part of the thermal profile during the anneal and an initial portion of said exposing subjects said wafer to an inert gas ambient; and removing said energy transfer layer, while said wafer remains in said process chamber, at least sufficiently for subjecting the wafer to a subsequent step and initiating said removing during said exposing by introducing a reactive gas ambient into said process chamber.

2. The method of claim 1 wherein said reactive gas ambient is selected as at least one member of the group consisting of oxygen containing gases and halogen containing gases.

3. The method of claim 1 wherein said removing further influences said thermal profile.

4. In an overall multi-step technique for processing a semiconductor wafer, a method that is performed for annealing said wafer in a process chamber as an intermediate part of the overall multi-step technique, said method comprising:

applying an energy transfer layer to at least a portion of said wafer by initially forming a film of a carbon containing compound and, thereafter, treating said film to increase a fractional carbon content thereof to form said energy transfer layer prior to said exposing such that the energy transfer layer is oxidizable;

exposing said wafer to an energy source in said process chamber through the energy transfer layer to anneal the wafer in order to change at least one characteristic of the wafer to a modified characteristic, and where said exposing subjects the wafer to a thermal profile having at least a first elevated temperature event and such that said energy transfer layer influences at least one part of the thermal profile during the anneal; and removing said energy transfer layer, while said wafer remains in said process chamber, at least sufficiently for subjecting the wafer to a subsequent step and said removing includes causing said energy transfer layer to oxidize during said exposing to modify the thermal profile.

5. In an overall multi-step technique for processing a semiconductor wafer, a method that is performed for annealing said wafer in a process chamber as an intermediate part of the overall multi-step technique, said method comprising:

applying an energy transfer layer to at least a portion of said wafer;

exposing said wafer to an energy source in said process chamber through the energy transfer layer to anneal the wafer in order to change at least one characteristic of the wafer to a modified characteristic, and where said exposing subjects the wafer to a thermal profile having at least a first elevated temperature event and such that said energy transfer layer influences at least one part of the thermal profile during the anneal and said thermal profile includes a drop in temperature of said wafer subsequent to said first elevated temperature event and, thereafter, an additional elevated temperature event is produced; and removing said energy transfer layer responsive to said additional elevated temperature event, while said wafer remains in said process chamber, at least sufficiently for subjecting the wafer to a subsequent step.

6. In an overall multi-step technique for processing a semiconductor wafer, a method that is performed for heat treating said wafer in a process chamber as an intermediate part of the overall multi-step technique, said method comprising:

applying a material layer to at least a portion of said wafer; and exposing said material layer to an energy source in said process chamber during a thermal process that changes at least one characteristic of the wafer and which exposing causes the material layer to decompose into at least two by-products thereby releasing thermal energy that further changes said characteristic.

7. The method of claim 6 wherein a predetermined temperature event causes the removal to initiate.

8. The method of claim 7 wherein the predetermined temperature event is a pulse of heat that causes a rate at which the removal takes place to increase.

* * * * *